(12) United States Patent
Jeong

(10) Patent No.: US 7,374,471 B2
(45) Date of Patent: May 20, 2008

(54) APPARATUS AND METHOD FOR POLISHING SEMICONDUCTOR WAFERS USING ONE OR MORE PIVOTABLE LOAD-AND-UNLOAD CUPS

(75) Inventor: In Kwon Jeong, Cupertino, CA (US)

(73) Assignee: Inopla Inc., San Jose, CA (US)

( * ) Notice: Subject to any disclaimer, the term of this patent is extended or adjusted under 35 U.S.C. 154(b) by 377 days.

(21) Appl. No.: 10/765,613

(22) Filed: Jan. 27, 2004

(65) Prior Publication Data

US 2004/0216842 A1    Nov. 4, 2004

Related U.S. Application Data

(60) Provisional application No. 60/477,489, filed on Jun. 10, 2003, provisional application No. 60/468,561, filed on May 6, 2003, provisional application No. 60/468,239, filed on May 5, 2003, provisional application No. 60/466,587, filed on Apr. 30, 2003, provisional application No. 60/464,280, filed on Apr. 21, 2003, provisional application No. 60/462,015, filed on Apr. 11, 2003, provisional application No. 60/461,147, filed on Apr. 8, 2003, provisional application No. 60/442,952, filed on Jan. 27, 2003.

(51) Int. Cl.
*B24B 51/00* (2006.01)

(52) U.S. Cl. .............................. 451/11; 451/41; 451/28; 451/285; 451/288

(58) Field of Classification Search .................. 451/11, 451/5–10, 41, 28, 285–288
See application file for complete search history.

(56) References Cited

U.S. PATENT DOCUMENTS

| | | | |
|---|---|---|---|
| 5,908,347 A | 6/1999 | Nakajima et al. | |
| 5,924,916 A * | 7/1999 | Yamashita | 451/288 |
| 6,309,279 B1 * | 10/2001 | Bowman et al. | 451/41 |
| 6,346,038 B1 | 2/2002 | Kajiwara et al. | |
| 6,575,818 B2 | 6/2003 | Jeong | |
| 6,626,744 B1 * | 9/2003 | White et al. | 451/66 |
| 6,942,545 B2 * | 9/2005 | Jeong | 451/8 |
| 2002/0177386 A1 | 11/2002 | Smith | |
| 2003/0003852 A1 | 1/2003 | Jeong | |
| 2003/0217811 A1 | 11/2003 | Jeong | |
| 2004/0009738 A1 * | 1/2004 | Doi et al. | 451/36 |
| 2004/0216842 A1 * | 11/2004 | Jeong | 156/345.11 |

FOREIGN PATENT DOCUMENTS

| | | |
|---|---|---|
| JP | 2003-0067391 | 8/2003 |
| WO | WO 03/088335 A1 | 10/2003 |

* cited by examiner

*Primary Examiner*—Lee D Wilson
(74) *Attorney, Agent, or Firm*—Thomas H. Ham; Wilson & Ham

(57) ABSTRACT

An apparatus and method for polishing objects, such as semiconductor wafers, utilizes one or more pivotable load-and-unload cups to transfer the objects to and/or from one or more object carriers to polish the objects. Each pivotable load-and-unload cup may be configured to transfer the objects to and/or from a single object carrier. Alternatively, each pivotable load-and-unload cup may be configured to transfer the objects to and/or from two object carriers. The pivotable load-and-unload cups may be configured to be pivoted about one or more pivoting points over at least one polishing surface, such as a polishing pad surface.

37 Claims, 62 Drawing Sheets

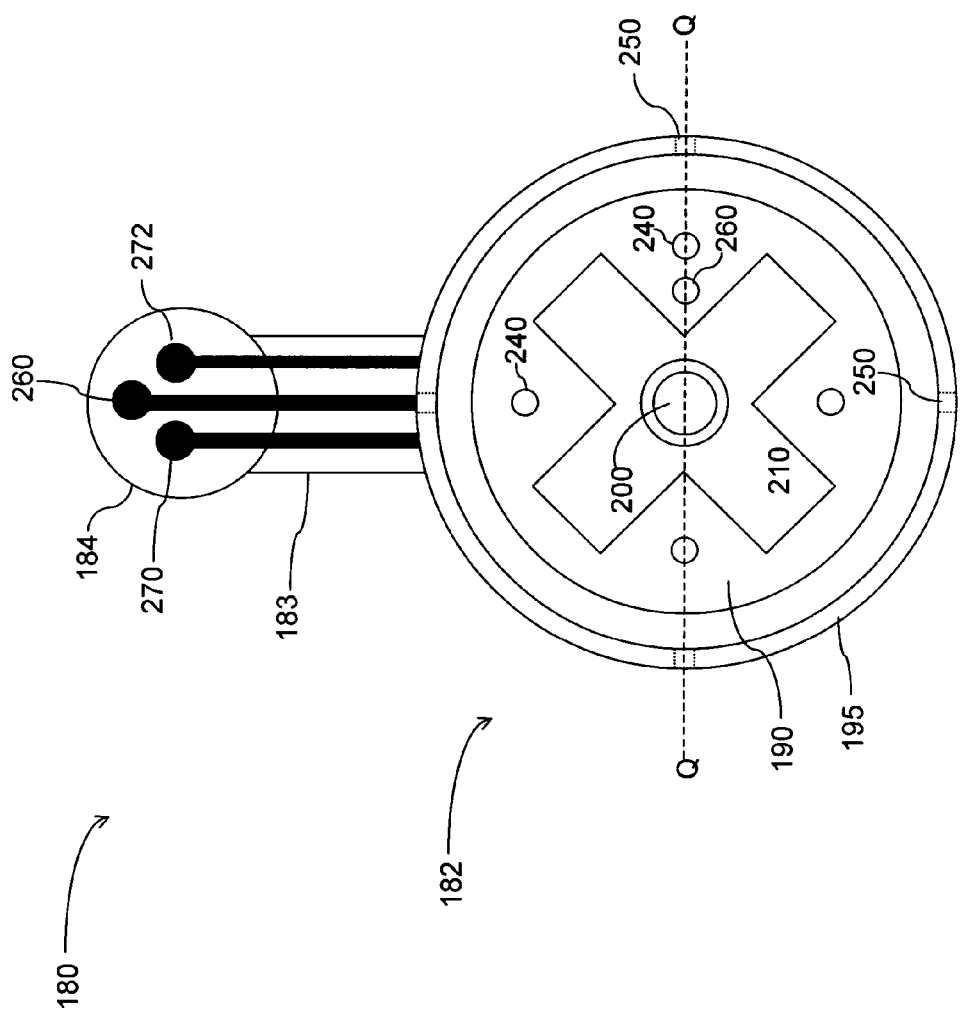

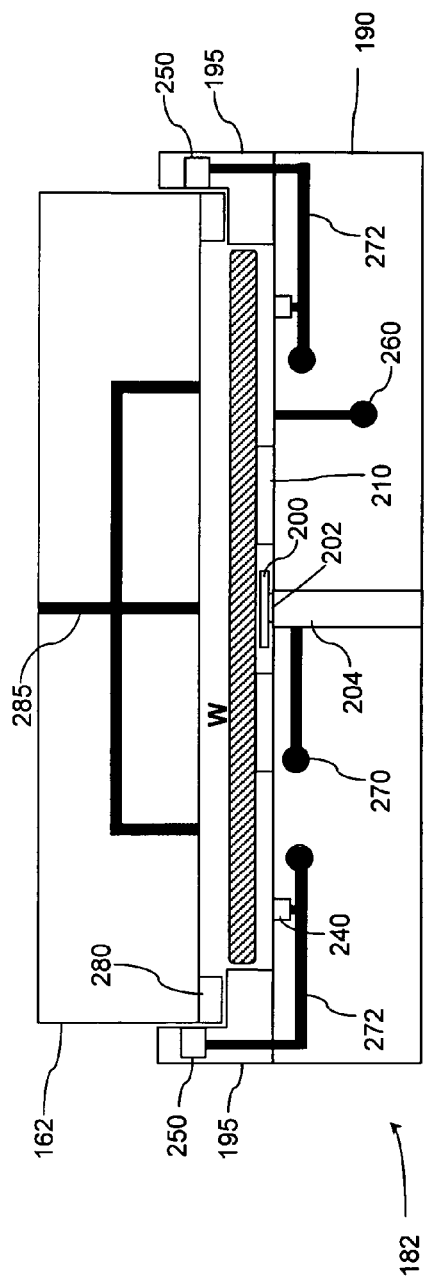
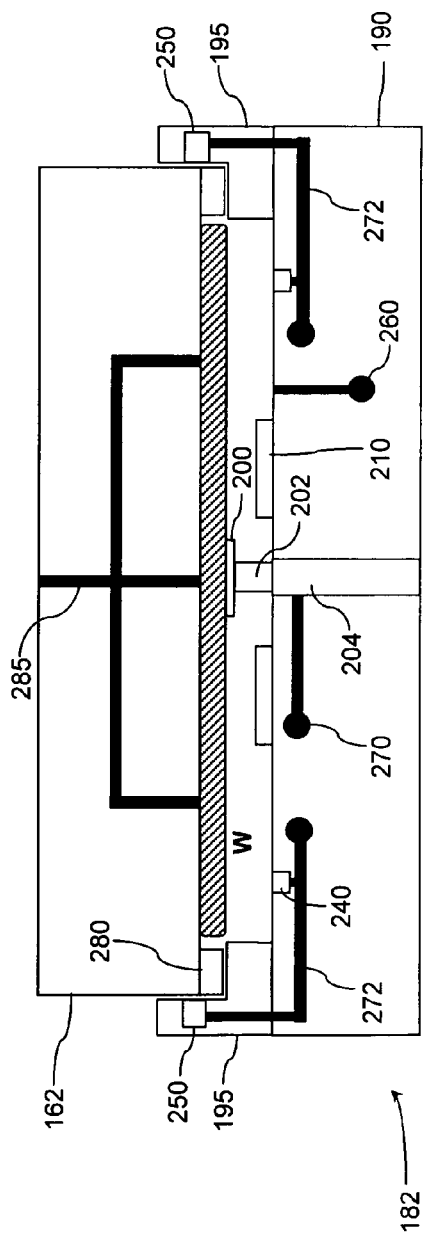

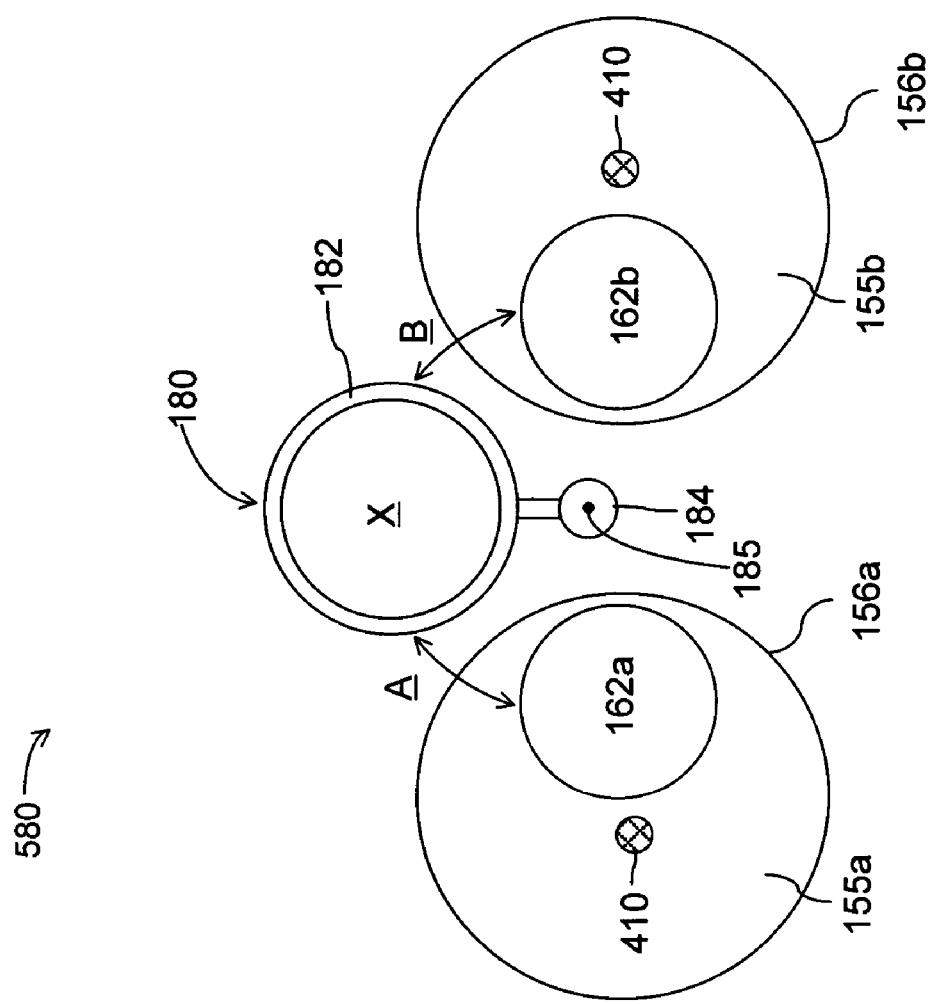

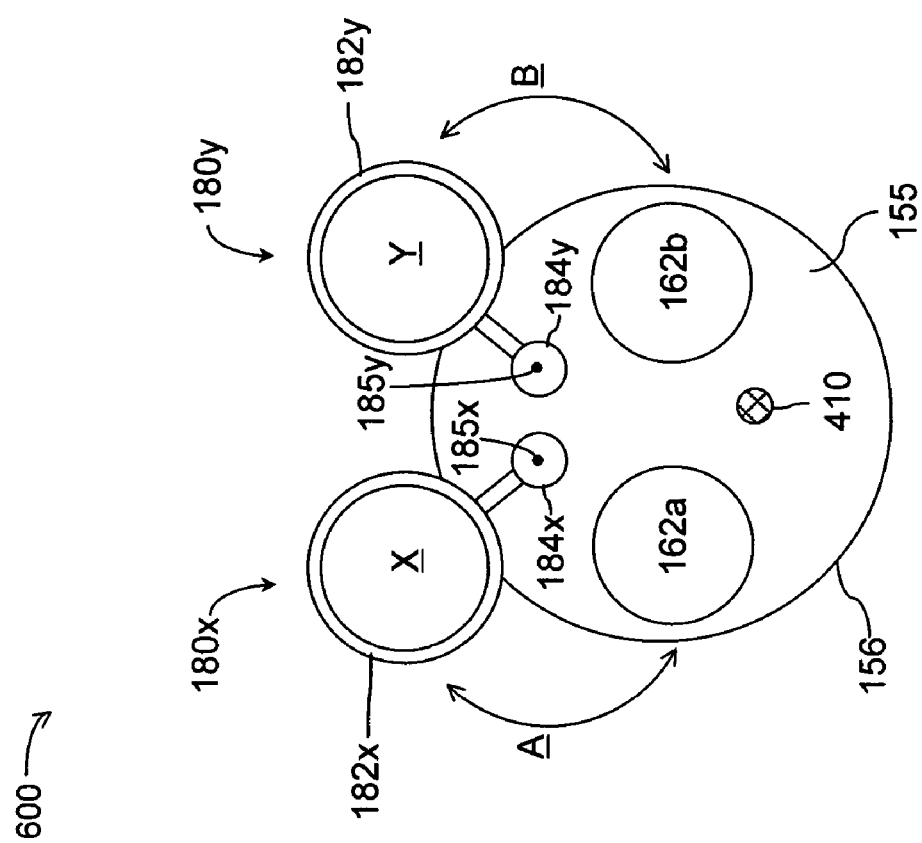

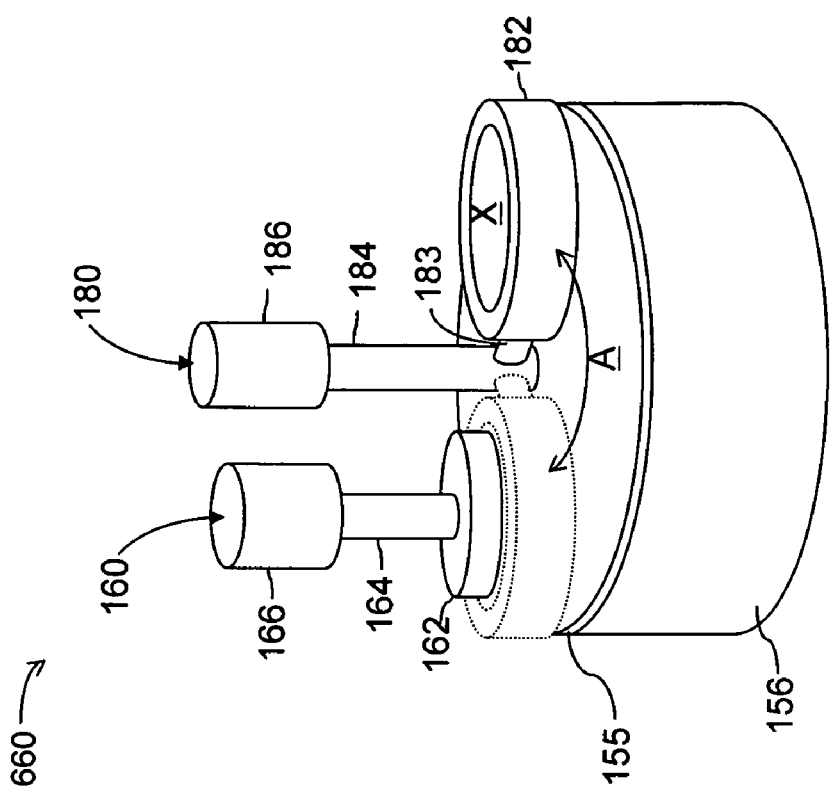
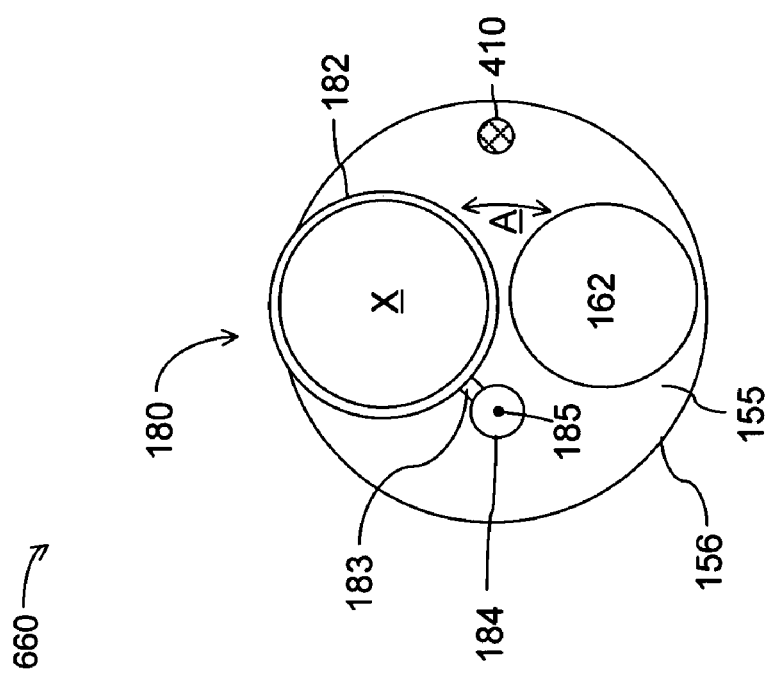
Fig. 25(b)
Fig. 25(a)

APPARATUS AND METHOD FOR POLISHING SEMICONDUCTOR WAFERS USING ONE OR MORE PIVOTABLE LOAD-AND-UNLOAD CUPS

CROSS REFERENCE TO RELATED APPLICATION

This application is entitled to the benefit of U.S. Provisional Patent Application Ser. Nos. 60/442,952 filed on Jan. 27, 2003, 60/461,147 filed on Apr. 8, 2003, 60/462,015 filed on Apr. 11, 2003, 60/464,280 filed on Apr. 21, 2003, 60/466,587 filed on Apr. 30, 2003, 60/468,239 filed on May 5, 2003, 60/468,561 filed on May 6, 2003, and 60/477,489 filed on Jun. 10, 2003, which are all incorporated herein by reference.

FIELD OF THE INVENTION

The invention relates generally to semiconductor processing equipment, and more particularly to an apparatus and method for polishing semiconductor wafers.

BACKGROUND OF THE INVENTION

Local and global planarization of semiconductor wafers becomes increasingly important as more metal layers and interlayer dielectric layers are stacked on the wafers. A preferred method to planarize semiconductor wafers is the chemical mechanical polishing (CMP) method, where a surface of a semiconductor wafer is polished using a slurry solution supplied between the wafer and a polishing pad. The CMP method is also widely used for damascene process to form copper structures on the semiconductor wafers.

In general, a CMP equipment includes a polishing table where a polishing pad is placed and a wafer carrier that supports a semiconductor wafer and presses the wafer against the polishing pad. One of the most important performances of a CMP equipment is productivity. For higher productivity, a CMP equipment typically requires more polishing tables and more wafer carriers. As the number of polishing tables and wafer carriers included in a CMP equipment is increased, the arrangement of the polishing tables and the wafer carriers becomes important to efficiently polish multiple semiconductor wafers. Furthermore, the manner in which the semiconductor wafers are transferred to and from the wafer carrier becomes important as well. However, the footprint of a CMP equipment must also be considered since a CMP equipment with a large footprint requires a larger clean room to house the equipment, which translates into greater cost of operation.

In view of these issues, what is needed is an apparatus and method for polishing semiconductor wafer with high productivity that require small footprint.

SUMMARY OF THE INVENTION

An apparatus and method for polishing objects, such as semiconductor wafers, utilizes one or more pivotable load-and-unload cups to transfer the objects to and/or from one or more object carriers to polish the objects. Each pivotable load-and-unload cup may be configured to transfer the objects to and/or from a single object carrier. Alternatively, each pivotable load-and-unload cup may be configured to transfer the objects to and/or from two object carriers. The pivotable load-and-unload cups may be configured to be pivoted about one or more pivoting points over at least one polishing surface, such as a polishing pad surface.

An apparatus in accordance with an embodiment of the invention includes a polishing surface, an object carrier positioned over the polishing surface, and a load-and-unload cup configured to be pivoted to the object carrier about a pivoting point over the polishing surface so that the object can be transferred from the load-and-unload cup to the object carrier.

An apparatus for polishing objects in accordance with another embodiment includes at least one polishing surface, a first object carrier positioned over at least one polishing surface, a second object carrier positioned over at least one polishing surface, a load-and-unload cup configured to move between the first and second object carriers to transfer one of first and second objects to be polished to one of the first and second object carriers, and an object transport device configured to transfer the first and second objects to and from the load-and-unload cup. The first object carrier is configured to hold the first object. The second object carrier is configured to hold one of first and second objects.

An apparatus in accordance with another embodiment includes an object transport device and first and second polishing units. Each of the first and second polishing units includes first and second polishing surfaces, a first object carrier positioned over the first polishing surface, a second object carrier positioned over the second polishing surface, a first load-and-unload cup configured to be pivoted to the first object carrier to transfer a first object to and from the first object carrier, and a second load-and-unload cup configured to be pivoted to the second object carrier to transfer a second object to and from the second object carrier. The first object carrier is configured to hold the first object. The second object carrier is configured to hold the second object. The wafer transport device is configured to transfer the first and second objects to and from the first and second load-and-unload cups of at least one of the first and second polishing units.

An apparatus in accordance with another embodiment includes a polishing surface, first and second object carriers positioned over the polishing surface, a first load-and-unload cup configured to be pivoted to the first object carrier to transfer a first object to and from the first object carrier, and a second load-and-unload cup configured to be pivoted to the second object carrier to transfer a second object to and from the second object carrier. The first object carrier is configured to hold the first object. The second object carrier is configured to hold the second object.

An apparatus in accordance with another embodiment includes at least one polishing surface, at least one object carrier positioned over at least one polishing surface, a first load-and-unload cup configured to be pivoted to at least one object carrier about a pivoting point to transfer a first object to at least one object carrier, and a second load-and-unload cup configured to be pivoted to at least one object carrier about the pivoting point to transfer a second object to at least one object carrier.

A method for polishing objects in accordance with an embodiment of the invention includes pivoting an object to be polished to an object carrier about a pivoting point over a polishing surface, loading the object onto the object carrier, moving the object carrier so that the object on the object carrier is placed on the polishing surface, and polishing the object on the polishing surface.

A method for polishing objects in accordance with another embodiment includes transporting an object to be polished to a load-and-unload cup, moving the load-andunload cup to a first object carrier, loading the object onto the first object carrier, moving the first object carrier so that the object on the first object carrier is placed on at least one polishing surface, and polishing the object on at least one polishing surface.

A method for polishing objects in accordance with another embodiment includes pivoting a first object to be polished to a first object carrier positioned over a polishing surface and a second object to be polished to a second object carrier positioned over the polishing surface, loading the first object onto the first object carrier and the second object onto the second object carrier, independently moving the first and second object carriers so that the first object on the first object carrier and the second object on the second object carrier are placed on the polishing surface, and independently polishing the object on the polishing surface.

Other aspects and advantages of the present invention will become apparent from the following detailed description, taken in conjunction with the accompanying drawings, illustrated by way of example of the principles of the invention.

BRIEF DESCRIPTION OF THE DRAWINGS

FIG. 5 is a top view of the load/unload cup of the wafer relay device in accordance with an embodiment of the invention.

FIGS. 7(a) and (b) are sequential cross sectional views of the load/unload cup to show a sequence of wafer loading onto a wafer carrier.

FIG. 17 is a top view of a polishing unit in accordance with a fifth alternative embodiment of the present invention.

FIG. 25(a) is a top view of a polishing unit in accordance with a ninth alternative embodiment of the present invention.

FIG. 25(b) is a perspective view of the polishing unit of FIG. 25(a).

DETAILED DESCRIPTION

Figure 1:
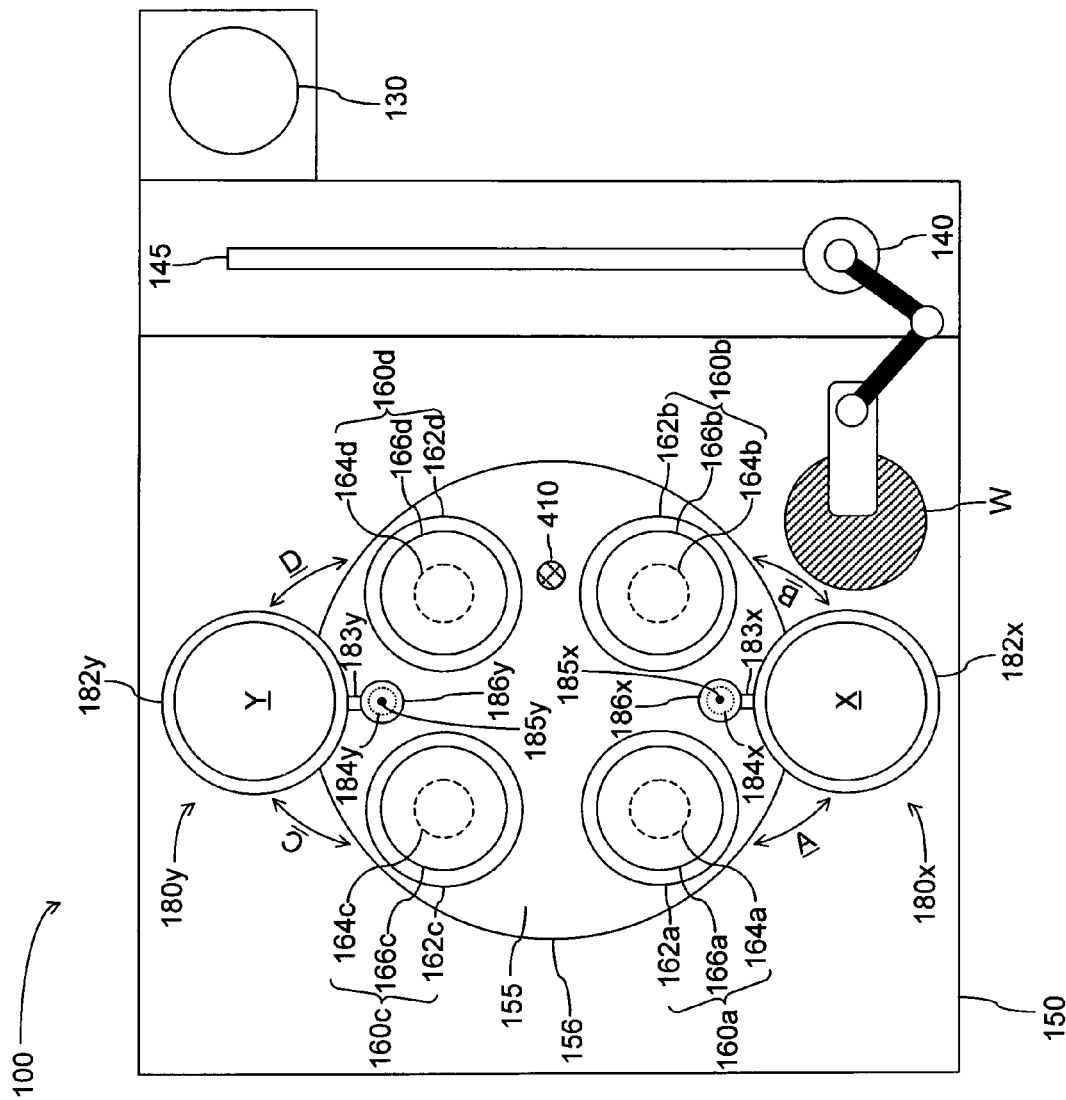
FIG. 1 is a top view of a polishing apparatus comprising a polishing unit in accordance with an embodiment of the present invention.

With reference to FIG. 1, a polishing apparatus 100 comprising a polishing unit 150 in accordance with an embodiment of the present invention is described. FIG. 1 is a top view of the polishing apparatus 100. The polishing apparatus 100 comprises a wafer input station 130, a wafer transport device 140 and the polishing unit 150.

The wafer input station 130 accommodates semiconductor wafers or other comparable objects to be polished by the polishing apparatus 100. The wafer input station 130 can also accommodate semiconductor wafers that have been polished by the polishing apparatus 100. The wafer input station 130 may be configured to comprise multiple slots to accommodate multiple wafers. The wafer transport device 140 is configured to transfer wafers between the wafer input station 130 and the polishing unit 150. More specifically, the wafer transport device 140 is configured to transfer wafers between the wafer input station 130 and load/unload cups 182x and 182y of the polishing unit 150, as described in more detail below. The wafer transport device 140 may be situated on a linear track 145 such that the wafer transport device can be moved in a linear manner on the linear track by a linear drive mechanism (not shown). As an example, the wafer transport device 140 may comprise a robotic arm to handle a wafer for transfer. The wafer transport device 140 may be further configured to comprise dual robotic arms such that the wafer transport device can handle two wafers at a time. The wafer transport device 140 may be also configured to turn over wafers before transferring the wafers to the polishing unit 150 and to the wafer input station 130.

Figure 2:
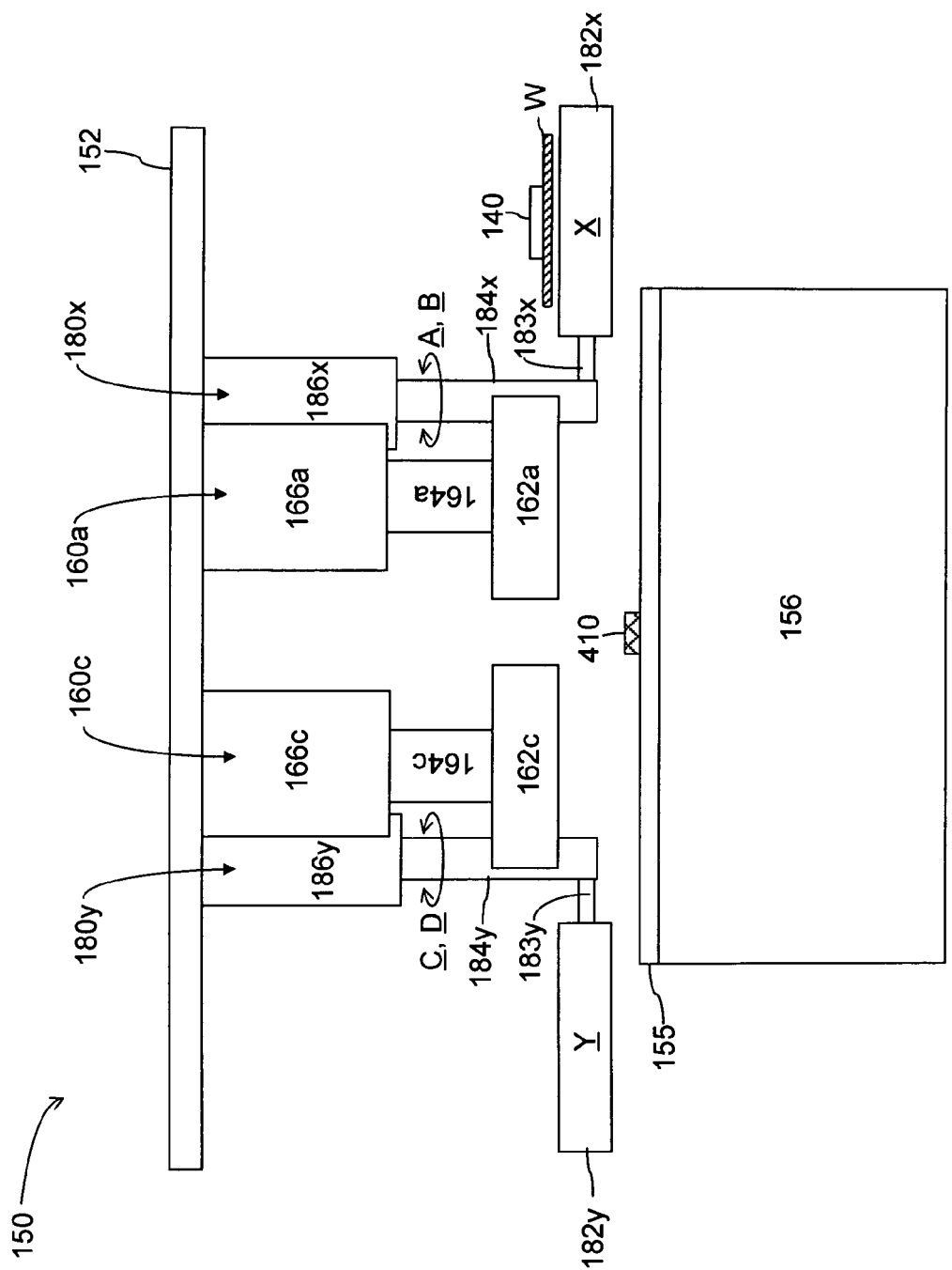
FIG. 2 is a side view of the polishing unit of FIG. 1.
Figure 3:
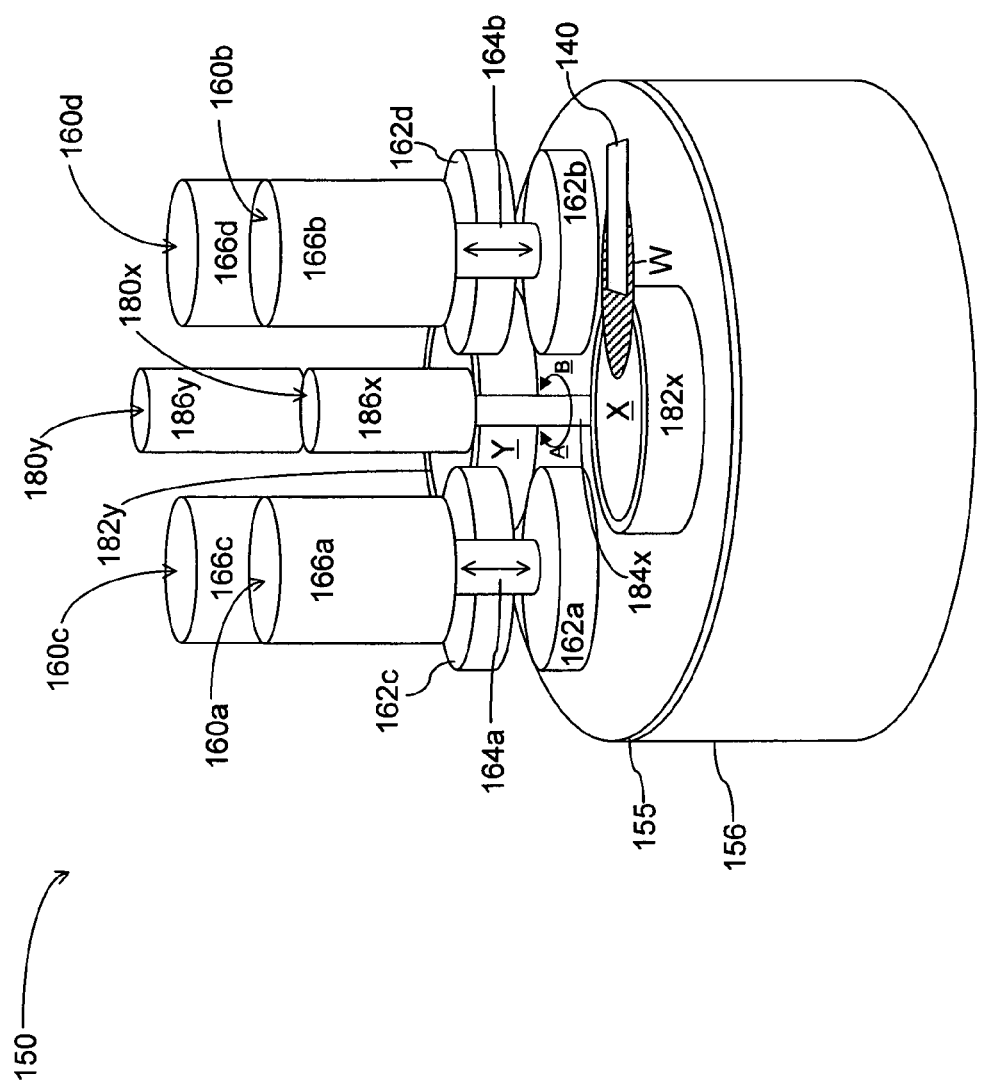
FIG. 3 is a perspective view of the polishing unit of FIG. 1.

With reference to FIGS. 1, 2 and 3, the polishing unit 150 is described. FIG. 2 is a side view of the polishing unit 150, while FIG. 3 is a perspective view of the polishing unit 150. The polishing unit 150 comprises a polishing table 156, a first wafer carrier assembly 160a, a second wafer carrier assembly 160b, a third wafer carrier assembly 160c, a fourth wafer carrier assembly 160d, a first wafer relay device 180x and a second wafer relay device 180y.

The polishing table 156 can be rotated or orbited about an axis as described in U.S. Pat. No. 5,554,064, which is incorporated herein by reference. The polishing pad 155 may be attached onto the polishing table 156 for chemical and mechanical polishing process of semiconductor wafers. One or more slurries containing abrasive particles and/or chemicals such as KOH are used with the polishing pad 155 to polish semiconductor wafers. A pad conditioner 410 may be used to condition the surface of the polishing pad 155 during the polishing process to refresh the surface of the polishing pad 155 for proper polishing. Although the polishing of wafers are described herein as being polished on one or more polishing pad surfaces, the wafers may be polished on any polishing surface such as a polishing surface of a polishing table.

Each wafer carrier assembly 160 comprises a wafer carrier 162, a carrier shaft 164 and a rotating-and-vertical drive mechanism 166. The wafer carrier 162 is designed to hold a semiconductor wafer such that the surface of the wafer to be polished is faced toward the polishing pad 155. The wafer carrier 162 is connected to the rotating-and-vertical drive mechanism 166 through the carrier shaft 164. The rotating-and-vertical drive mechanisms 166 are mounted to a top housing structure 152 of the polishing unit 150 that is positioned above the polishing table 156, as illustrated in FIG. 2. Each rotating-and-vertical drive mechanism 166 controls the rotational and vertical motions of the respective wafer carrier 162 through the connected carrier shaft 164. Thus, each rotating-and vertical drive mechanism is configured to rotate the respective wafer carrier by rotating the connected carrier shaft 164 and to vertically move the respective wafer carrier by vertically moving the connected carriers shaft. The wafer carriers 162 can be moved individually between their respective polishing positions on the polishing table 156 and their respective wafer load/unload positions over the polishing table 156. The positions of the wafer carriers 162 illustrated in FIG. 2 are their wafer load/unload positions over the polishing table 156. In order to polish semiconductor wafers, the wafer carriers 162 are moved down to the polishing positions on the polishing pad 155 by the respective rotating-and-vertical mechanisms 166 to press the wafers held by the wafer carriers onto the polishing pad.

Each wafer relay device 180 comprises a load/unload cup 182, a pivoting arm 183, a pivoting shaft 184 and a pivoting-and-vertical drive mechanism 186. The load/unload cup 182 is connected to the pivoting shaft 184 through the pivoting arm 183. The pivoting shaft 184 is connected to the pivoting-and-vertical drive mechanism 186. The pivoting-and-vertical drive mechanism 186 is preferably mounted to the housing structure 152 of the polishing unit 150 as illustrated in FIG. 2. The pivoting-and-vertical drive mechanism 186 controls pivoting and vertical motions of the load/unload cup 182 through the pivoting shaft 184 and the pivoting arm 183. Thus, each pivoting-and-vertical drive mechanism 186 is configured to pivot the respective load/unload cup 182 through the connected pivoting shaft 184 and to vertically move the respective load/unload cup through the connected pivoting shaft.

In FIGS. 1, 2 and 3, the positions X and Y where the first and second load/unload cups 182x and 182y are located are their respective parking positions. The load/unload cups 182x and 182y are designed to receive wafers from the wafer transport device 140 at the parking positions X and Y, respectively. The first load/unload cup 182x can be pivoted from the parking position X to either one of the wafer load/unload positions of the first and second wafer carriers 162a and 162b, as illustrated in FIGS. 1 and 2 by pivoting motions A and B respectively. Similarly, the second load/unload cup 182y can be pivoted from the parking position Y to either one of the wafer load/unload positions of the third and the fourth wafer carriers 162c and 162d, as illustrated by pivoting motions C and D, respectively.

To horizontally align the first load/unload cup 182x to one of the first and second wafer carriers 162a and 162b for wafer load/unload, the first wafer relay device 180x is designed and positioned in such a manner that the distance from the first pivoting shaft 184x to the center of the first load/unload cup 182x is substantially equal to the distance from the pivoting shaft 184x to the center of the first wafer carrier 162a and to the distance from the pivoting shaft 184x to the center of the second wafer carrier 162b. In a similar manner, the second wafer relay device 180y is designed and positioned in such a manner that the distance from the second pivoting shaft 184y to the center of the second load/unload cup 182y is substantially equal to the distances from the second pivoting shaft 184y to the centers of the third and fourth wafer carriers 162c and 162d. Furthermore, the load/unload cups 182x and 182y can be vertically aligned to the wafer carriers 162 at the wafer load/unload positions for loading and unloading of semiconductor wafers by vertical motions of the load/unload cups 182. It is also possible to vertically align the wafer carriers 162 to the load/unload cups 182 by vertical motions of the wafer carriers 162.

It is preferred to position the pivoting shafts 184x and 184y of the wafer relay devices 180x and 180y over the polishing pad 155 as illustrated in FIG. 1, and therefore, pivoting points 185x and 185y of the load/unload cups 182x and 182y are located over the surface of the polishing pad 155. The pivoting points 185x and 185y are located on pivoting axes that perpendicularly intersect the surface of the polishing pad 155. To position the pivoting shafts 184x and 184y over the polishing pad 155, the pivoting-and-vertical drive mechanisms 186 are mounted to the top housing structure 152 of the polishing unit 150 as illustrated in FIG. 2. An important advantage taken by positioning the pivoting points 185x and 185y of the load/unload cups 182x and 182y over the polishing pad 155 is that footprint of the polishing unit 150 is effectively reduced. Another important advantage is that the length of the pivoting arms 183x and 183y can be reduced by positioning the pivoting shafts 184x and 184y over the polishing pad 155. In an embodiment, the load/unload cups 182x and 182y can be directly connected to the pivoting shafts 184x and 184y, respectively, without the pivoting arms 183x and 184y. With shorter or no pivoting arms 183x and 183y, the pivoting motions of the load/unload cups 182x and 182y can be controlled more stably and accurately.

Figure 4B:
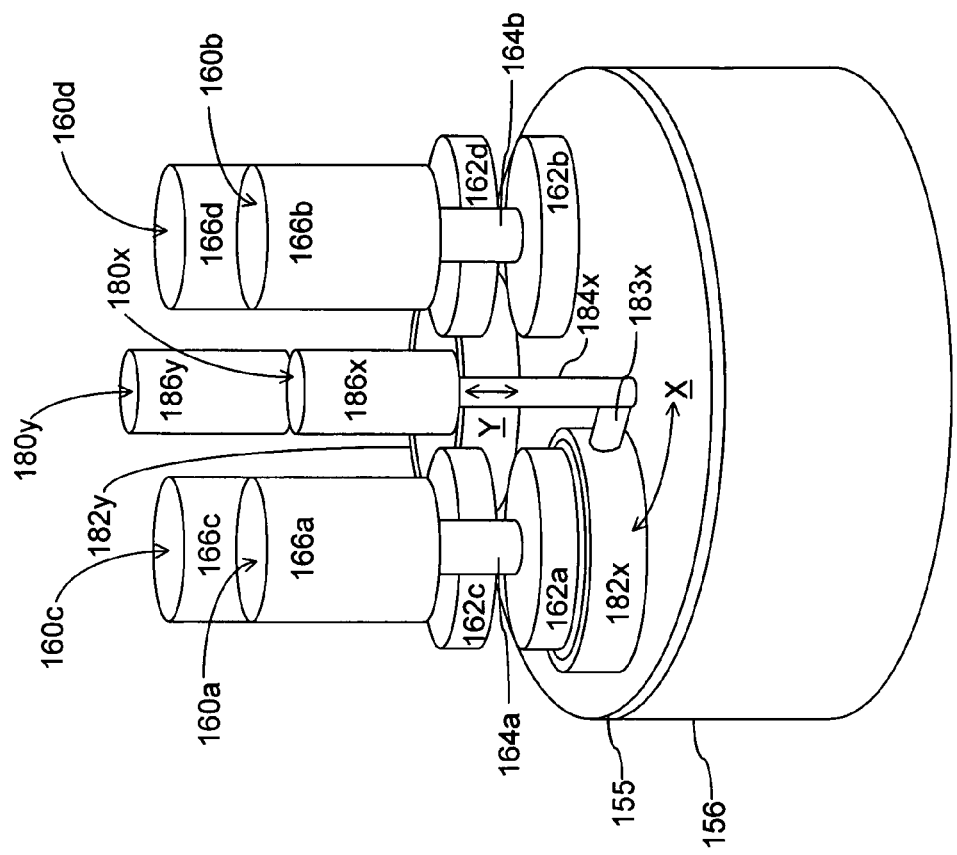
FIGS. 4(a) and (b) are top and perspective views, respectively, of the polishing unit of FIG. 1 to show wafer transfer process by one of the wafer relay devices of the polishing unit.
Figure 4A:
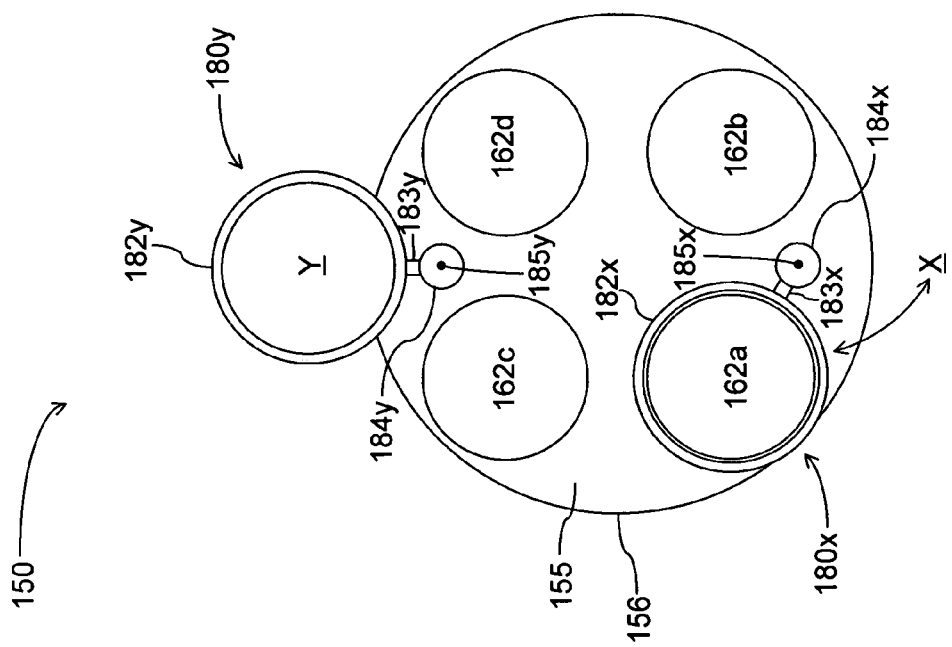

With reference to FIGS. 4(a) and (b), an operation of the wafer relay devices 180 is described using the wafer carrier 162a and the wafer relay device 180x as examples. FIG. 4(a) is a top view of the polishing unit 150 with the load/unload cup 182x positioned below the wafer carrier 162a when the wafer carrier 162a is positioned in the wafer load/unload position. FIG. 4(b) is a perspective view of the polishing unit 150 of FIG. 4(a). After the load/unload cup 182x receives a semiconductor wafer from the wafer transport device 140 at the parking position X as illustrated in FIG. 3, the load/unload cup 182x is pivoted to the wafer load/unload position of the wafer carrier 162a over the polishing table 156. After being pivoted, the load/unload cup 182x is moved towards the wafer carrier 162a in a vertical manner and then loads the wafer onto the wafer carrier 162a. After transferring the wafer to the wafer carrier 162a, the load/unload cup 182x is moved down and then pivoted back to the parking position X. For unloading the wafer from the wafer carrier 162a, the load/unload cup 182x is pivoted again to the wafer load/unload position of the wafer carrier 162a. After receiving the wafer from the wafer carrier 162a, the load/unload cup 182x returns to the parking position X.

Figure 6:
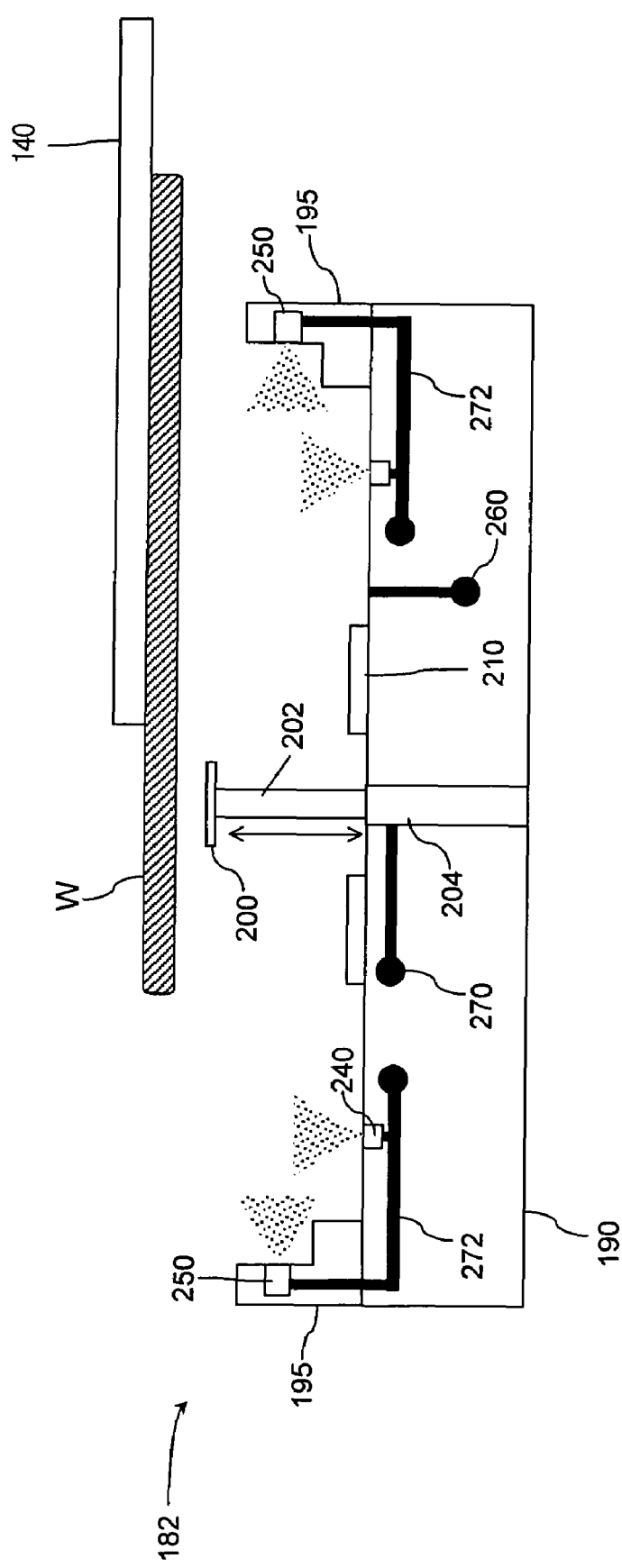
FIG. 6 is a cross sectional view of the load/unload cup of FIG. 5.

With reference to FIGS. 5 and 6, the load/unload cup 182 of the wafer relay device 180, which can be either the wafer relay device 180x or the wafer relay device 180y, is described. FIG. 5 is a top view of the load/unload cup 182 in accordance with an embodiment of the invention. FIG. 6 is a cross sectional view of the load/unload cup 182 of FIG. 5 along the line QQ.

As illustrated in FIG. 5, the load/unload cup 182 may comprise a cup base 190, a cup ring 195, a lifter 200, a wafer tray 210, a first multiple nozzles 240, a second multiple nozzles 250, a drain channel 260, a first fluid channel 270 and a second fluid channel 272. The fluid channels 270 and 272 may be connected to fluid sources (not shown) through the pivoting arm 183 and the pivoting shaft 184. The drain channel 260 may be connected to a drain pump (not shown) through the pivoting arm 183 and the pivoting shaft 184 like the other fluid channels 270 and 272.

The cup ring 195 and the wafer tray 210 are mounted on the cup base 190. The wafer tray 210 comprises a hole at the center such that the lifter 200 can be positioned at the center of the cup base 190. The lifter 200 is connected to a lifter pneumatic cylinder 204 through a lift piston 202 as illustrated in FIG. 6. The lifter 200 is a wafer handling device to raise and lower a wafer to and from a wafer carrier. The lifter 200 is preferably made of soft materials such as rubber to avoid damaging wafer surface. The lifer 200 has a surface area that is smaller than the surface area of the wafer being handled by the lifer. The lifter cylinder 204 is connected to the first fluid channel 270 and operated by a fluid supplied through the first fluid channel 270. Nitrogen gas is one example of the fluid that can be used. The lifter 200 is moved up and down by the lifter cylinder 204. The lifter 200 is lifted above the top surface of the cup ring 195 to receive a wafer W from the wafer transport device 140 as illustrated in FIG. 6. After the lifter 200 receives the wafer W, the lifter is moved down below the wafer tray 210 in order to put the wafer W on the wafer tray 210.

The first multiple nozzles 240 are mounted on the top of the cup base 190 and the second multiple nozzles 250 are mounted to the cup ring 195 as illustrated in FIG. 6. The first and second nozzles 240 and 250 are connected to the second fluid channel 272 and sprays fluid, such as deionized (D.I.) water, which is supplied through the second fluid channel 272. Used fluid, e.g., used D.I. water, is drained through the drain channel 260 by the drain pump (not shown).

With reference to FIGS. 7(a) and 7(b), a process sequence for loading a wafer W onto the wafer carrier 162 is described. FIGS. 7(a)-(b) are sequential cross sectional views of the load/unload cup 182. After the wafer W is positioned on the wafer tray 210 as previously described with reference to FIG. 6, the load/unload cup 182 is transferred to a position where the wafer carrier 162 is positioned, as illustrated in FIG. 7(a). The wafer carrier 162 comprises a retainer ring 280 to confine the wafer during polishing process. Next, the lifter 200 is moved up and the wafer on the lifer is received by the wafer carrier 162 using a vacuum supplied through vacuum channels 285, as illustrated in FIG. 7(b). After the wafer is received by the wafer carrier 162, the lifter 200 is moved down. For unloading the wafer, the vacuum provided through the vacuum channels 285 is removed, which releases the wafer W from the wafer carrier 162 onto the lifter 200 of the load/unload cup 182. The load/unload cup 182 can wash the wafer carrier 162 by spraying D.I. water onto the wafer carrier 162.

Even though a specific configuration of the load/unload cup 182 and its wafer loading/unloading process have been described, any type of device that can load and unload wafers onto and from the wafer carrier 162 can be used in the wafer relay device 180.

Figure 8:
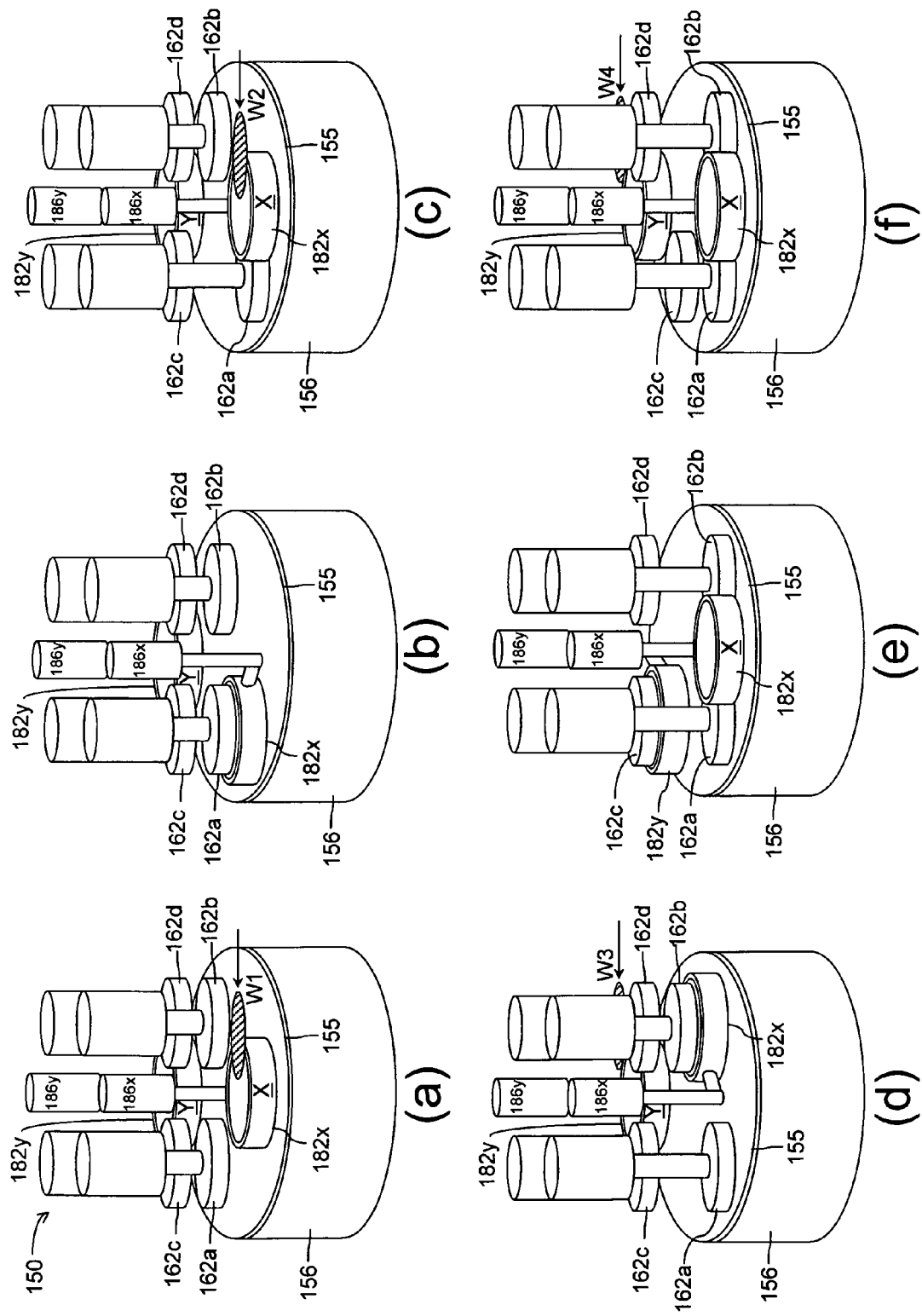
FIGS. 8(a)-(p) are sequential perspective views of the polishing unit of FIG. 2 to show a process sequence in the polishing unit.
Figure 8:
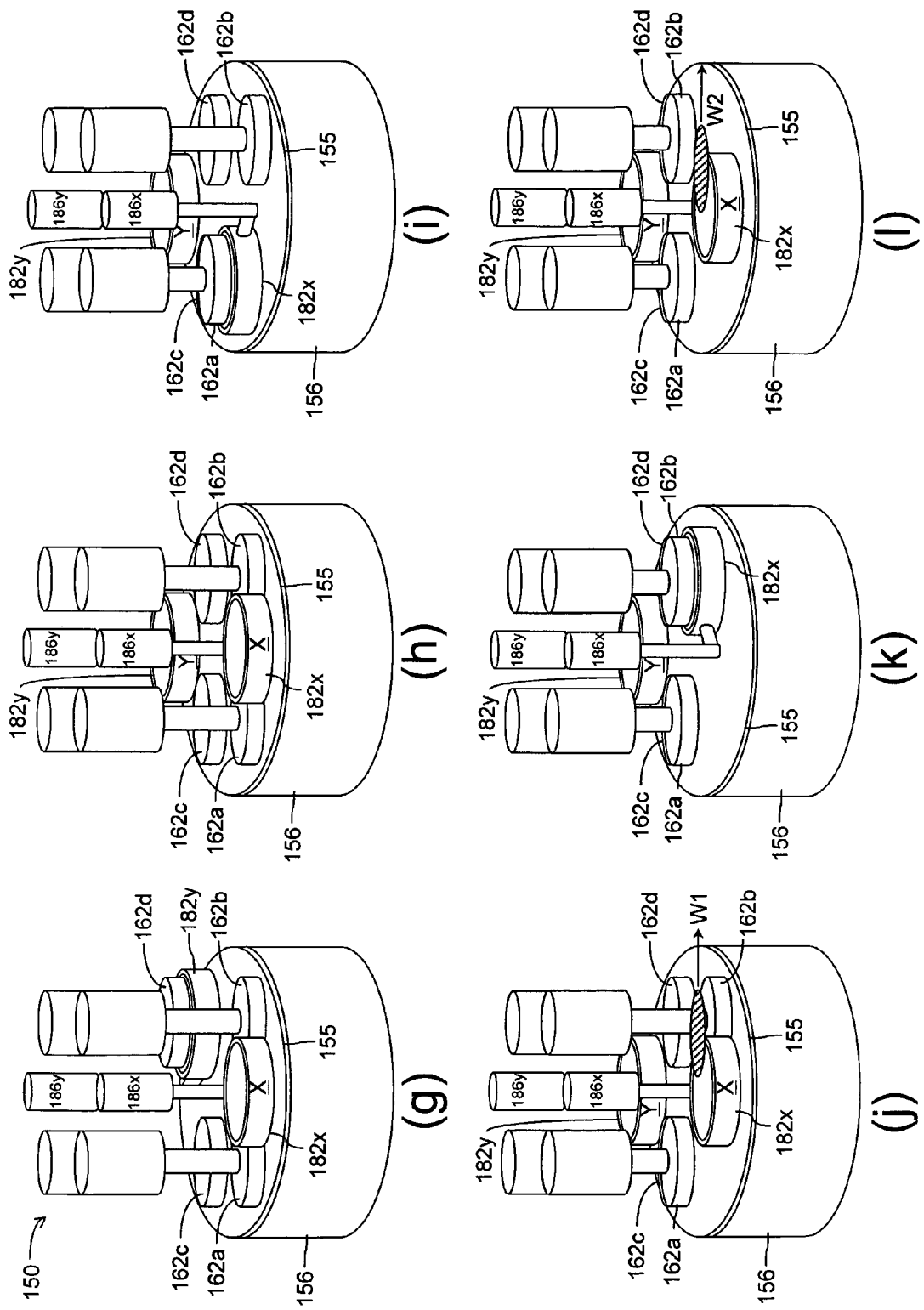
Figure 8:
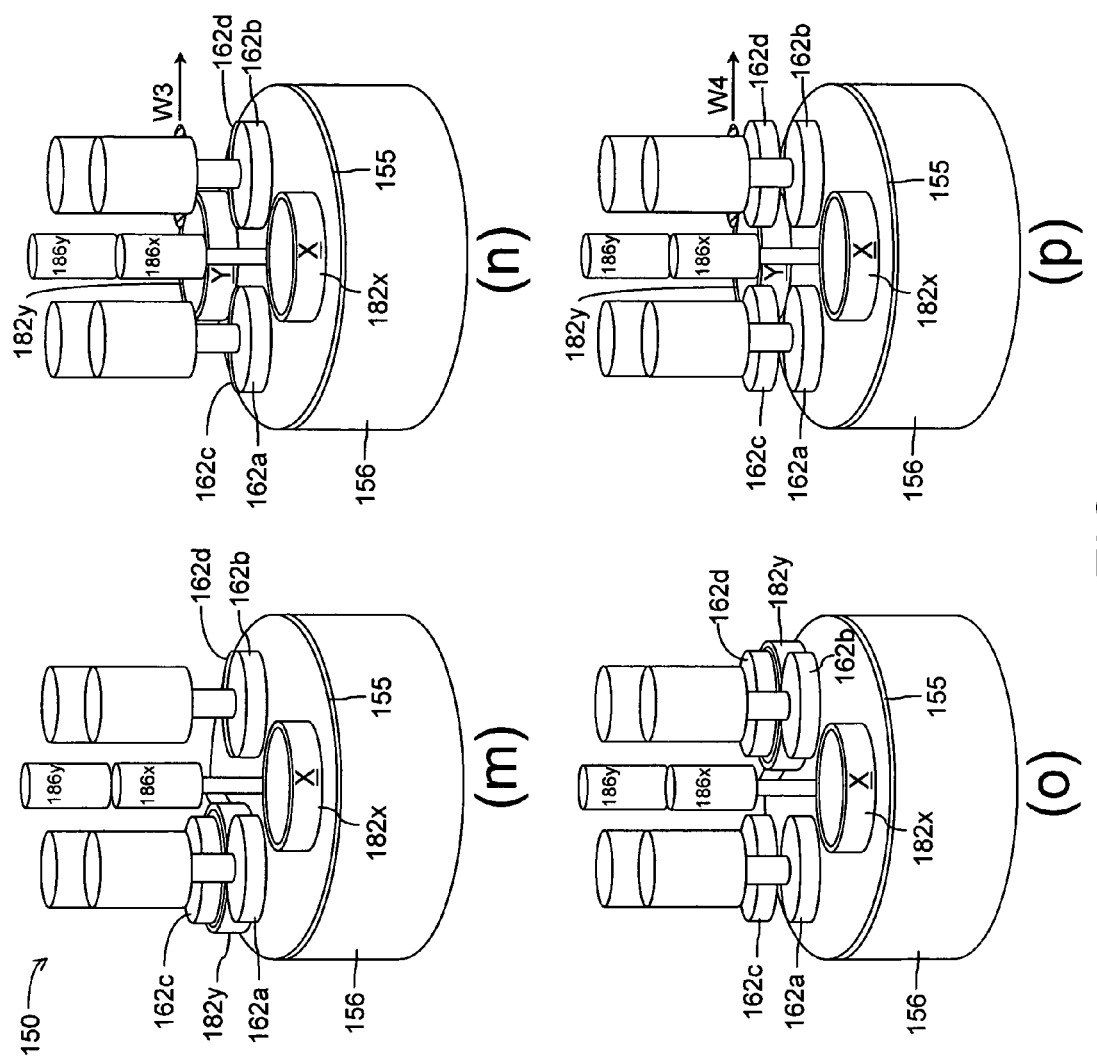

With reference to FIGS. 8(*a*)-(*p*), an exemplary process sequence of wafer transferring and polishing at the polishing unit 150 is described. FIGS. 8 (*a*)-(*p*) are sequential perspective views of the polishing unit 150 to show the process sequence.

In FIG. 8(*a*), the four wafer carriers 162*a*, 162*b*, 162*c* and 162*d* are positioned at the respective wafer load/unload positions over the polishing table 156. The two load/unload cups 182*x* and 182*y* are positioned at the respective parking positions, X and Y. A first wafer, W1, is supplied to the first load/unload cup 182*x* by the wafer transport device 140 (not shown in FIGS. 8(*a*)-(*p*)) as indicated by the arrow.

In FIG. 8(*b*), the first load/unload cup 182*x* is transferred to the wafer load/unload position of the first wafer carrier 162*a* and then loads the first wafer, W1, onto the first wafer carrier 162*a*.

In FIG. 8(*c*), the first load/unload cup 182*x* is transferred back to the parking position X and then the first wafer carrier 162*a* polishes the first wafer, W1, on a polishing pad 155 attached on the polishing table 156. While the first wafer, W1, is being polished, a second wafer, W2, is supplied to the first load/unload cup 182*x* by the wafer transport device 140 as indicated by the arrow.

In FIG. 8(*d*), the first load/unload cup 182*x* is transferred to the wafer load/unload position of the second wafer carrier 162*b* and then loads the second wafer, W2, onto the second wafer carrier 162*b*. Meanwhile, a third wafer, W3, is supplied to the second load/unload cup 182*y* at the parking position X by the wafer transport device 140 as indicated by the arrow.

In FIG. 8(*e*), the first load/unload cup 182*x* is transferred back to the parking position X and then the second wafer carrier 162*b* polishes the second wafer, W2, on the polishing pad 155. While the first and second wafers are being polished, the second load/unload cup 182*y* is transferred to the wafer load/unload position of the third wafer carrier 162*c* and then loads the third wafer, W3, to the third wafer carrier 162*c*.

In FIG. 8(*f*), the second load/unload cup 182*y* is transferred back to the parking position Y and then the third wafer carrier 162*c* polishes the third wafer, W3, on the polishing pad 155. While the first, second and third wafers are being polished, a fourth wafer, W4, is supplied to the second load/unload cup 182*y* by the wafer transport device 140 as indicated by the arrow.

In FIG. 8(*g*), the second load/unload cup 182*y* is transferred to the wafer load/unload position of the fourth wafer carrier 162*d* and then loads the fourth wafer, W4, to the fourth wafer carrier 162*d*.

In FIG. 8(*h*), the second load/unload cup 182*y* is transferred back to the parking position Y and then the fourth wafer carrier 162*d* polishes the fourth wafer, W4, on the polishing pad 155.

In FIG. 8(*i*), after the polishing process of the first wafer, W1, is completed, the first wafer carrier 162*a* is lifted from the polishing pad 155 and then transferred back to the wafer load/unload position. The first load/unload cup 182*x* is then transferred to the wafer load/unload position of the first wafer carrier 162*a* and receives the first wafer, W1, from the first wafer carrier 162*a*.

In FIG. 8(*j*), the first load/unload cup 182*x* is transferred back to the parking position X and then the first wafer, W1, is removed from the first load/unload cup 182*x* by the wafer transport device 140 as indicated by the arrow.

In FIG. 8(*k*), after the polishing process of the second wafer, W2, is completed, the second wafer carrier 162*b* is lifted from the polishing pad 155 and then transferred back to the wafer load/unload position. The first load/unload cup 182*x* is transferred to the wafer load/unload position of the second wafer carrier 162*b* and then receives the second wafer, W2, from the second wafer carrier 162*b*.

In FIG. 8(*l*), the first load/unload cup 182*x* is transferred back to the parking position X and then the second wafer, W2, is removed from the first load/unload cup 182*x* by the wafer transport device 140 as indicated by the arrow.

In FIG. 8(*m*), after polishing process of the third wafer, W3, is completed, the third wafer carrier 162*c* is lifted from the polishing pad 155 and then transferred back to the wafer load/unload position. The second load/unload cup 182*y* is transferred to the wafer load/unload position of the third wafer carrier 162*c* and then receives the third wafer, W3, from the third wafer carrier.

In FIG. 8(*n*), the second load/unload cup 182*y* is transferred back to the parking position Y and then the third wafer, W3, is removed from the second load/unload cup 182*y* by the wafer transport device 140 as indicated by the arrow.

In FIG. 8(*o*), after polishing process of the fourth wafer, W4, is completed, the fourth wafer carrier 162*d* is lifted from the polishing pad 155 and then transferred back to the wafer load/unload position. The second load/unload cup 182*y* is transferred to the wafer load/unload position of the fourth wafer carrier 162*d* and then receives the fourth wafer, W4, from the fourth wafer carrier 162*d*.

In FIG. 8(*p*), the second load/unload cup 182*y* is transferred back to the parking position Y and then the fourth wafer, W4, is removed from the second load/unload cup 182*y* by the wafer transport device 140 as indicated by the arrow.

Even though one exemplary sequence of transferring and polishing semiconductor wafers in the polishing unit 150 has been described with reference to FIGS. 8(*a*)-8(*p*), other sequences may be also used in the polishing unit 150. For example, after the first wafer, W1, is transferred to the first wafer carrier 162*a* as shown in FIG. 8(*b*), the second wafer, W2, can be transferred to the second load/unload cup 182*y* instead of the first load/unload cup 182*x* by the wafer transport device 140. Then the second wafer, W2, is transferred to the third wafer carrier 162*c* by the second load/unload cup 182*y* and then polished on the polishing pad 155. It is also possible to transfer the second wafer, W2, to the fourth wafer carrier 162*d* instead of the third wafer carrier 162*c* by the second load/unload cup 182*y* and then polish the second wafer on the polishing pad 155. It is also possible to polish four wafers in a simultaneous manner by starting the polishing process for the four wavers after all the wafer carriers 162 are sequentially loaded with the wafers by the load/unload cups 182*x* and 182*y*.

Figure 9:
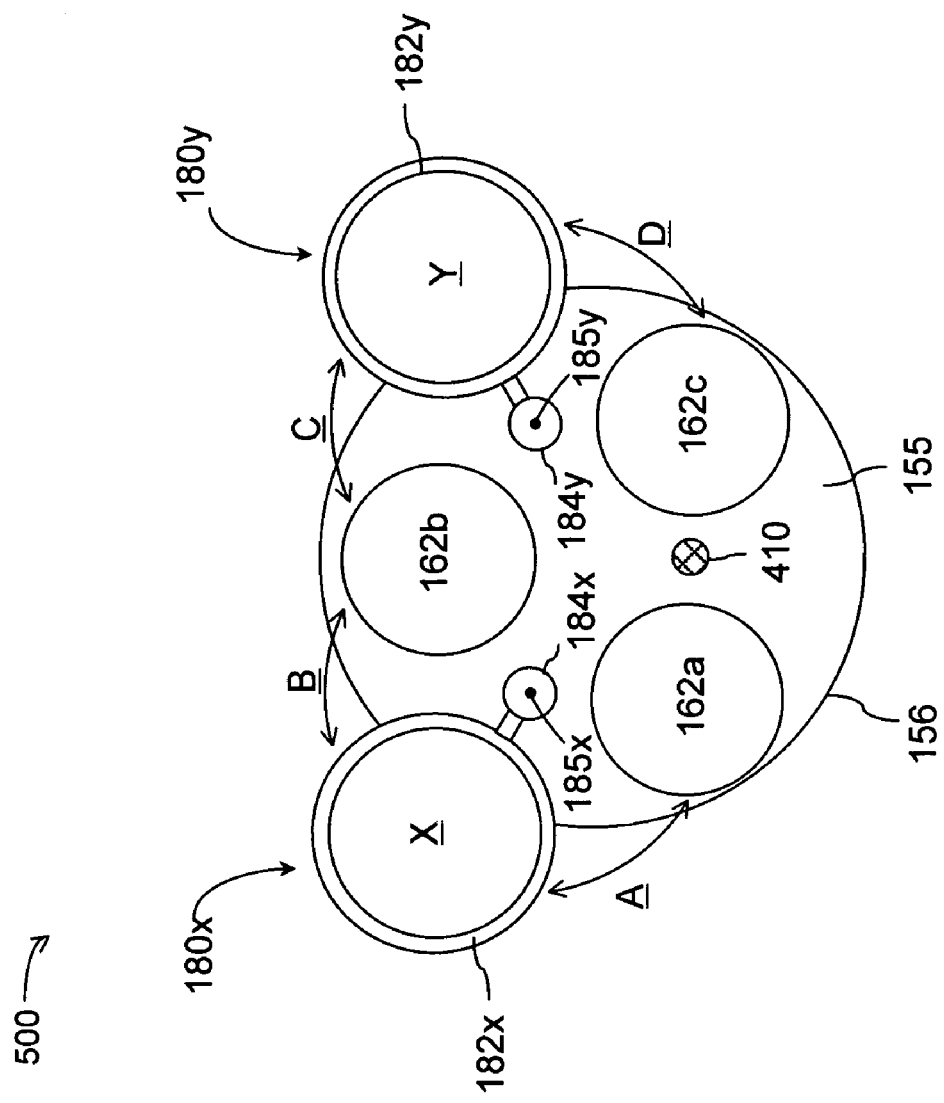
FIG. 9 is a top view of a polishing unit in accordance with a first alternative embodiment of the present invention.

With reference to FIGS. 9-32, polishing units 500, 520, 540, 560, 580, 600, 620, 640, 660, 680, 700 and 720 in accordance with alternative embodiments of the present invention are described. FIGS. 9, 11, 13(*a*), 13(*b*), 15(*a*), 15(*b*), 17, 19, 21, 23, 25(*a*), 27(*a*), 29, and 31 are top views of these polishing units 500, 520, 540, 560, 580, 600, 620, 640, 660, 680, 700 and 720. FIGS. 25(*b*) and 27(*b*) are perspective views of the polishing unit 660 and a dual cup wafer relay device of the polishing unit 680, respectively.

FIGS. 10, 12, 14, 16, 18, 20, 22, 24, 26, 28(a), 28(b), 30(a), 30(b) and 32 are flow diagrams of methods of processing wafers in these polishing units. Any one of these polishing units 500, 520, 540, 560, 580, 600, 620, 640, 660, 680, 700 and 720 can be used in the polishing apparatus 100 of FIG. 1 instead of the polishing unit 150.

In FIGS. 9, 11, 13, 15, 17, 19, 21, 23, 25(a), 27(a), 29, and 31, wafer carriers 162 are illustrated without respective carrier shafts 164 and respective rotating-and-vertical drive mechanisms 166. However, each wafer carrier 162 of the polishing unit 500, 520, 540, 560, 580, 600, 620, 640, 660, 680, 700 and 720 is a part of a wafer carrier assembly 160 as described above with reference to FIGS. 1 and 2. The wafer carriers 162 in these figures are positioned at their respective wafer load/unload positions over a single or multiple polishing tables 156. In some of these figures, wafer relay devices 180 are shown without pivoting-and-vertical drive mechanisms 186. However, load/unload cups 182 of the wafer relay devices 180 are controlled by respective pivoting-and-vertical drive mechanisms 186 as described with reference to FIGS. 1 and 2. The load/unload cups 182 in these figures are positioned at their respective parking positions X and Y. Wafer transport device 140 (not shown in these figures) transfers wafers to and from the load/unload cups 182 at these parking positions X and Y. The load/unload cups 182 transfer wafers to and from the wafer carriers 162 by their respective pivoting motions A, B, C and D. The polishing tables 156 can be rotated or orbited about their respective pivoting points. One or more pad conditioners 410 can be used in these polishing units in order to condition polishing pads that are attached on the polishing tables 156.

With reference to FIG. 9, a polishing unit 500 according to a first alternative embodiment is described. The polishing unit 500 comprises one polishing table 156 with a polishing pad 155, three wafer carriers 162a, 162b and 162c, and two wafer relay devices 180x and 180y. The wafer carriers 162a, 162b and 162c are positioned over the polishing table 156 in a triangular configuration. That is, the wafer carriers 162a, 162b and 162c are positioned such that these wafer carriers substantially define a triangle. The first wafer relay device 180x is positioned between the first and second wafer carriers 162a and 162b in such a manner that the load/unload cup 182x of the first wafer relay device 180x can be pivoted about the pivoting point 185x over the surface of the polishing pad 155 to the wafer load/unload positions of the first and second wafer carriers 162a and 162b by the pivoting motions A and B, respectively. The second wafer relay device 180y is positioned between the second and third wafer carriers 162b and 162c in such a manner that the load/unload cup 182y of the second wafer relay device 180y can be pivoted about the pivoting point 185y, which is located over the surface of the polishing pad 155, to the wafer load/unload positions of the second and third wafer carriers 162b and 162c by the pivoting motions C and D respectively. Therefore, wafers can be transferred to and from the second wafer carrier 162b by any of the two load/unload cups 182x and 182y by the respective pivoting motions B and C. The pivoting points 185x and 185y are located on pivoting axes that perpendicularly intersect the surface of the polishing pad 155.

Figure 10:
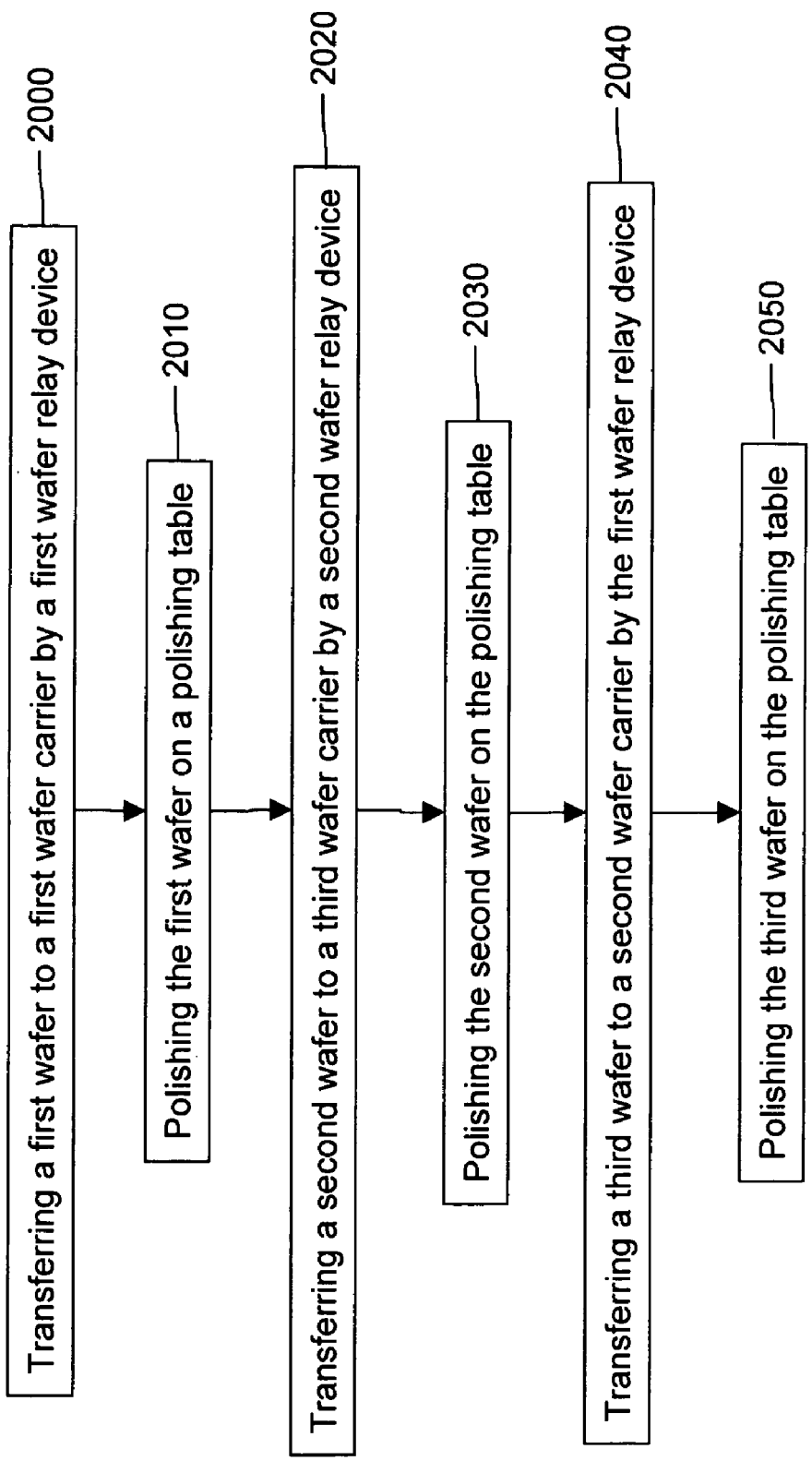
FIG. 10 is a process flow diagram for processing wafers in the polishing unit of FIG. 9.
Figure 11:
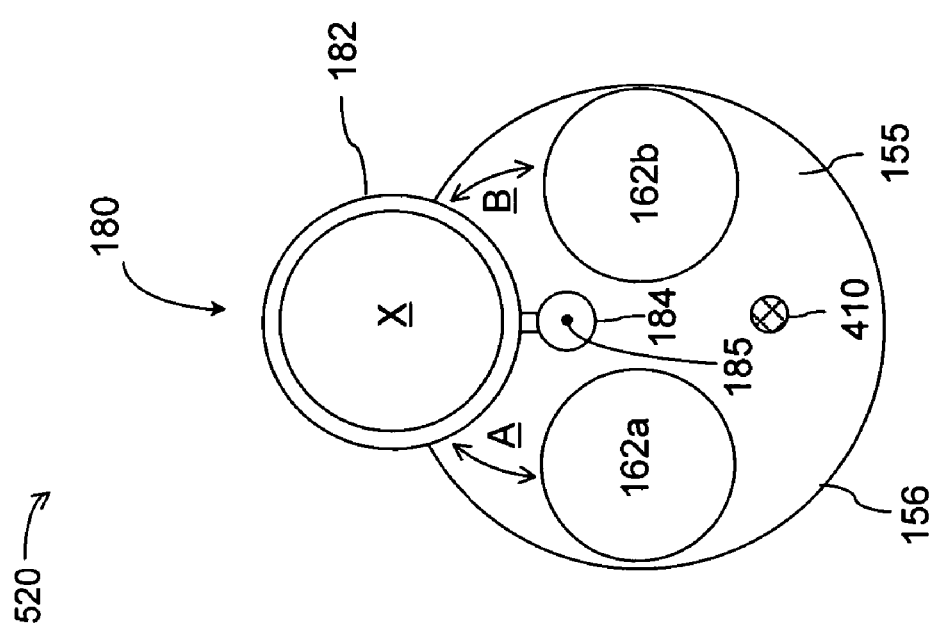
FIG. 11 is a top view of a polishing unit in accordance with a second alternative embodiment of the present invention.

With reference to FIG. 10, a method of processing wafers in the polishing unit 500 is described. This method comprises the steps illustrated in FIG. 10. At step 2000, a first wafer is transferred to the first wafer carrier 162a by the first wafer relay device 180x. This step comprises sub-steps of (1) positioning the first wafer on the load/unload cup 182x at its parking position X, (2) transferring the load/unload cup 182x to the wafer load/unload position of the first wafer carrier 162a over the polishing table 156 by its pivoting motion A, (3) loading the first wafer onto the first wafer carrier 162a, and (4) transferring the load/unload cup 182x back to its parking position X. Next, at step 2010, the first wafer is polished on the polishing table 156 using the polishing pad 155.

Next, at step 2020, a second wafer is transferred to the third wafer carrier 162c by the second wafer relay device 180y. This step comprises sub-steps of (1) positioning the second wafer on the load/unload cup 182y at its parking position Y, (2) transferring the load/unload cup 182y to the wafer load/unload position of the third wafer carrier 162c over the polishing table 156 by its pivoting motion D, (3) loading the second wafer onto the third wafer carrier 162c, and (4) transferring the load/unload cup 182y back to its parking position Y. Next, at step 2030, the second wafer is polished on the polishing table 156 using the polishing pad 155.

Next, at step 2040, a third wafer is transferred to the second wafer carrier 162b by the first wafer relay device 180x. This step comprises sub-steps of (1) positioning the third wafer on the load/unload cup 182x at its parking position X, (2) transferring the load/unload cup 182x to the wafer load/unload position of the second wafer carrier 162b over the polishing table 156 by its pivoting motion B, (3) loading the third wafer onto the second wafer carrier 162b, (4) transferring the load/unload cup 182x back to its parking position X. Next, at step 2050, the third wafer is polished on the polishing table 156 using the polishing pad 155.

After the polishing processes of the wafers are completed, the polished wafers are sequentially lifted from the polishing table 156 and then sequentially transferred from the wafer carriers 162a, 162c and 162b by the wafer relay devices 180x and 180y.

Even though sequential polishing process of the wafers using the three wafer carriers 162 has been described, it is also possible to start polishing the wafers simultaneously after all the wafer carriers are sequentially loaded with the wafers by the load/unload cups 182x and 182y.

With reference to FIG. 11, a polishing unit 520 according to a second alternative embodiment is described. The polishing unit 520 comprises one polishing table 156 with a polishing pad 155, two wafer carriers 162a and 162b, and one wafer relay device 180. The wafer carriers 162a and 162b are positioned over the polishing table 156. The wafer relay device 180 is positioned between the wafer carriers 162a and 162b in such a manner that the load/unload cup 182 of the wafer relay device 180 can be pivoted about the pivoting point 185, which is located over surface of the polishing pad 155, to the wafer load/unload positions of the wafer carriers 162a and 162b by the pivoting motions A and B, respectively. The pivoting point 185 is located on a pivoting axis that perpendicularly intersects the surface of the polishing pad 155.

Figure 12:
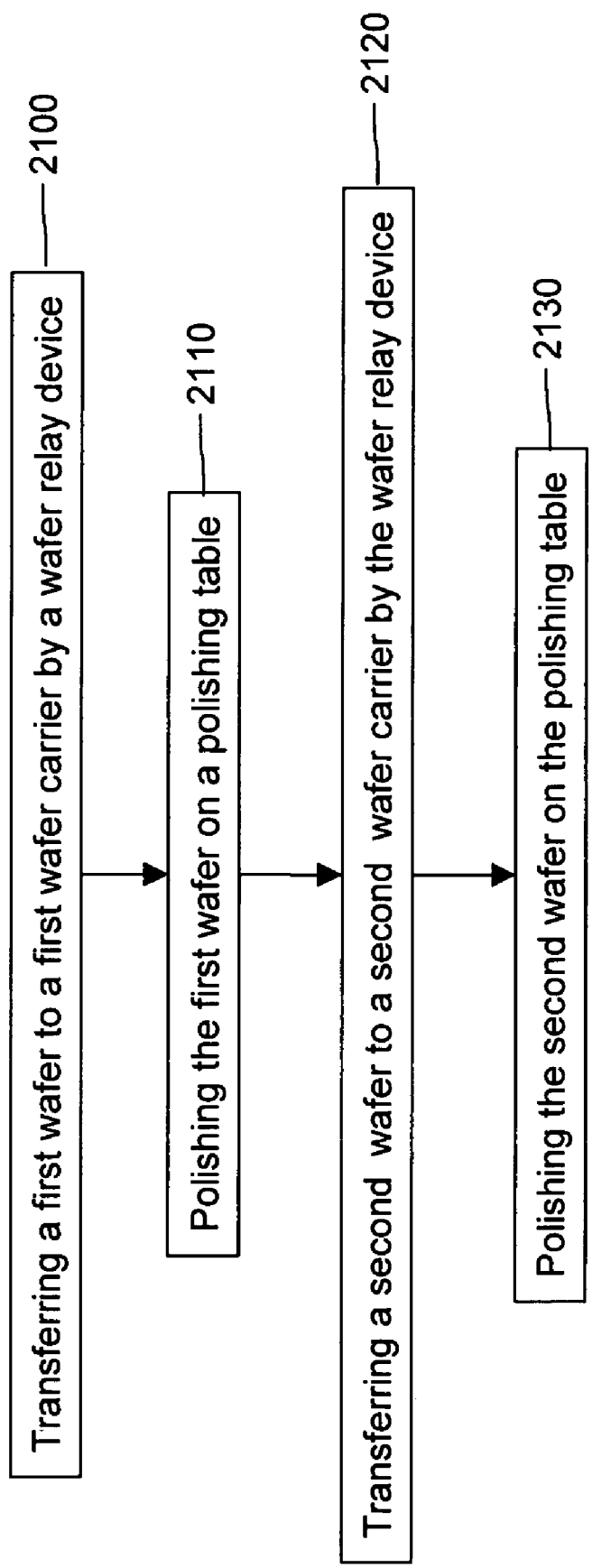
FIG. 12 is a process flow diagram for processing wafers in the polishing unit of FIG. 11.
Figure 13A:
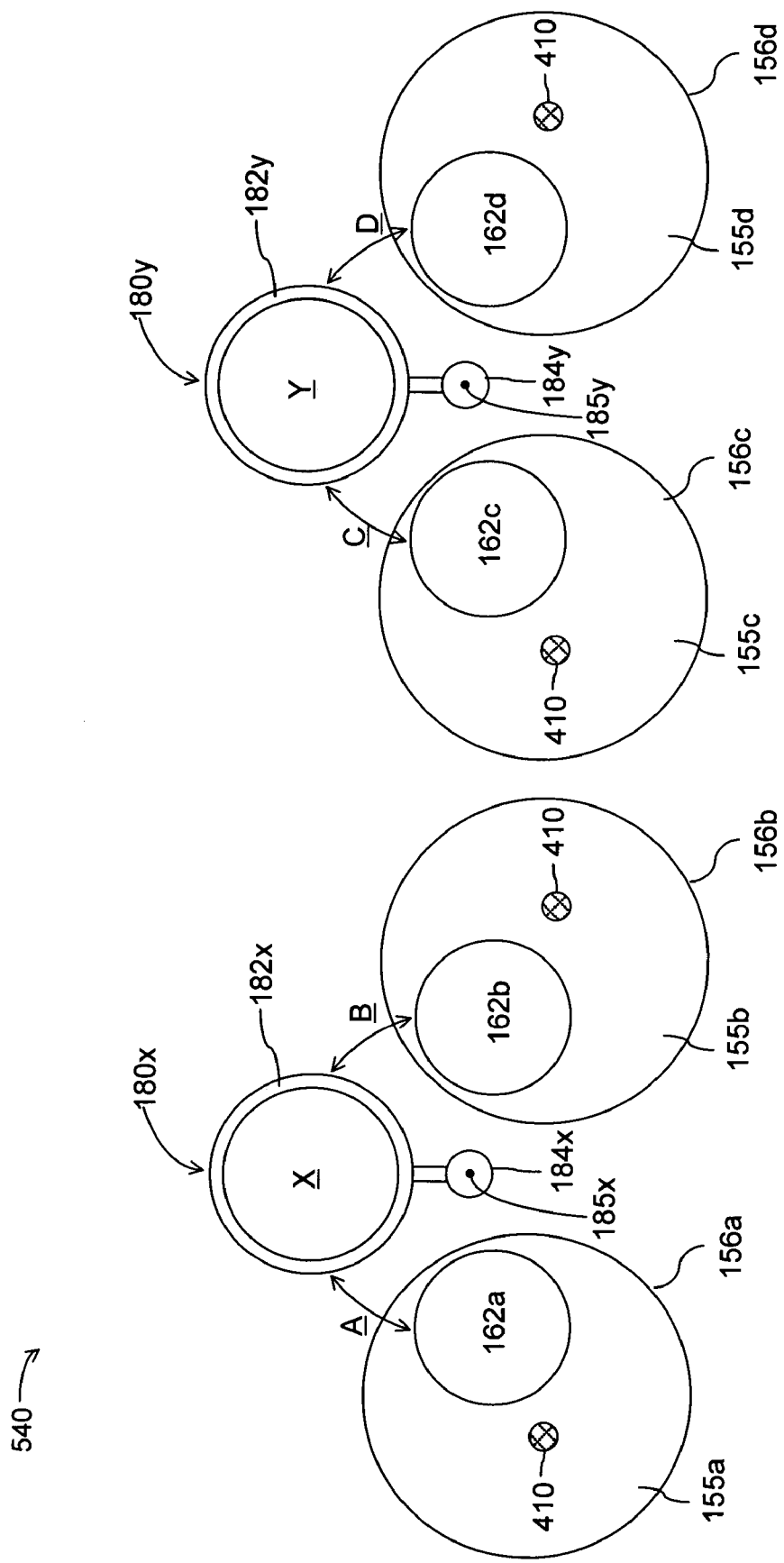
FIG. 13(a) is a top view of a polishing unit in accordance with a third alternative embodiment of the present invention.
Figure 13:
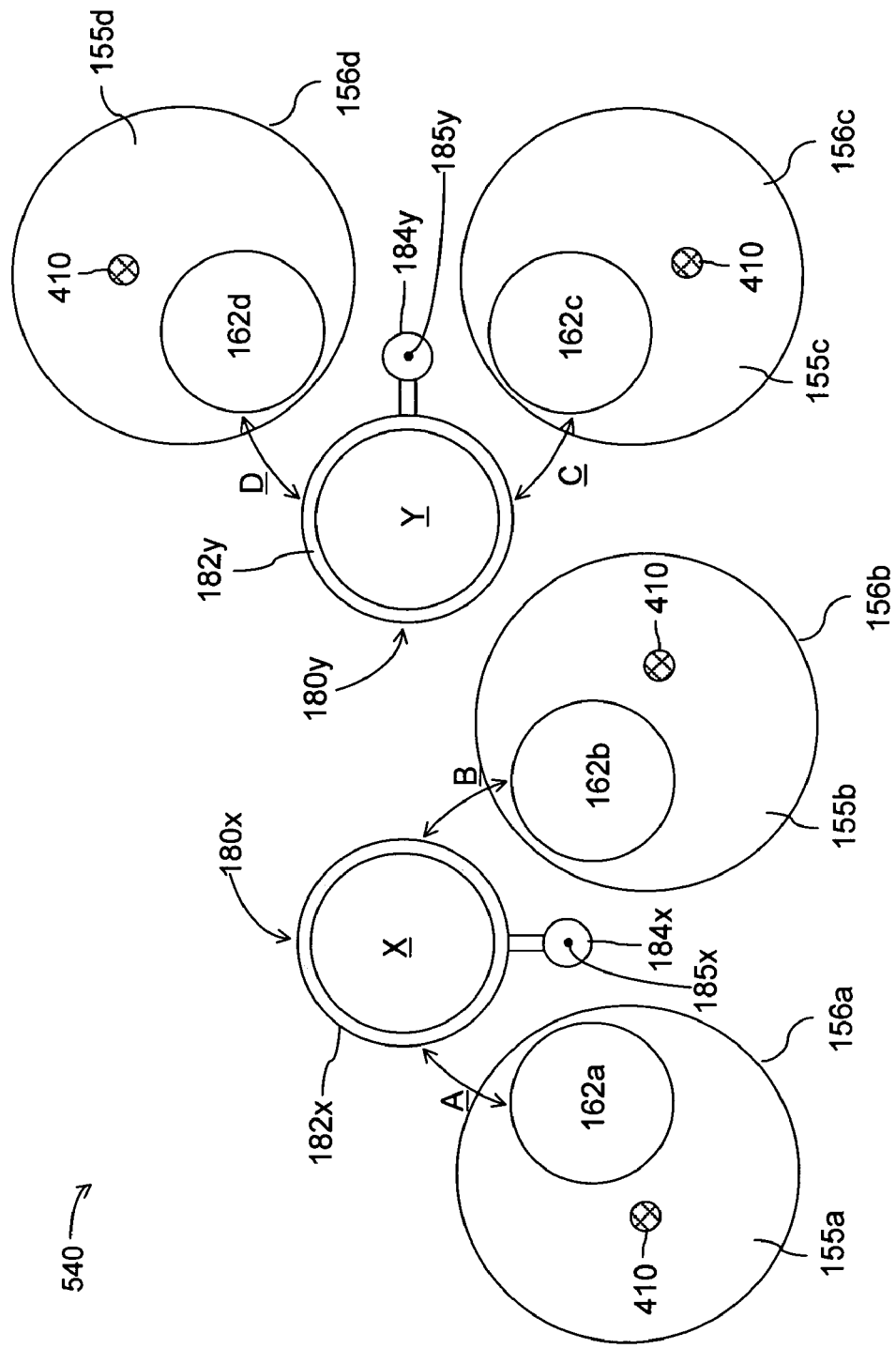
FIG. 13(b) is a top view of the polishing unit of FIG. 13(a) in an alternative configuration.

With reference to FIG. 12, a method of processing wafers in the polishing unit 520 is described. This method comprises the steps illustrated in FIG. 12. At step 2100, a first wafer is transferred to the first wafer carrier 162a by the wafer relay device 180. This step comprises sub-steps of (1) positioning the first wafer on the load/unload cup 182 at its parking position X, (2) transferring the load/unload cup 182 to the wafer load/unload position of the first wafer carrier 162a over the polishing table 156 by its pivoting motion A, (3) loading the first wafer onto the first wafer carrier 162a, and (4) transferring the load/unload cup 182 back to its parking position X. Next, at step 2110, the first wafer is polished on the polishing table 156 using the polishing pad 155.

Next, at step 2120, a second wafer is transferred to the second wafer carrier 162*b* by the wafer relay device 180. This step comprises sub-steps of (1) positioning the second wafer on the load/unload cup 182 at its parking position X (2) transferring the load/unload cup 182 to the wafer load/unload position of the second wafer carrier 162*b* over the polishing table 156 by its pivoting motion B, (3) loading the second wafer onto the second wafer carrier 162*b*, and (4) transferring the load/unload cup 182 back to its parking position X. Next, at step 2130, the second wafer is polished on the polishing table 156 using the polishing pad 155.

After the polishing processes of the wafers are completed, the wafers are sequentially lifted from the polishing table 156 and then sequentially transferred from the wafer carriers 162*a* and 162*b* by the wafer relay device 180.

Even though sequential polishing process of the wafers using the two wafer carriers 162 has been described, it is also possible to start polishing the wafers simultaneously after all the wafer carriers are sequentially loaded with the wafers by the load/unload cup 182.

With reference to FIG. 13(*a*), a polishing unit 540 according to a third alternative embodiment is described. The polishing unit 540 comprises four polishing tables 156*a*-156*d* with respective polishing pads 155*a*-155*d*, four wafer carriers 162*a*-162*d*, and two wafer relay devices 180*x* and 180*y*. The wafer carriers 162*a*, 162*b*, 162*c* and 162*d* are positioned over the polishing tables 156*a*, 156*b*, 156*c* and 156*d*, respectively, and polish wafers on the polishing tables 156*a*, 156*b*, 156*c* and 156*d* using polishing pads 155*a*, 155*b*, 155*c* and 155*d*, respectively.

The first wafer relay device 180*x* is positioned between the first and second wafer carriers 162*a* and 162*b* in such a manner that the load/unload cup 182*x* of the first wafer relay device 180*x* can be pivoted about the pivoting point 185*x* to the wafer load/unload positions of the first and second wafer carriers 162*a* and 162*b* by the pivoting motions A and B, respectively. The second wafer relay device 180*y* is positioned between the third and fourth wafer carriers 162*c* and 162*d* in such a manner that the load/unload cup 182*y* of the second wafer relay device 180*y* can be pivoted about the pivoting point 185*y* to the wafer load/unload positions of the third and fourth wafer carriers 162*c* and 162*d* by the pivoting motions C and D, respectively. The pivoting points 185*x* and 185*y* are located on pivoting axes that are perpendicular to the surface of the polishing pad 155.

In FIG. 13(*a*), the polishing pads 155*a*-155*d* are positioned in a linear configuration. That is, the polishing pads 155*a*-155*d* are positioned such that these polishing pads substantially define a straight line. However, the polishing pads 155*a*-155*d* may be positioned in a L-shaped configuration, as illustrated in FIG. 13(*b*).

Figure 14A:
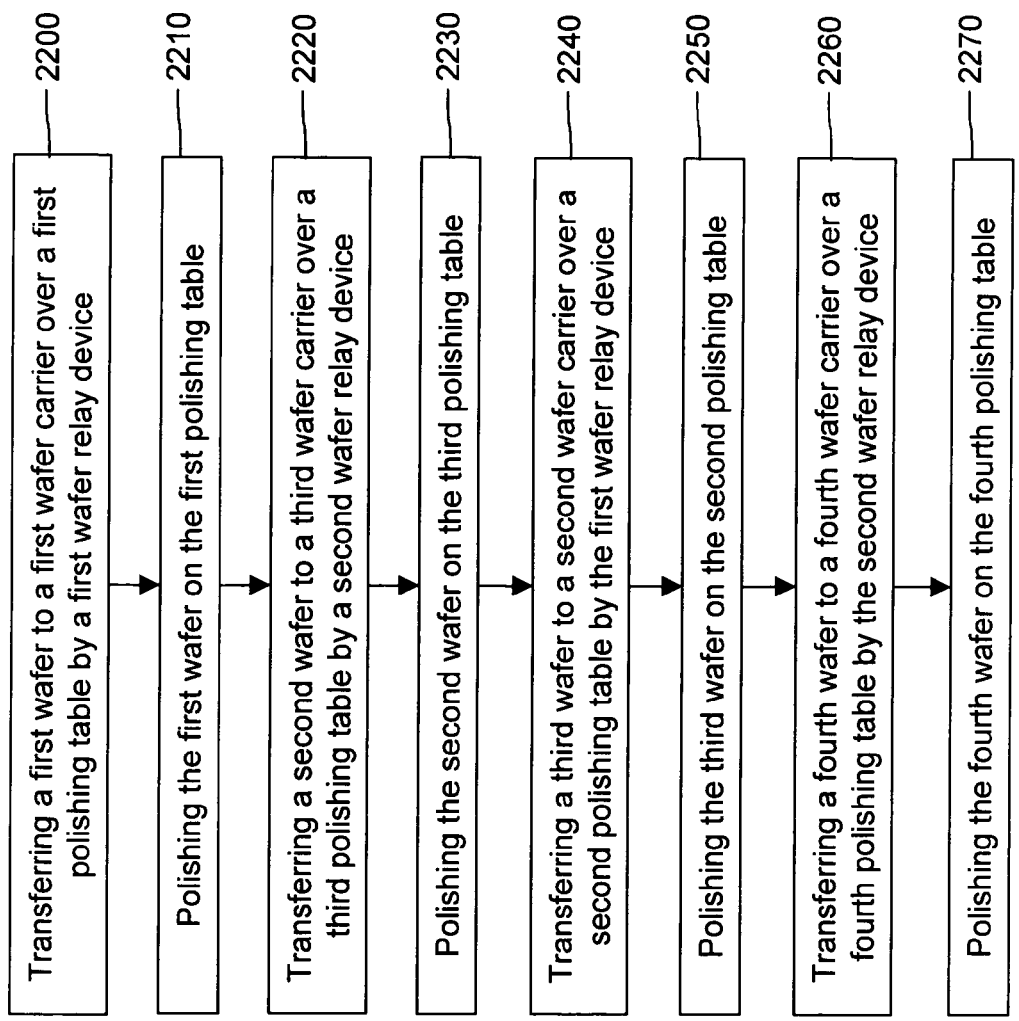
FIG. 14(a) is a process flow diagram for processing wafers in the polishing unit of FIGS. 13(a) and 13(b).
Figure 14B:
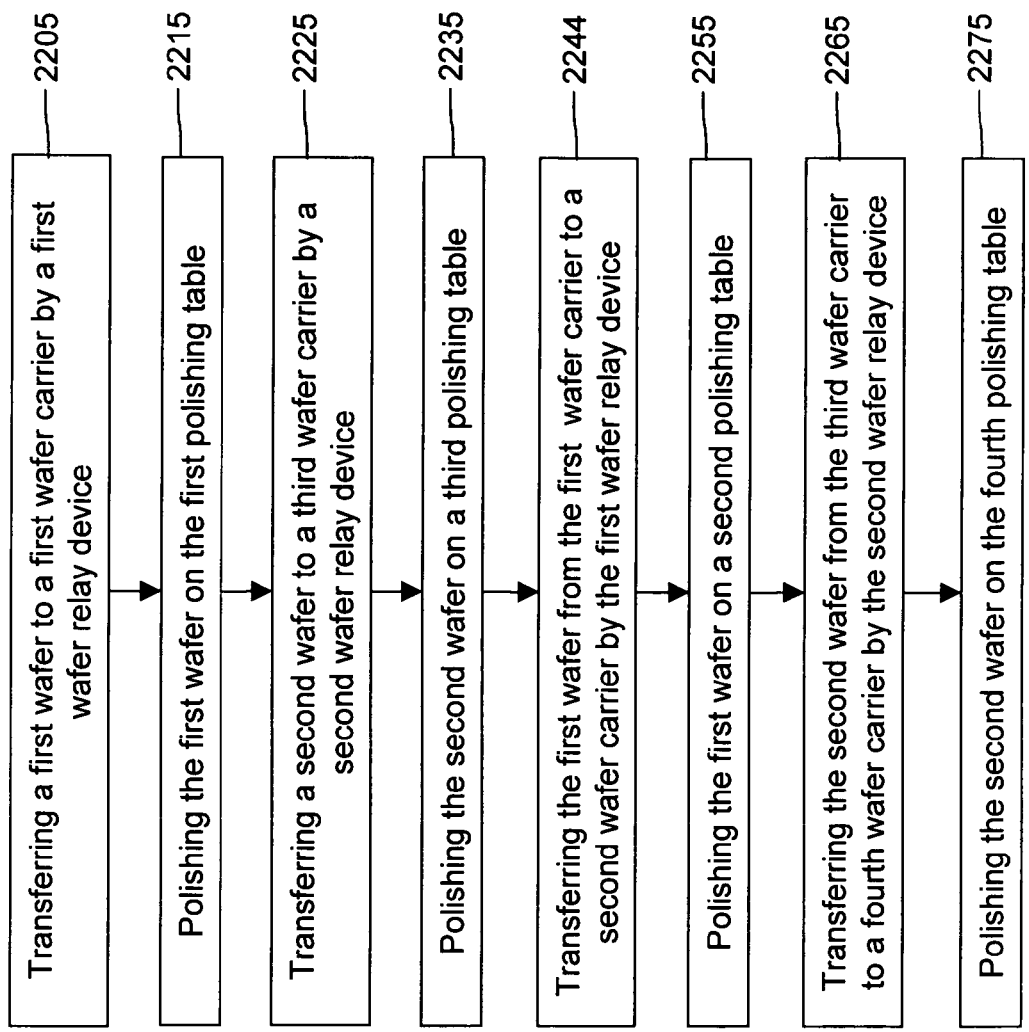
FIG. 14(b) is a process flow diagram for processing wafers in the polishing unit of FIGS. 13(a) and 13(b) in an alternative method.

With reference to FIG. 14(*a*), a method of processing wafers in the polishing unit 540 is described. This method comprises the steps illustrated in FIG. 14(*a*). At step 2200, a first wafer is transferred to the first wafer carrier 162*a* over the first polishing table 156*a* by the first wafer relay device 180*x*. This step comprises sub-steps of (1) positioning the first wafer on the load/unload cup 182*x* at its parking position X, (2) transferring the load/unload cup 182*x* to the wafer load/unload position of the first wafer carrier 162*a* over the first polishing table 156*a* by its pivoting motion A, (3) loading the first wafer onto the first wafer carrier 162*a* and (4) transferring the load/unload cup 182*x* back to its parking position X. Next, at step 2210, the first wafer is polished on the polishing table 156*a* using the polishing pad 155*a*.

Next, at step 2220, a second wafer is transferred to the third wafer carrier 162*c* over the third polishing table 156*c* by the second wafer relay device 180*y*. This step comprises sub-steps of (1) positioning the second wafer on the load/unload cup 182*y* at its parking position Y, (2) transferring the load/unload cup 182*y* to the wafer load/unload position of the third wafer carrier 162*c* over the third polishing table 156*c* by its pivoting motion C, (3) loading the second wafer onto the third wafer carrier 162*c* and (4) transferring the load/unload cup 182*y* back to its parking position Y. Next, at step 2230, the second wafer is polished on the third polishing table 156*c* using the polishing pad 155*c*.

Next, at step 2240, a third wafer is transferred to the second wafer carrier 162*b* over the second polishing table 156*b* by the first wafer relay device 180*x*. This step comprises sub-steps of (1) positioning the third wafer on the load/unload cup 182*x* at its parking position X, (2) transferring the load/unload cup 182*x* to the wafer load/unload position of the second wafer carrier 162*b* over the second polishing table 156*b* by its pivoting motion B, (3) loading the third wafer onto the second wafer carrier 162*b* and (4) transferring the load/unload cup 182*x* back to its parking position X. Next, at step 2250, the third wafer is polished on the second polishing table 156*b* using the polishing pad 155*b*.

Next, at step 2260, a fourth wafer is transferred to the fourth wafer carrier 162*d* over the fourth polishing table 156*d* by the second wafer relay device 180*y*. This step comprises sub-steps of (1) positioning the fourth wafer on the load/unload cup 182*y* at its parking position Y, (2) transferring the load/unload cup 182*y* to the wafer load/unload position of the fourth wafer carrier 162*d* over the fourth polishing table 156*d* by its pivoting motion D, (3) loading the fourth wafer onto the fourth wafer carrier 162*d*, and (4) transferring the load/unload cup 182*y* back to its parking position Y. Next, at step 2270, the fourth wafer is polished on the fourth polishing table 156*d* using the polishing pad 155*d*.

After the polishing processes of the wafers are completed, the wafers are sequentially lifted from the respective polishing tables 156*a*, 156*b*, 156*c* and 156*d*, and then sequentially transferred from the wafer carriers 162*a*, 162*b*, 162*c* and 162*d* by the wafer relay devices 180*x* and 180*y*.

Even though sequential polishing process of the wafers using the four wafer carriers 162 has been described, it is also possible to start polishing the wafers simultaneously after all the wafer carriers are sequentially loaded with the wafers by the load/unload cup 182*x* and 182*y*.

With reference to FIG. 14(*b*), an alternative method of processing wafers in the polishing unit 540 is described. This method comprises the steps illustrated in FIG. 14(*b*). At step 2205, a first wafer is transferred to the first wafer carrier 162*a* over the first polishing table 156*a* by the first wafer relay device 180*x*. Next, at step 2215, the first wafer is polished on the first polishing table 156*a* using the polishing pad 155*a*. The first wafer may be polished on the first polishing table 156*a* using a first kind of slurry.

Next, at step 2225, a second wafer is transferred to the third wafer carrier 162*c* over the third polishing table 156*c* by the second wafer relay device 180*y*. Next, at step 2235, the second wafer is polished on the third polishing table 156*c* using the polishing pad 155*c*. The second wafer may be polished on the third polishing table 156*c* using the first kind of slurry.

Next, at step 2245, the first wafer is transferred from the first wafer carrier 162a to the second wafer carrier 162b over the second polishing table 156b by the first wafer relay device 180x. This step comprises sub-steps of (1) transferring the load/unload cup 182x from its parking position X to the wafer load/unload position of the first wafer carrier 162a by its pivoting motion A, (2) unloading the first wafer from the first wafer carrier 162a to the load/unload cup 182x, (3) transferring the load/unload cup 182x to the wafer load/unload position of the second wafer carrier 162b over the second polishing table 156b by its pivoting motions A and B, (4) loading the first wafer onto the second wafer carrier 162b, and (5) transferring the load/unload cup 182x back to its parking position X. Next, at step 2255, the first wafer is polished on the second polishing table 156b using the polishing pad 155b. The first wafer may be polished on the second polishing table 156b using a second kind of slurry.

Next, at step 2265, the second wafer is transferred from the third wafer carrier 162c to the fourth wafer carrier 162d over the fourth polishing table 156d by the second wafer relay device 180y. This step comprises sub-steps of (1) transferring the load/unload cup 182y from its parking position Y to the wafer load/unload position of the third wafer carrier 162c by its pivoting motion C, (2) unloading the second wafer from the third wafer carrier 162c to the load/unload cup 182y, (3) transferring the load/unload cup 182y to the wafer load/unload position of the fourth wafer carrier 162d over the fourth polishing table 156d by its pivoting motions C and D, (4) loading the second wafer onto the fourth wafer carrier 162d, and (5) transferring the load/unload cup 182y back to its parking position Y. Next, at step 2275, the second wafer is polished on the fourth polishing table 156d using the polishing pad 155d. The second wafer may be polished on the fourth polishing table 156d using the second kind of slurry.

After the first and second wafers are polished on the second and fourth polishing tables 156b and 156d, respectively, the wafers are sequentially lifted from the respective polishing tables 156b and 156d, and then sequentially transferred from the wafer carriers 162b and 162d by the wafer relay devices 180x and 180y, respectively.

Even though sequential polishing process of the first and second wafers using the four wafer carriers 162a, 162b, 162c and 162d has been described, it is also possible to start polishing the wafers simultaneously after the wafer carriers 162a and 162c, or 162b and 162d are sequentially loaded with the wafers by the load/unload cup 182x and 182y.

Figure 15A:
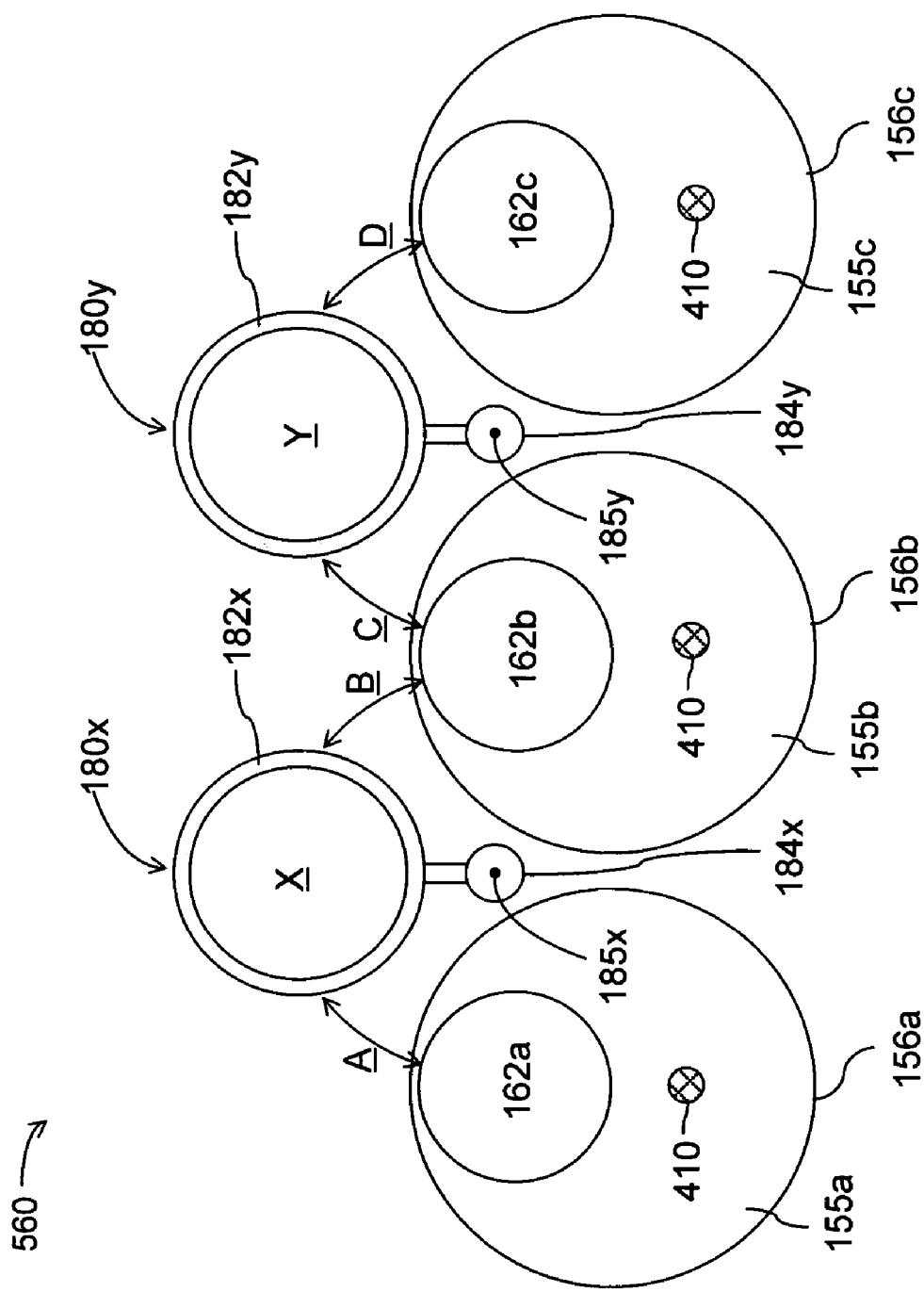
FIG. 15(a) is a top view of a polishing unit in accordance with a fourth alternative embodiment of the present invention.
Figure 15B:
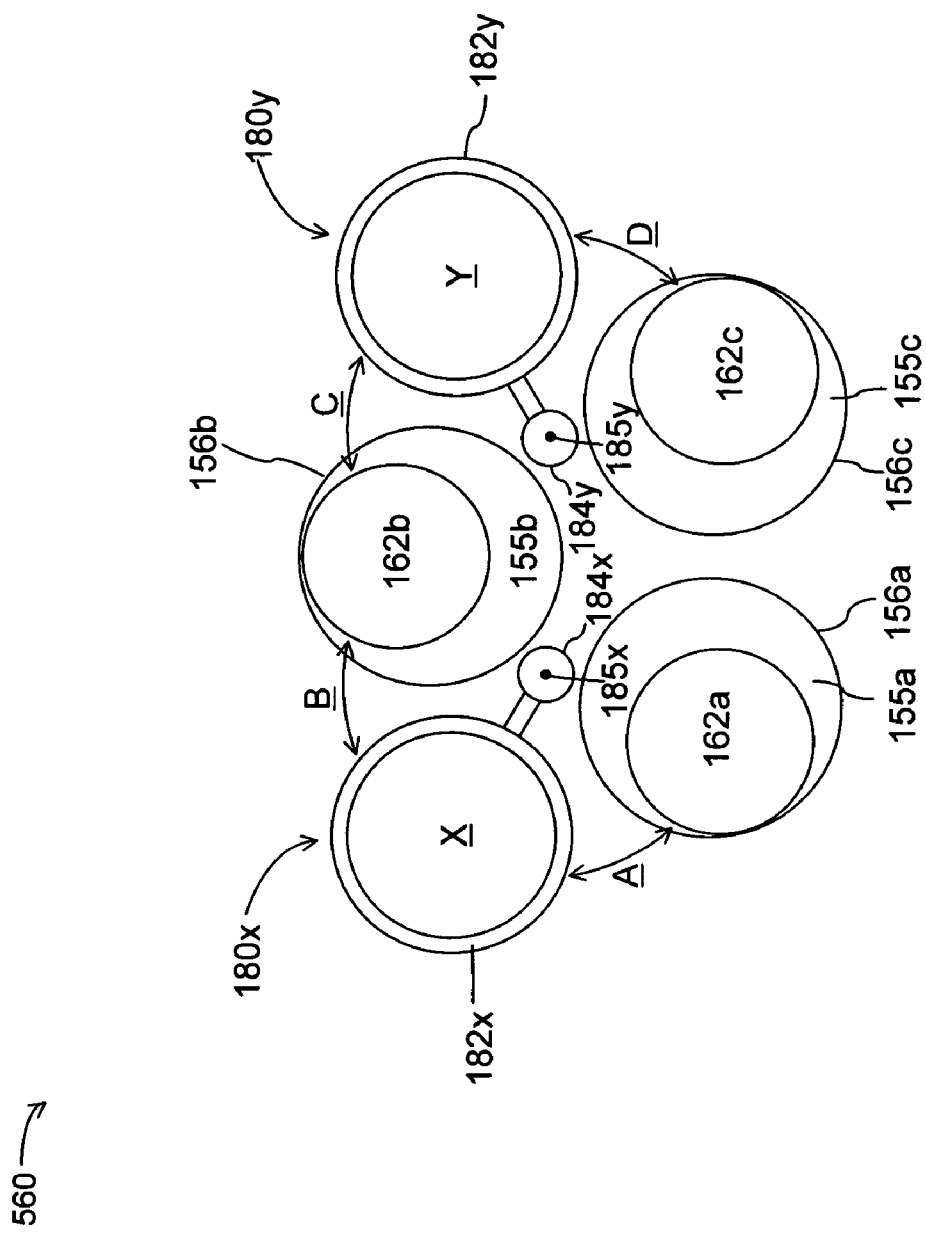
FIG. 15(b) is a top view of the polishing unit 15(a) in an alternative configuration.

With reference to FIG. 15(*a*), a polishing unit 560 according to a fourth alternative embodiment is described. The polishing unit 560 comprises three polishing tables 156a-156c with respective polishing pads 155a-155c, three wafer carriers 162a-162c, and two wafer relay devices 180x and 180y. The wafer carriers 162a, 162b and 162c are positioned over the polishing tables 156a, 156b and 156c, respectively, and polish wafers on the polishing tables 156a, 156b and 156c using polishing pads 155a, 155b and 155c, respectively.

The first wafer relay device 180x is positioned between the first and second wafer carriers 162a and 162b in such a manner that the load/unload cup 182x of the first wafer relay device 180x can be pivoted about the pivoting point 185x to the wafer load/unload positions of the first and second wafer carriers 162a and 162b by the pivoting motions A and B, respectively. The second wafer relay device 180y is positioned between the second and third wafer carriers 162b and 162c in such a manner that the load/unload cup 182y of the second wafer relay device 180y can be pivoted about the pivoting point 185y to the wafer load/unload positions of the second and third wafer carriers 162b and 162c by the pivoting motions C and D, respectively. The pivoting points 185x and 185y are located on pivoting axes that are perpendicular to the surface of the polishing pad 155.

In FIG. 15(*a*), the polishing pads 155a-155c are positioned in a linear configuration. That is, the polishing pads 155a-155c are positioned such that these polishing pads substantially define a straight line. However, the polishing pads 155a-155c may be positioned in a triangular configuration, as illustrated in FIG. 15(*b*).

Figure 16A:
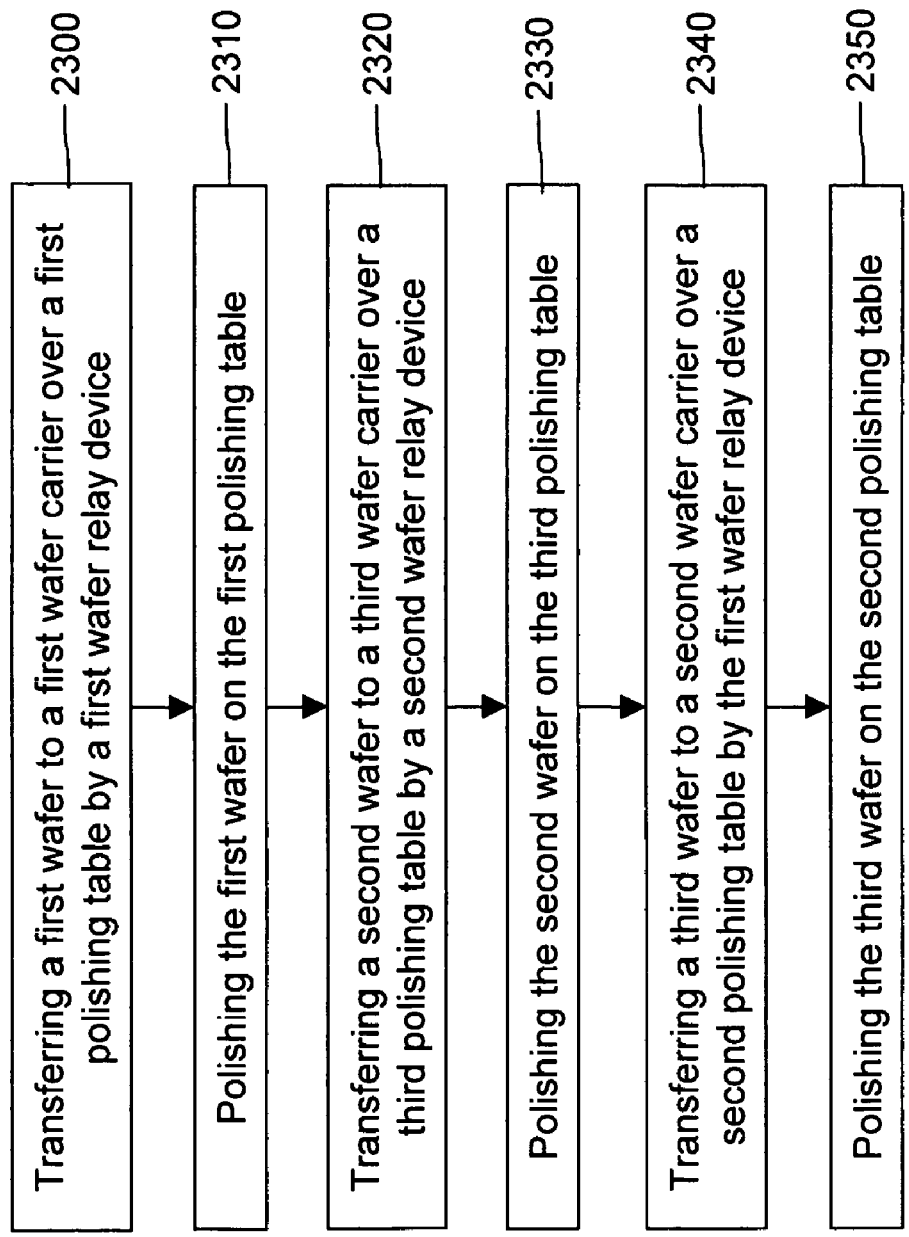
FIG. 16(a) is a process flow diagram for processing wafers in the polishing unit of FIGS. 15(a) and 15(b).
Figure 16B:
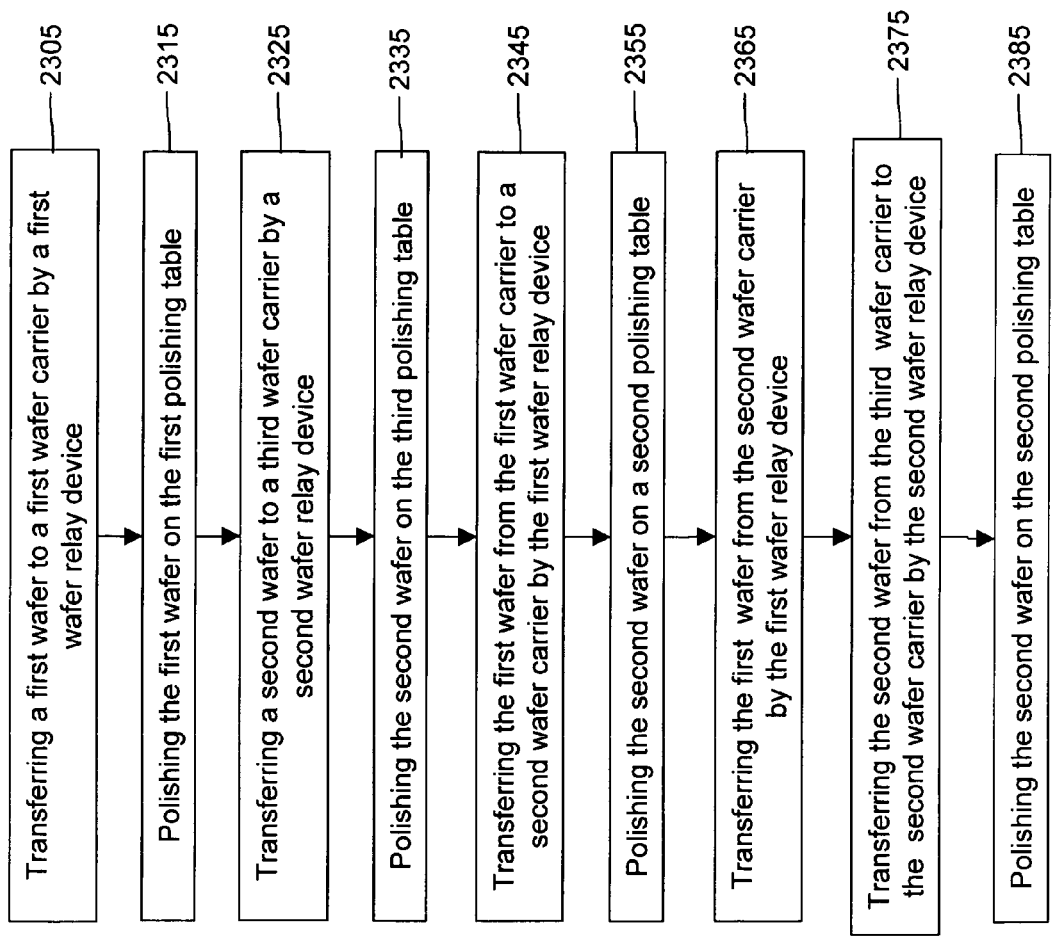
FIG. 16(b) is a process flow diagram for processing wafers in the polishing unit of FIGS. 15(a) and 15(b) in an alternative method.

With reference to FIG. 16(*a*), a method of processing semiconductor wafers in the polishing unit 560 is described. This method comprises the steps illustrated in FIG. 16(*a*). At step 2300, a first wafer is transferred to the first wafer carrier 162a over the first polishing table 156a by the first wafer relay device 180x. This step comprises sub-steps of (1) positioning the first wafer on the load/unload cup 182x at its parking position X, (2) transferring the load/unload cup 182x to the wafer load/unload position of the first wafer carrier 162a over the first polishing table 156a by its pivoting motion A, (3) loading the first wafer onto the first wafer carrier 162a, and (4) transferring the load/unload cup 182x back to its parking position X. Next, at step 2310, the first wafer is polished on the polishing table 156a using the polishing pad 155a.

Next, at step 2320, a second wafer is transferred to the third wafer carrier 162c over the third polishing table 156c by the second wafer relay device 180y. This step comprises sub-steps of (1) positioning the second wafer on the load/unload cup 182y at its parking position Y, (2) transferring the load/unload cup 182y to the wafer load/unload position of the third wafer carrier 162c over the third polishing table 156c by its pivoting motion D, (3) loading the second wafer onto the third wafer carrier 162c and (4) transferring the load/unload cup 182y back to its parking position Y. Next, at step 2330, the second wafer is polished on the third polishing table 156c using the polishing pad 155c.

Next, at step 2340, a third wafer is transferred to the second wafer carrier 162b over the second polishing table 156b by the first wafer relay device 180x. This step comprises sub-steps of (1) positioning the third wafer on the load/unload cup 182x at its parking position X, (2) transferring the load/unload cup 182x to the wafer load/unload position of the second wafer carrier 162b over the second polishing table 156b by its pivoting motion B, (3) loading the third wafer onto the second wafer carrier 162b, and (4) transferring the load/unload cup 182x back to its parking position X. Next, at step 2350, the third wafer is polished on the second polishing table 156b using the polishing pad 155b.

After the polishing processes of the wafers are completed, the wafers are sequentially lifted from the polishing table 156 and then sequentially transferred from the wafer carriers 162a, 162c and 162b by the wafer relay devices 180x and 180y.

Even though sequential polishing process of the wafers using the three wafer carriers 162 has been described, it is also possible to start polishing the wafers simultaneously after all the wafer carriers are sequentially loaded with the wafers by the load/unload cups 182x and 182y.

With reference to FIG. 16(*b*), an alternative method of processing wafers in the polishing unit 560 is described. This method comprises the steps illustrated in FIG. 16(*b*). At step 2305, a first wafer is transferred to the first wafer carrier 162a over the first polishing table 156a by the first wafer relay device 180x. Next, at step 2315, the first wafer is polished on the first polishing table 156*a* using the polishing pad 155*a*. The first wafer may be polished on the first polishing table 156*a* using a first kind of slurry.

Next, at step 2325, a second wafer is transferred to the third wafer carrier 162*c* over the third polishing table 156*c* by the second wafer relay device 180*y*. Next, at step 2335, the second wafer is polished on the third polishing table 156*c* using the polishing pad 155*c*. The second wafer may be polished on the third polishing table 156*c* using the first kind of slurry.

Next, at step 2345, the first wafer is transferred from the first wafer carrier 162*a* to the second wafer carrier 162*b* over the second polishing table 156*b* by the first wafer relay device 180*x*. This step comprises sub-steps of (1) transferring the load/unload cup 182*x* from its parking position X to the wafer load/unload position of the first wafer carrier 162*a* by its pivoting motion A, (2) unloading the first wafer from the first wafer carrier 162*a* to the load/unload cup 182*x*, (3) transferring the load/unload cup 182*x* to the wafer load/unload position of the second wafer carrier 162*b* over the second polishing table 156*b* by its pivoting motions A and B, (4) loading the first wafer onto the second wafer carrier 162*b*, and (5) transferring the load/unload cup 182*x* back to its parking position X. Next, at step 2355, the first wafer is polished on the second polishing table 156*b* using the polishing pad 155*b*. The first wafer may be polished on the second polishing table 156*b* using a second kind of slurry. After the first wafer is polished on the second polishing table 156*b*, the first wafer is transferred from the second wafer carrier 162*b* by the first wafer relay device 180*x*, at step 2365.

Next, at step 2375, the second wafer is transferred from the third wafer carrier 162*c* to the second wafer carrier 162*b* by the second wafer relay device 180*y*. This step comprises sub-steps of (1) transferring the load/unload cup 182*y* from its parking position Y to the wafer load/unload position of the third wafer carrier 162*c* by its pivoting motion C, (2) unloading the second wafer from the third wafer carrier 162*c* to the load/unload cup 182*y*, (3) transferring the load/unload cup 182*y* to the wafer load/unload position of the second wafer carrier 162*b* over the second polishing table 156*b* by its pivoting motions D and C respectively, (4) loading the second wafer onto the second wafer carrier 162*b*, and (5) transferring the load/unload cup 182*y* back to its parking position Y. Next, at step 2385, the second wafer is polished on the second polishing table 156*b* using the polishing pad 155*b*. The second wafer may be polished on the second polishing table 156*b* using the second kind of slurry.

After the second wafer is polished on the second polishing table 156*b*, the wafer is lifted from the polishing table 156*b*, and then transferred from the wafer carrier 162*b* by the second wafer relay device 180*y*.

With reference to FIG. 17, a polishing unit 580 according to a fifth alternative embodiment is described. The polishing unit 580 comprises two polishing tables 156*a* and 156*b* with respective polishing pads 155*a* and 155*b*, two wafer carriers 162*a* and 162*b*, and one wafer relay device 180. The wafer carriers 162*a* and 162*b* are positioned over the polishing tables 156*a* and 156*b*, respectively, and polish wafers on the polishing tables 156*a* and 156*b* using the polishing pads 155*a* and 155*b*, respectively.

The wafer relay device 180 is positioned between the first and second wafer carriers 162*a* and 162*b* in such a manner that the load/unload cup 182 of the wafer relay device 180 can be pivoted about the pivoting point 185 to the wafer load/unload positions of the first and second wafer carriers 162*a* and 162*b* by the pivoting motions A and B, respectively. The pivoting point 185 is located on a pivoting axis that is perpendicular to the surface of the polishing pad 155.

Figure 18A:
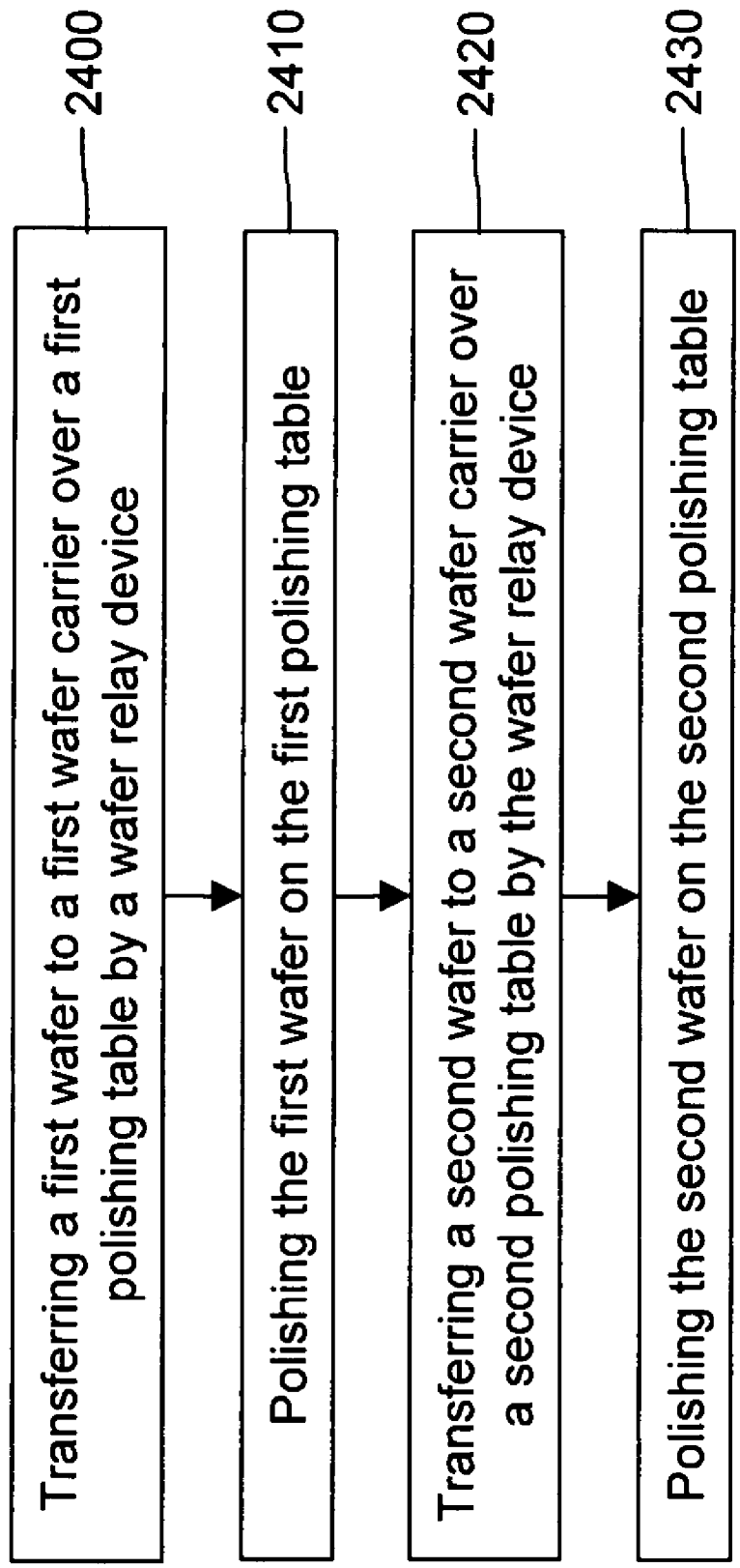
FIG. 18(a) is a process flow diagram for processing wafers in the polishing unit of FIG. 17.
Figure 18B:
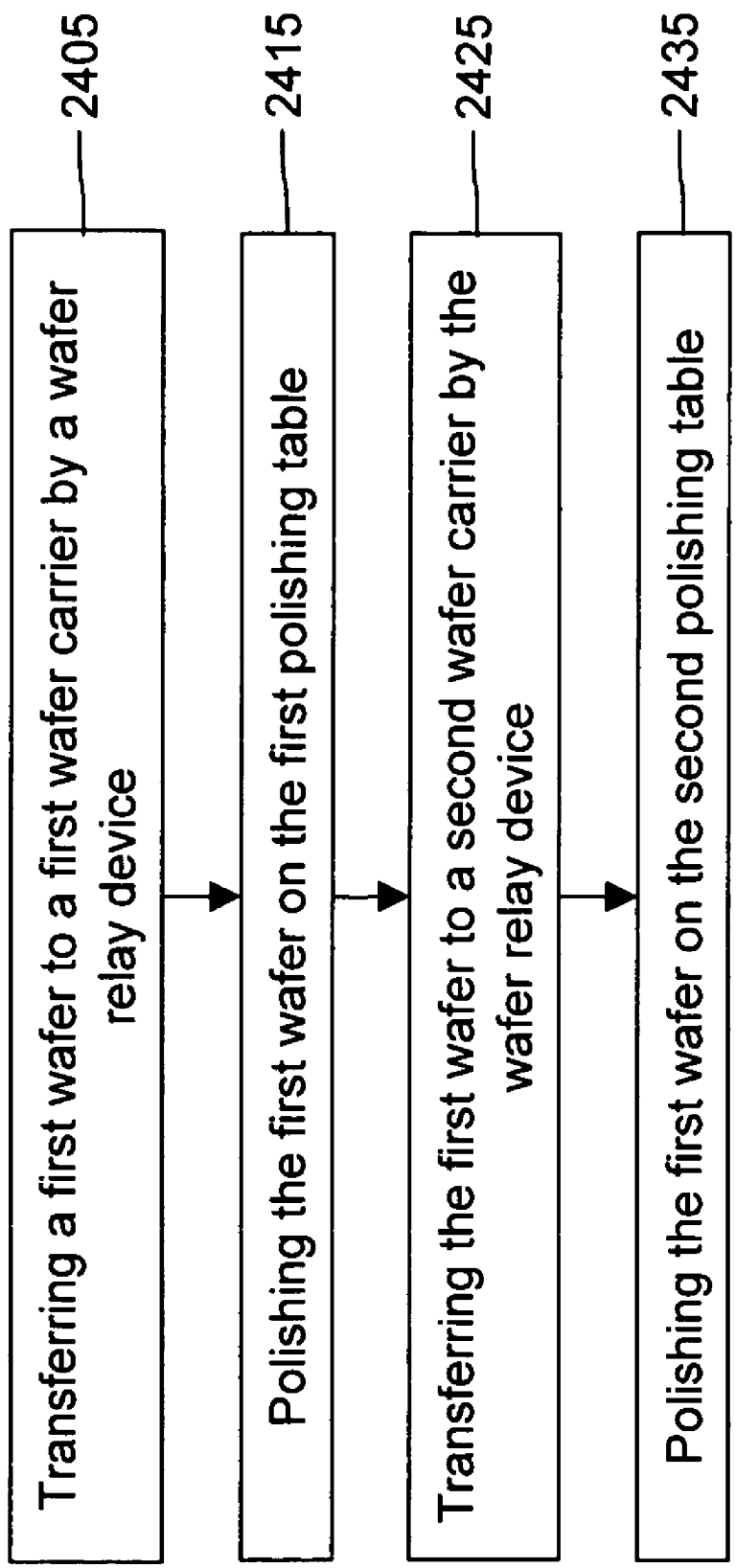
FIG. 18(b) is a process flow diagram for processing wafers in the polishing unit of FIG. 17 in an alternative method.
Figure 19:
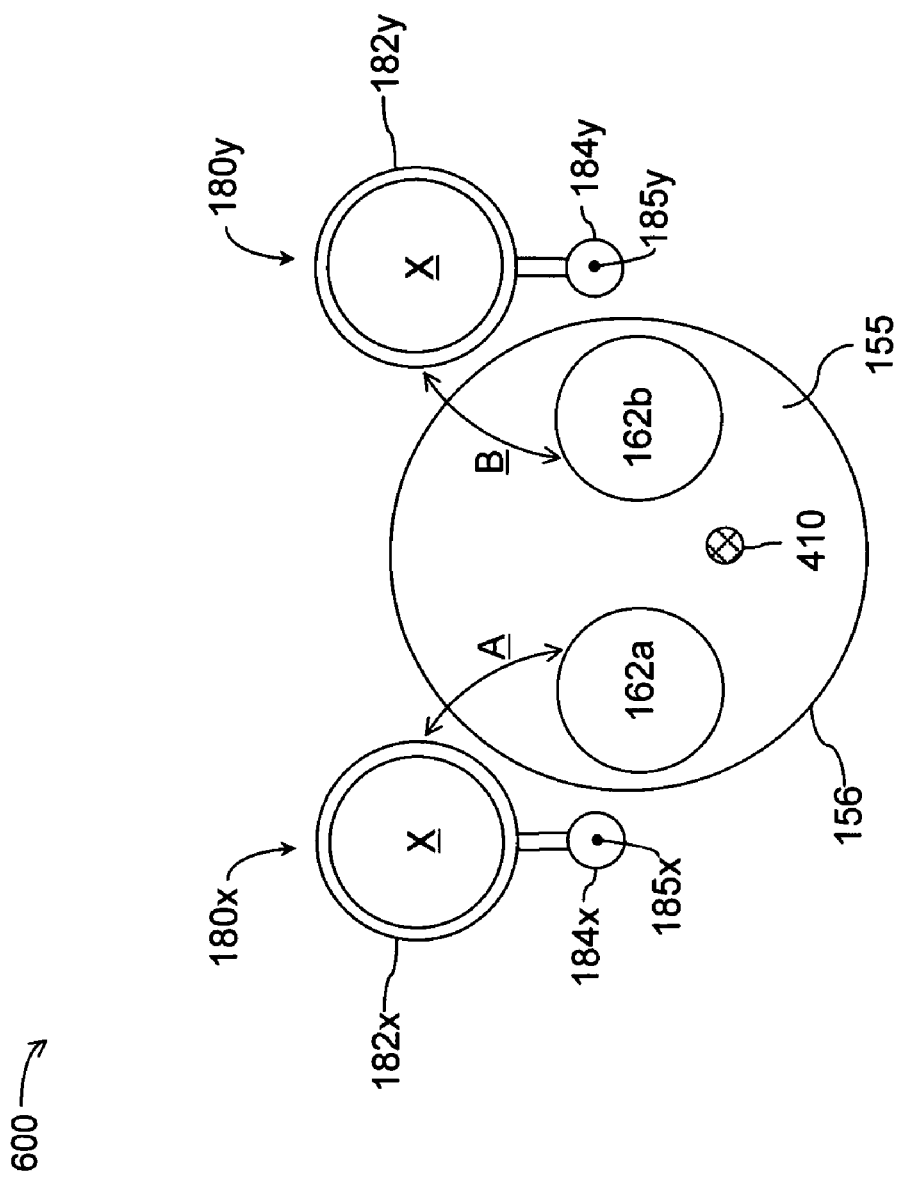
FIG. 19(a) is a top view of a polishing unit in accordance with a sixth alternative embodiment of the present invention.
FIG. 19(b) is a top view of the polishing unit of FIG. 19(a) in which pivoting points of load-and-unload cups are not over the polishing pad surface.

With reference to FIG. 18(*a*), a method of processing semiconductor wafers in the polishing unit 580 is described. This method comprises the steps illustrated in FIG. 18(*a*). At step 2400, a first wafer is transferred to the first wafer carrier 162*a* over the first polishing table 156*a* by the wafer relay device 180. This step comprises sub-steps of (1) positioning the first wafer on the load/unload cup 182 at its parking position X, (2) transferring the load/unload cup 182 to the wafer load/unload position of the first wafer carrier 162*a* over the first polishing table 156*a* by its pivoting motion A, (3) loading the first wafer onto the first wafer carrier 162*a* and (4) transferring the load/unload cup 182 back to its parking position X. Next, at step 2410, the first wafer is polished on the first polishing table 156*a* using the polishing pad 155*a*.

Next, at step 2420, a second wafer is transferred to the second wafer carrier 162*b* over the second polishing table 156*b* by the wafer relay device 180. This step comprises sub-steps of (1) positioning the second wafer on the load/unload cup 182 at its parking position X (2) transferring the load/unload cup 182 to the wafer load/unload position of the second wafer carrier 162*b* over the second polishing table 156*b* by its pivoting motion B, (3) loading the second wafer to the second wafer carrier 162*b*, and (4) transferring the load/unload cup 182 back to its parking position X. Next, at step 2430, the second wafer is polished on the second polishing table 156*b* using the polishing pad 155*b*.

After the polishing processes of the wafers are completed, the wafers are sequentially lifted from the polishing table 156*a* and 156*b*, and then sequentially transferred from the wafer carriers 162*a* and 162*b* by the wafer relay device 180.

Even though sequential polishing process of the wafers using the two wafer carriers 162 has been described, it is also possible to start polishing the wafers simultaneously after all the wafer carriers are sequentially loaded with the wafers by the load/unload cup 182.

With reference to FIG. 18(*b*), an alternative method of processing wafers in the polishing unit 580 is described. This method comprises the steps illustrated in FIG. 18(*b*). At step 2405, a first wafer is transferred to the first wafer carrier 162*a* over the first polishing table 156*a* by the wafer relay device 180. Next, at step 2415, the first wafer is polished on the first polishing table 156*a* using the polishing pad 155*a*. The first wafer may be polished on the first polishing table 156*a* using a first kind of slurry.

Next, at step 2425, the first wafer is transferred from the first wafer carrier 162*a* to the second wafer carrier 162*b* over the second polishing table 156*b* by the wafer relay device 180. This step comprises sub-steps of (1) transferring the load/unload cup 182 from its parking position X to the wafer load/unload position of the first wafer carrier 162*a* by its pivoting motion A, (2) unloading the first wafer from the first wafer carrier 162*a* to the load/unload cup 182, (3) transferring the load/unload cup 182 to the wafer load/unload position of the second wafer carrier 162*b* over the second polishing table 156*b* by its pivoting motions A and B, (4) loading the first wafer onto the second wafer carrier 162*b*, and (5) transferring the load/unload cup 182 back to its parking position X. Next, at step 2435, the first wafer is polished on the second polishing table 156*b* using the polishing pad 155*b*. The first wafer may be polished on the second polishing table 156*b* using a second kind of slurry.

After the first wafer is polished on the second polishing table 156b, the wafer is lifted from the polishing table 156b, and then transferred from the wafer carrier 162b by the wafer relay device 180.

With reference to FIG. 19(a), a polishing unit 600 according to a sixth alternative embodiment is described. The polishing unit 600 comprises one polishing table 156 with a polishing pad 155, two wafer carriers 162a and 162b, and two wafer relay devices 180x and 180y. The wafer carriers 162a and 162b are positioned over the same polishing table 156 and polish wafers on the same polishing table 156 using the polishing pad 155. The first and second load/unload cups 182x and 182y are positioned to transfer wafers to and from the first and second wafer carriers 162a and 162b, respectively. The first and second load/unload cups 182x and 182y can be pivoted about the pivoting points 185x and 185y, respectively, which are located over the surface the polishing pad 155, to the wafer load/unload positions of the first and second wafer carriers 162a and 162b by the pivoting motions A and B, respectively. The pivoting points 185x and 185y are located on pivoting axes that perpendicularly intersect the surface of the polishing pad 155.

In FIG. 19(b), an alternative embodiment of the polishing unit 600 of FIG. 19(a) is shown. The polishing unit 600 of FIG. 19(b) differs from the polishing unit of FIG. 19(a) in that the pivoting points 185x and 185y of the first and second load/unload cups 182x and 182y are not over the surface of the polishing pad 155. However, the polishing unit 600 of FIG. 19(b) operates in the same manner as the polishing unit 600 of FIG. 19(a).

Figure 20:
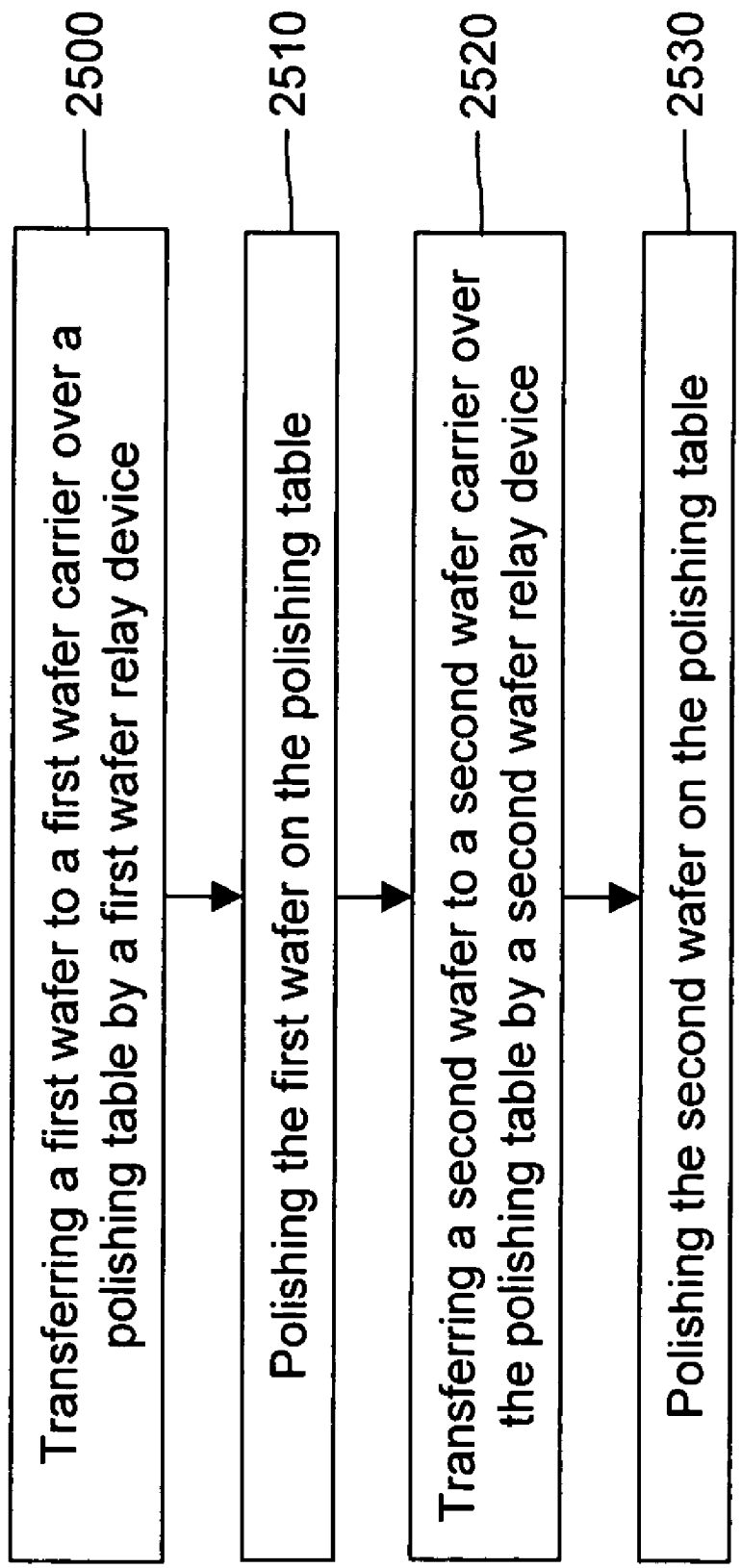
FIG. 20 is a process flow diagram for processing wafers in the polishing unit of FIGS. 19(a) and 19(b).

With reference to FIG. 20, a method of processing semiconductor wafers in the polishing unit 600 is described. This method comprises the steps illustrated in FIG. 20. At step 2500, a first wafer is transferred to the first wafer carrier 162a over the polishing table 156 by the wafer relay device 180x. This step comprises sub-steps of (1) positioning the first wafer on the load/unload cup 182x at its parking position X, (2) transferring the load/unload cup 182x to the wafer load/unload position of the first wafer carrier 162a over the polishing table 156 by its pivoting motion A, (3) loading the first wafer onto the first wafer carrier 162a, and (4) transferring the load/unload cup 182x back to its parking position X. Next, at step 2510, the first wafer is polished on the polishing table 156 using the polishing pad 155.

Next, at step 2520, a second wafer is transferred to the second wafer carrier 162b over the polishing table 156 by the second wafer relay device 180y. This step comprises sub-steps of (1) positioning the second wafer on the load/unload cup 182y at its parking position Y, (2) transferring the load/unload cup 182y to a wafer load/unload position of the second wafer carrier 162b over the polishing table 156 by its pivoting motion B, (3) loading the second wafer onto the second wafer carrier 162b, and (4) transferring the load/unload cup 182y back to its parking position Y. Next, at step 2530, the second wafer is polished on the polishing table 156 using the polishing pad 155.

After the polishing processes of the wafers are completed, the wafers are sequentially lifted from the polishing table 156, and then sequentially transferred from the wafer carriers 162a and 162b by the wafer relay devices 180x and 180y, respectively.

Even though sequential polishing process of the wafers using the two wafer carriers 162a and 162b has been described, it is also possible to start polishing the wafers simultaneously after all the wafer carriers are sequentially or simultaneously loaded with the wafers by the load/unload cups 182x and 182y.

Figure 21:
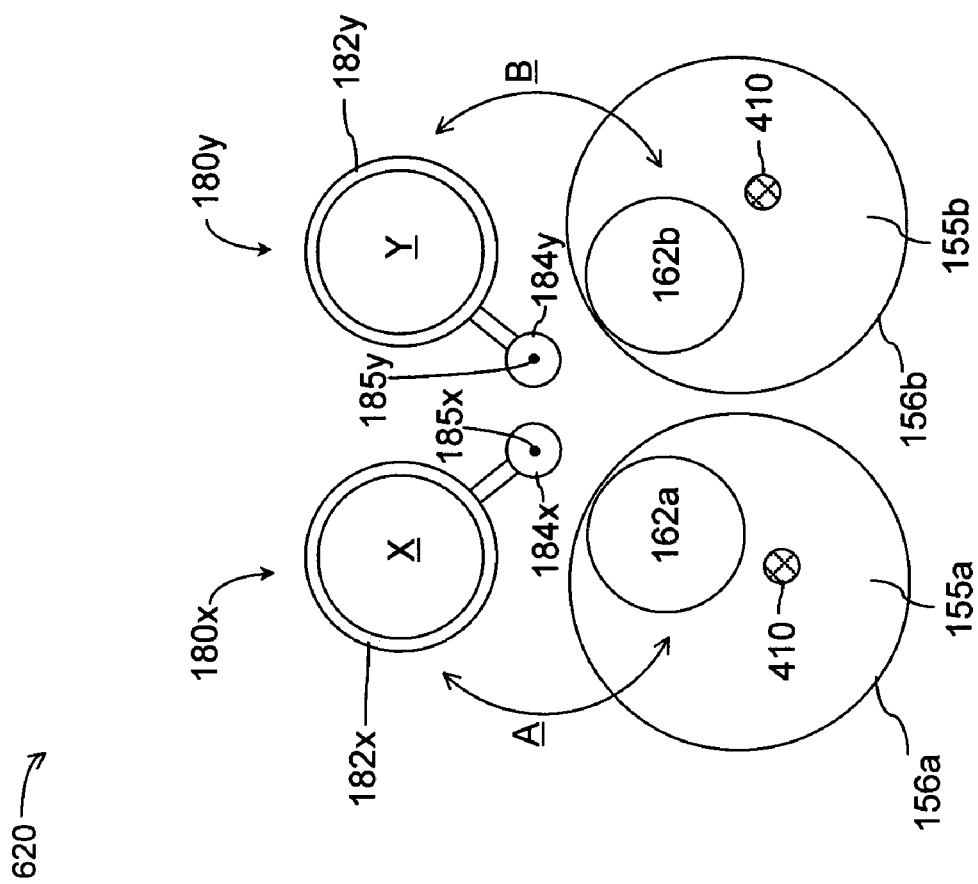
FIG. 21 is a top view of a polishing unit in accordance with a seventh alternative embodiment of the present invention.

With reference to FIG. 21, a polishing unit 620 according to a seventh alternative embodiment is described. The polishing unit 620 comprises two polishing tables 156a and 156b with respective polishing pads 155a and 155b, two wafer carriers 162a and 162b, and two wafer relay devices 180x and, 180y. The wafer carriers 162a and 162b are positioned over the polishing tables 156a and 156b, respectively, and polish wafers on the polishing tables 156a arid 156b using the polishing pads 155a and 155b, respectively. The first and second load/unload cups 182x and 182y transfer wafers to and from the first and second wafer carriers 162a and 162b, respectively. The first and second load/unload cups 182x and 182y can be pivoted about the pivoting points 185x and 185y, respectively, to the wafer load/unload positions of the first and second wafer carriers 162a and 162b by the pivoting motions A and B, respectively. The pivoting points 155x and 185y are located on pivoting axes that are perpendicular to the surface of the polishing pad 155.

Figure 22:
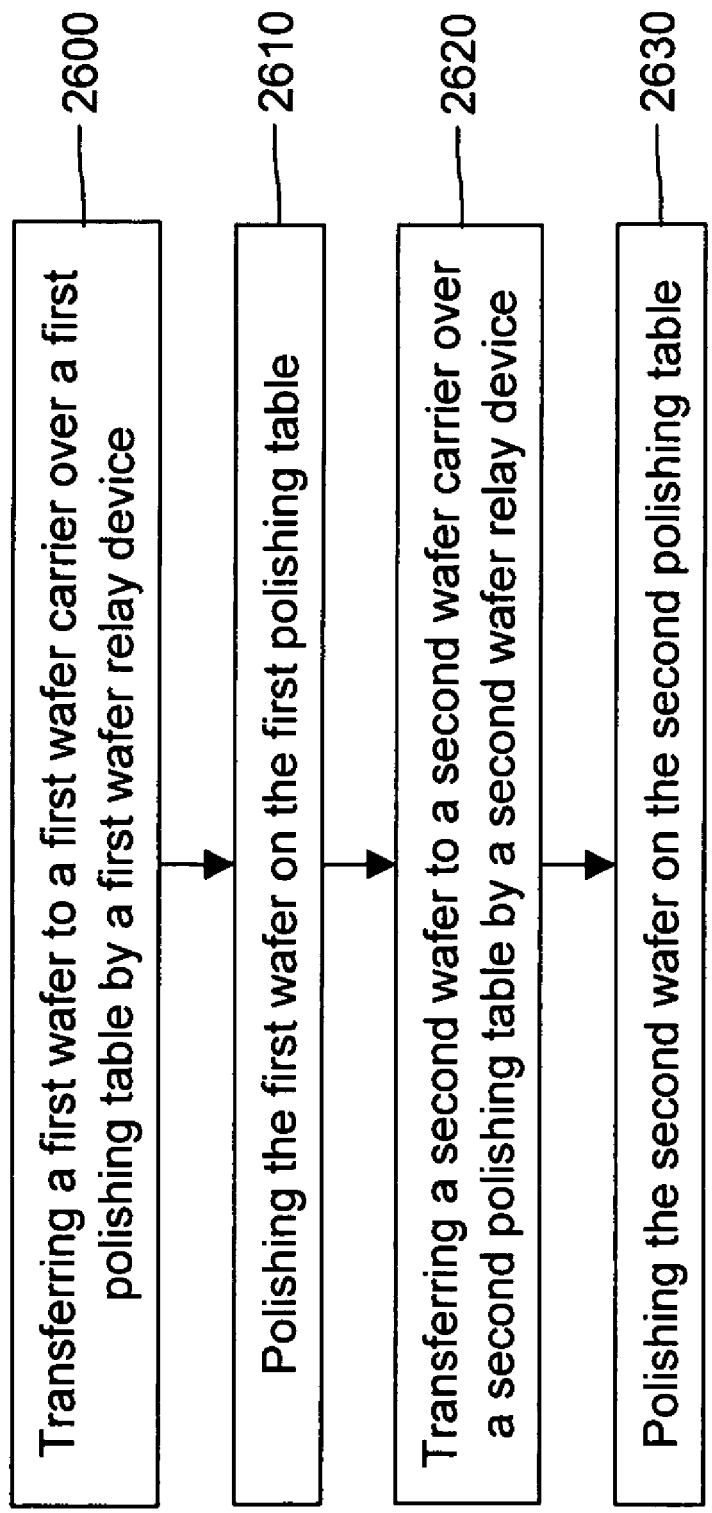
FIG. 22 is a process flow diagram for processing wafers in the polishing unit of FIG. 21.

With reference to FIG. 22, a method of processing semiconductor wafers in the polishing unit 620 is described. This method comprises the steps illustrated in FIG. 22. At step 2600, a first wafer is transferred to the first wafer carrier 162a over the first polishing table 156a by the first wafer relay device 180x. This step comprises sub-steps of (1) positioning the first wafer on the load/unload cup 182x at its parking position X, (2) transferring the load/unload cup 182x to the wafer load/unload position of the first wafer carrier 162a over the first polishing table 156a by its pivoting motion A, (3) loading the first wafer onto the first wafer carrier 162a, and (4) transferring the load/unload cup 182x back to its parking position X. Next, at step 2610, the first wafer is polished on the first polishing table 156a using the polishing pad 155a.

Next, at step 2620, a second wafer is transferred to the second wafer carrier 162b over the second polishing table 156b by the second wafer relay device 180y. This step comprises sub-steps of (1) positioning the second wafer on the load/unload cup 182y at its parking position Y, (2) transferring the load/unload cup 182y to the wafer load/unload position of the second wafer carrier 162b over the second polishing table 156b by its pivoting motion B, (3) loading the second wafer onto the second wafer carrier 162b, and (4) transferring the load/unload cup 182y back to its parking position Y. Next, at step 2630, the second wafer is polished on the second polishing table 156b using the polishing pad 155b.

After the polishing processes of the wafers are completed, the wafers are sequentially lifted from the polishing tables 156a and 156b, and then sequentially transferred from the wafer carriers 162a and 162b by the wafer relay devices 180x and 180y, respectively.

Even though sequential polishing process of the wafers using the two wafer carriers 162 has been described, it is also possible to start polishing the wafers simultaneously after all the wafer carriers are sequentially or simultaneously loaded with the wafers by the load/unload cups 182x and 182y.

Figure 23:
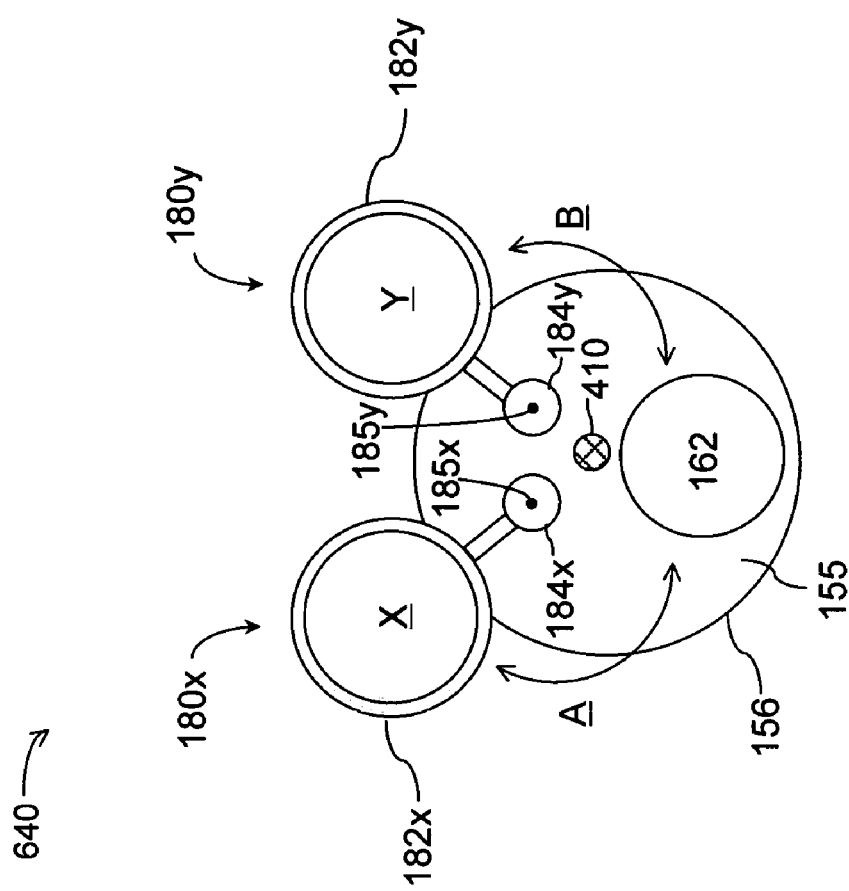
FIG. 23 is a top view of a polishing unit in accordance with an eighth alternative embodiment of the present invention.

With reference to FIG. 23, a polishing unit 640 according to an eighth alternative embodiment is described. The polishing unit 640 comprises one polishing table 156 with a polishing pad 155, one wafer carrier 162 and two wafer relay devices 180x and 180y. The first and second load/unload cups 182x and 182y transfer wafers to and from the wafer carrier 162 in an alternating manner. The first and second load/unload cups 182x and 182y can be pivoted about the pivoting points 185x and 185y, respectively to the wafer load/unload position of the wafer carrier 162 by the pivoting motions A and B, respectively. The pivoting points 185*x* and 185*y* are located on pivoting axes that perpendicularly intersect the surface of the polishing pad 155.

Figure 24:
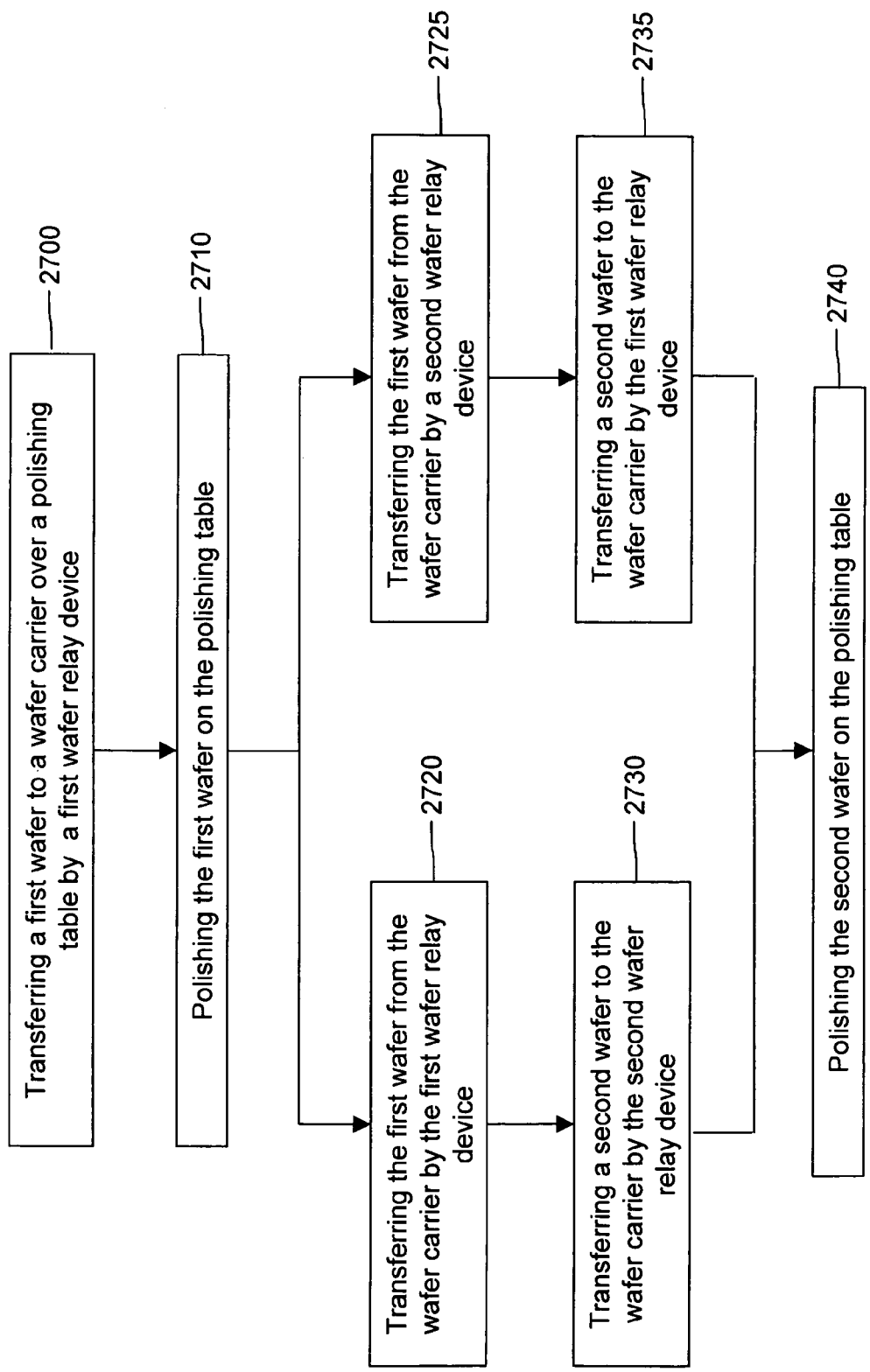
FIG. 24 is a process flow diagram for processing wafers in the polishing unit of FIG. 23.

With reference to FIG. 24, a method of processing semiconductor wafers in the polishing unit 640 is described. This method comprises the steps illustrated in FIG. 24. At step 2700, a first wafer is transferred to the wafer carrier 162 over the polishing table 156 by the wafer relay device 180*x*. This step comprises sub-steps of (1) positioning the first wafer on the load/unload cup 182*x* at its parking position X, (2) transferring the load/unload cup 182*x* to the wafer load/unload position of the wafer carrier 162 over the polishing table 156 by its pivoting motion A, (3) loading the first wafer onto the wafer carrier 162, and (4) transferring the load/unload cup 182*x* back to its parking position X. Next, at step 2710, the first wafer is polished on the polishing table 156 using the polishing pad 155.

Next, at step 2720, after the polishing process of the first wafer is completed, the wafer carrier 162 is lifted from the polishing table 156 and then the first wafer is removed from the wafer carrier 162 by the load/unload cup 182*x* of the first wafer relay device 180*x*. Next, at step 2730, a second wafer is transferred to the wafer carrier 162 by the load/unload cup 182*y* of the second wafer relay device 180*y* by its pivoting motion B. This step comprises sub-steps of (1) positioning the second wafer on the load/unload cup 182*y* at its parking position Y, (2) transferring the load/unload cup 182*y* to the wafer load/unload position of the wafer carrier 162 over the polishing table 156 by its pivoting motion B, (3) loading the second wafer onto the wafer carrier 162, and (4) transferring the load/unload cup 182*y* back to its parking position Y. Next, at step 2740, the second wafer is polished on the polishing table 156 using the polishing pad 155.

In a modified embodiment, steps 2720 and 2730 are replaced with steps 2725 and 2735. In this embodiment, at step 2725, after the polishing process of the first wafer is completed, the wafer carrier 162 is lifted from the polishing table 156 and then the first wafer is removed from the wafer carrier 162 by the load/unload cup 182*y* of the second wafer relay device 180*y*.

Next, at step 2735, a second wafer is transferred to the wafer carrier 162 by the load/unload cup 182*x* of the first wafer relay device 180*x*. This step comprises sub-steps of (1) positioning the second wafer on the load/unload cup 182*x* at its parking position X, (2) transferring the load/unload cup 182*x* to the wafer load/unload position of the wafer carrier 162 over the polishing table 156 by its pivoting motion A, (3) loading the second wafer onto the wafer carrier 162, and (4) transferring the load/unload cup 182*x* back to its parking position X. The second wafer is then polished on the polishing table 156 using the polishing pad 155, at step 2740.

With reference to FIGS. 25(*a*) and (*b*), a polishing unit 660 according to a ninth alternative embodiment is described. FIGS. 25(*a*) and (*b*) are top and perspective views of the polishing unit 660, respectively. The polishing unit 660 comprises one polishing table 156 with a polishing pad 155, one wafer carrier 162 and one wafer relay device 180. The load/unload cup 182 transfers wafers to and from the wafer carrier 162. The load/unload cup 182 can be pivoted about the pivoting point 185 to the wafer load/unload position of the wafer carrier 162 by the pivoting motion A. The pivoting point 185 is located on a pivoting axis that perpendicularly intersects the surface of the polishing pad 155. The pivoting motion A is further illustrated with phantom lines in FIG. 25(*b*). The wafer relay device 180 is designed and installed in the polishing unit 660 such that the pivoting shaft 184 of the wafer relay device 180 and preferably the parking position X of the load/unload cup 182 are located over the polishing table 156. By this configuration, the range of the pivoting motion A of the load/unload cup 182 between the parking position X and the wafer load/unload position of the wafer carrier 162 is decreased, and therefore, footprint of the polishing unit 660 can be minimized. To further decrease the range of the pivoting motion A, the load/unload cup 182 can be connected directly to the pivoting shaft 184 without the pivoting arm 183.

Figure 26:
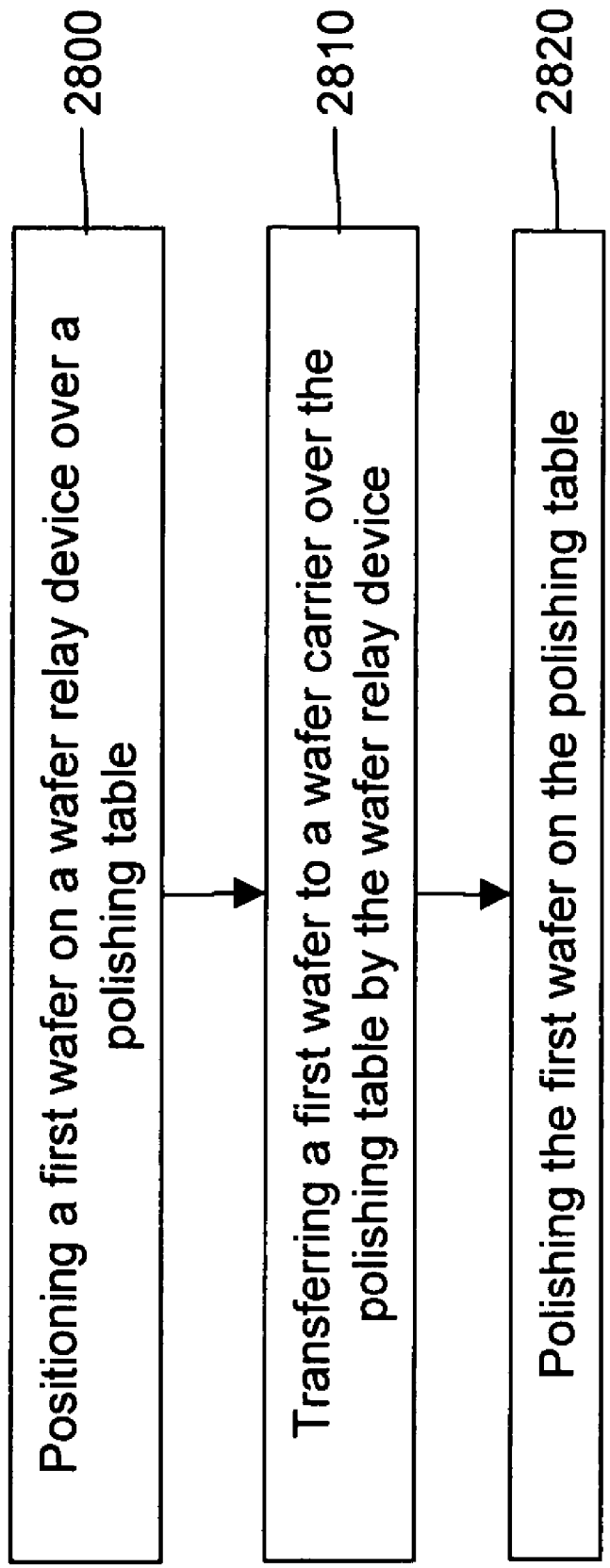
FIG. 26 is a process flow diagram for processing wafers in the polishing unit of FIGS. 25(a) and 25(b).

With reference to FIG. 26, a method of processing semiconductor wafers in the polishing unit 660 is described. This method comprises the steps illustrated in FIG. 26. At step 2800, a first wafer is positioned on the load/unload cup 182 of the wafer relay device 180 at its parking position X that is preferably located over the polishing table 156.

Next, at step 2810, the first wafer is transferred to the wafer carrier 162 at its wafer load/unload position over the polishing table 156 by the pivoting motion A of the load/unload cup 182. Next, at step 2820, the first wafer is polished on the polishing table 156 using the polishing pad 155.

After the polishing process of the first wafer is completed, the wafer is lifted from the polishing table 156, and then transferred from the wafer carrier 162 by the wafer relay devices 180.

Figure 27B:
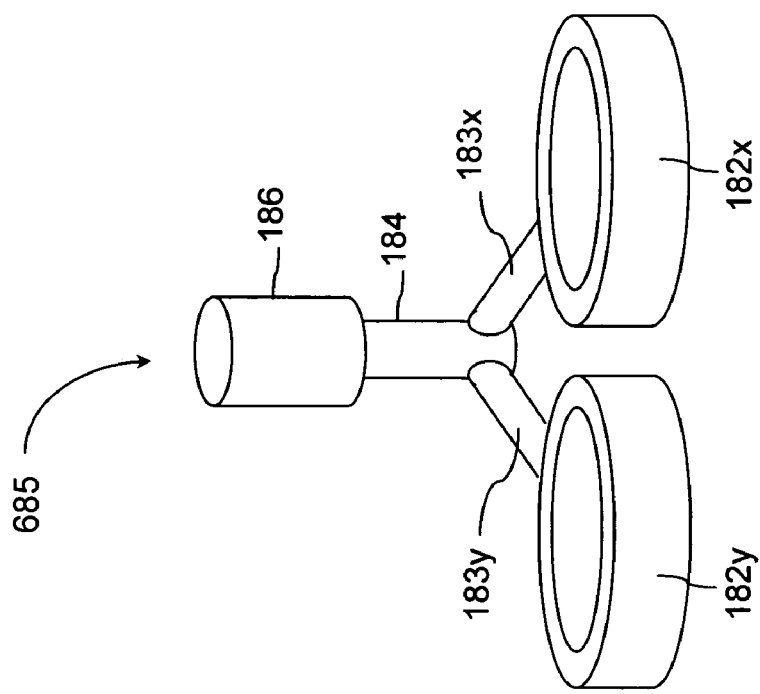
FIG. 27(b) is a perspective view of the dual cup wafer relay device of the polishing unit of FIG. 27(a).
Figure 27A:
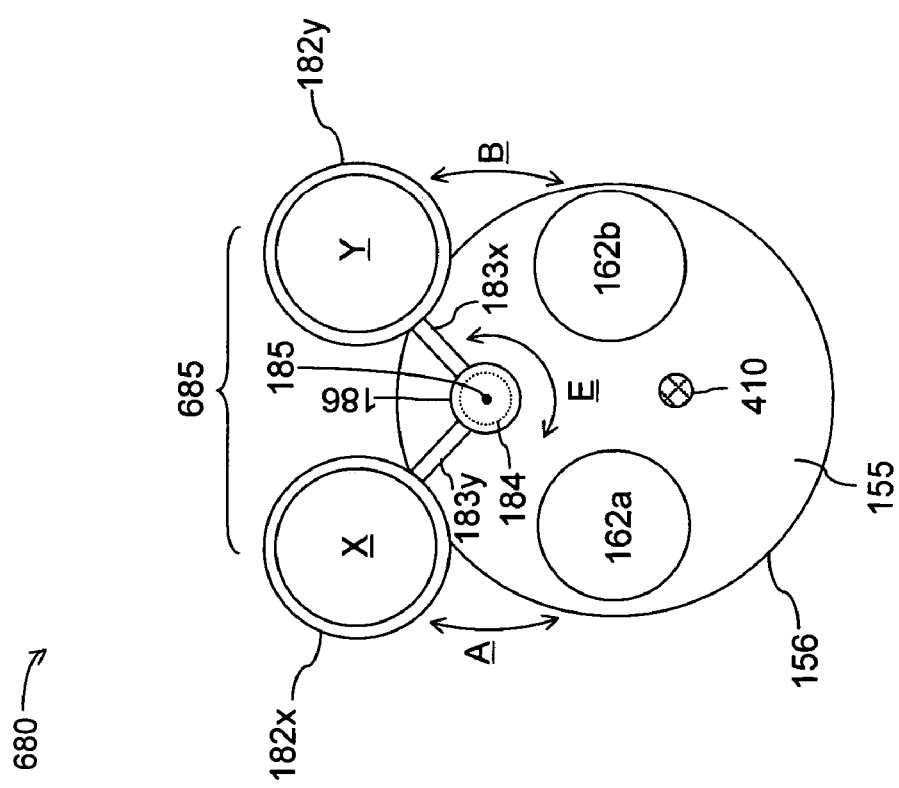
FIG. 27(a) is a top view of a polishing unit in accordance with a tenth alternative embodiment of the present invention.

With reference to FIGS. 27(*a*) and (*b*), a polishing unit 680 according to a tenth alternative embodiment is described. FIG. 27(*a*) is a top view of the polishing unit 680. FIG. 27(*b*) is a perspective view of a dual cup wafer relay device 685 of the polishing unit 680. The polishing unit 680 comprises one polishing table 156 with a polishing pad, two wafer carriers 162*a* and 162*b*, and the dual cup wafer relay device 685.

The dual cup wafer relay device 685 comprises two load/unload cups 182*x* and 182*y*, which are connected to a pivoting shaft 184 through respective pivoting arms 183*x* and 183*y*. The pivoting shaft 184 is controlled by a pivoting-and-vertical drive mechanism 186. The first and second load/unload cups 182*x* and 182*y* can be pivoted about the pivoting point 185, which is located over the surface of the polishing pad 155, to the wafer load/unload positions of the wafer carriers 162*b* and 162*a*, respectively, by the pivoting motion E. Therefore, the dual cup wafer relay device 685 can transfer two wafers at a time to or from the first and second wafer carriers 162*a* and 162*b*. The pivoting point 185 is located on a pivoting axis that perpendicularly intersects the surface of the polishing pad 155. In a modified embodiment, the first load/unload cup 182*x* can transfer wafers to and from the first wafer carrier 162*a* by the pivoting motion A and the second load/unload cup 182*y* can transfer wafers to and from the second wafer carrier 162*b* by the pivoting motion B.

With reference to FIGS. 28(*a*) and (*b*), methods of processing semiconductor wafers in an alternating manner and in a simultaneous manner in the polishing unit 680 are described, respectively.

The alternating manner comprises the steps illustrated in FIG. 28(*a*). At step 2900, a first wafer is transferred to the first wafer carrier 162*a* over the polishing table 156 by the first load/unload cup 182*x* of the dual cup wafer relay device 685. This step comprises sub-steps of (1) positioning the first wafer on the first load/unload cup 182*x* at its parking position X, (2) transferring the load/unload cup 182*x* to the wafer load/unload position of the first wafer carrier 162*a* over the polishing table 156 by its pivoting motion A, (3) loading the first wafer onto the first wafer carrier 162*a*, and (4) transferring the load/unload cup 182*x* back to its parking position X. Next, at step 2910, the first wafer is polished on the polishing table 156 using the polishing pad 155.

Next, at step 2920, a second wafer is transferred to the second wafer carrier 162b over the polishing table 156 by the second load/unload cup 182y of the dual cup wafer relay device 685. This step comprises sub-steps of (1) positioning the second wafer on the second load/unload cup 182y at its parking position Y, (2) transferring the second load/unload cup 182y to the wafer load/unload position of the second wafer carrier 162b over the polishing table 156 by its pivoting motion B, (3) loading the second wafer onto the second wafer carrier 162b, and (4) transferring the second load/unload cup 182y back to its parking position Y. Next, at step 2930, the second wafer is polished on the polishing table 156 using the polishing pad 155.

After the polishing processes of the wafers are completed, the wafers are sequentially lifted from the polishing table 156, and then sequentially transferred from the wafer carriers 162a and 162b by the load/unload cups 182x and 182y of the dual cup wafer relay device 685, respectively.

Figure 28A:
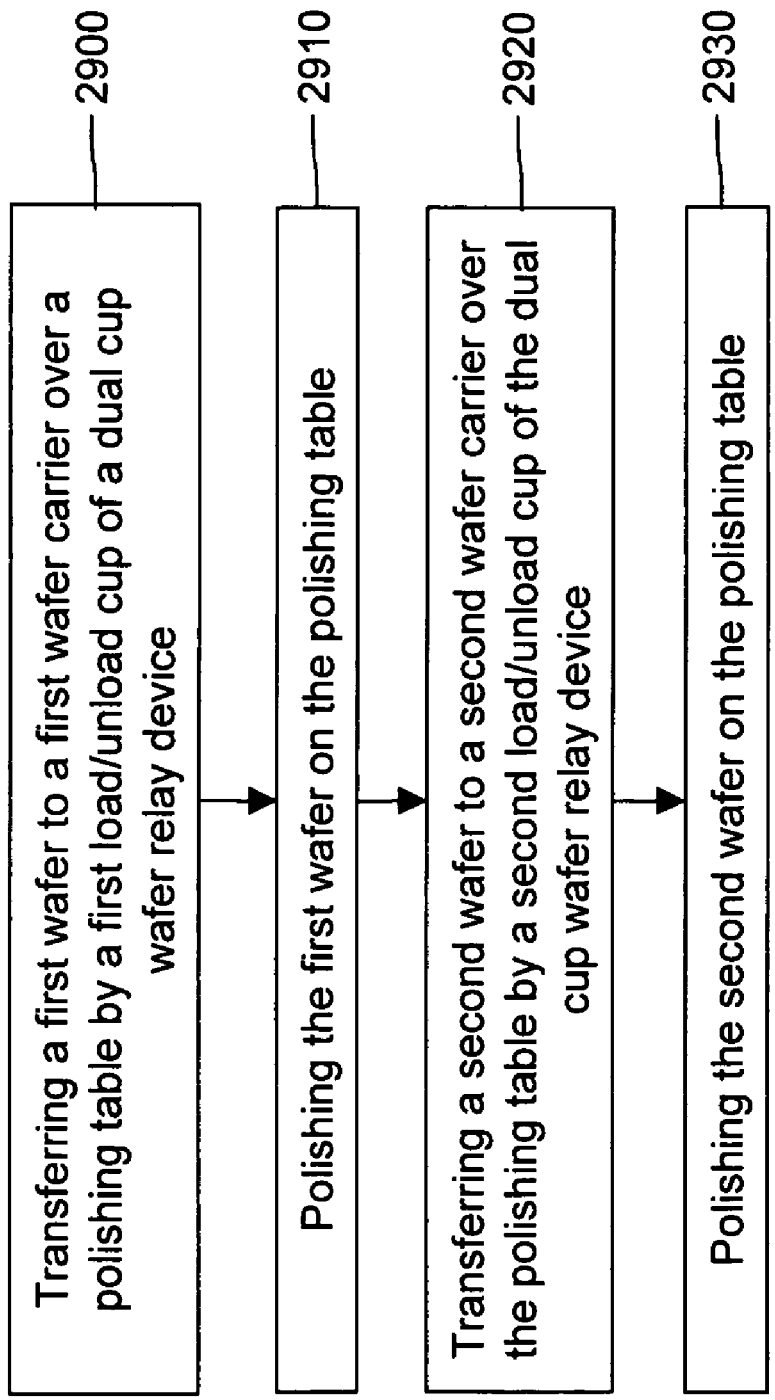
FIG. 28(a) is a process flow diagram for processing wafers in the polishing unit of FIG. 27(a) in an alternating manner.
Figure 28B:
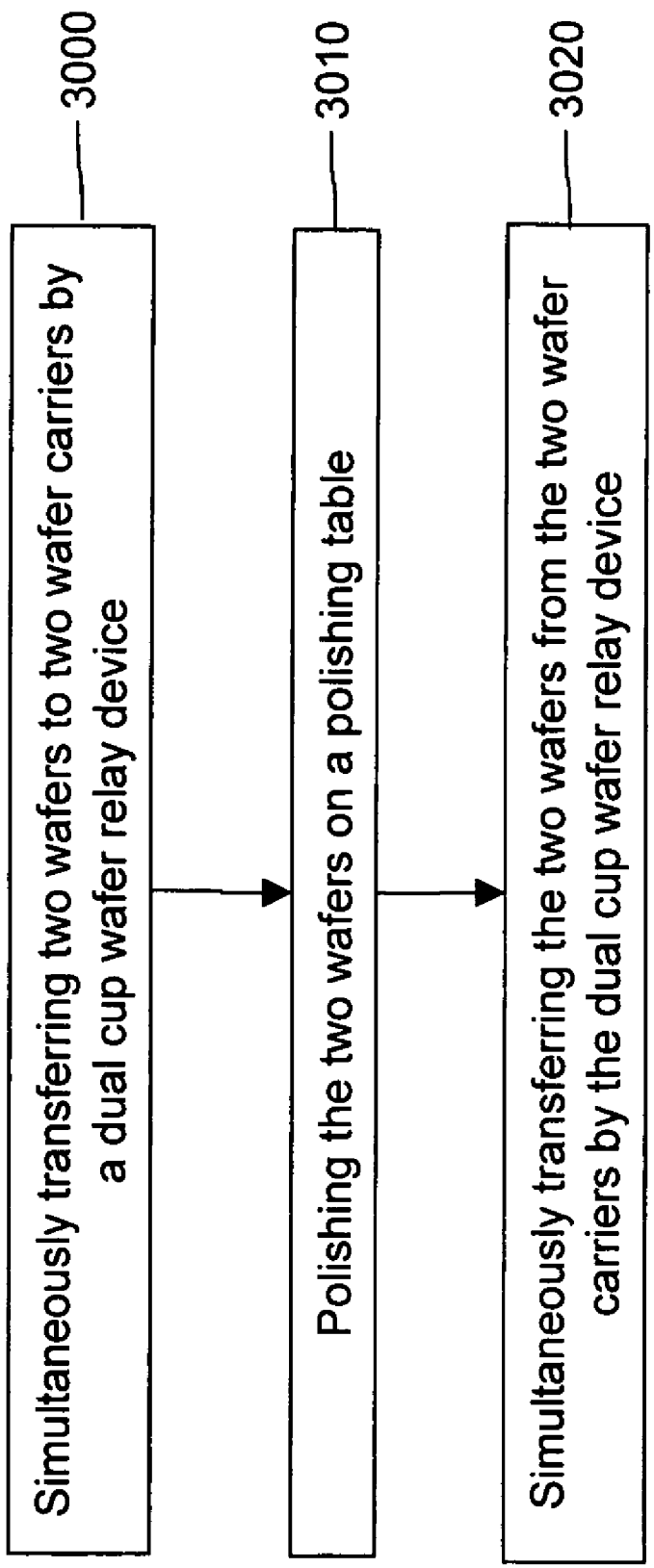
FIG. 28(b) is a process flow diagram for processing wafers in the polishing unit of FIG. 27(a) in a simultaneous manner.

The simultaneous manner comprises the steps illustrated in FIG. 28(b). At step 3000, two wafers are simultaneously transferred to the two wafer carriers 162a and 162y by the first and second load/unload cup s 182x and 182y of the dual cup wafer relay device 685. This step comprises sub-steps of (1) positioning the two wafers on the first and second load/unload cups 182x and 182y at their respective parking positions X and Y, (2) transferring the first and second load/unload cups 182x and 182y to the wafer load/unload positions of the second and first wafer carriers 162b and 162a over the polishing table 156 by the pivoting motion E, (3) loading the two wafers to the second and first wafer carriers 162b and 162a, and (4) transferring the first and second load/unload cups 182x and 182y back to their respective parking positions X and Y. Next, at step 3010, the two wafers are polished on the polishing table 156 using the polishing pad 155.

Next, at step 3020, after the polishing processes of the wafers are completed, the wafers are lifted from the polishing table 156, and then simultaneously transferred from the wafer carriers 162a and 162b by the load/unload cups 182x and 182y of the dual cup wafer relay device 685 by the pivoting motion E.

Figure 29:
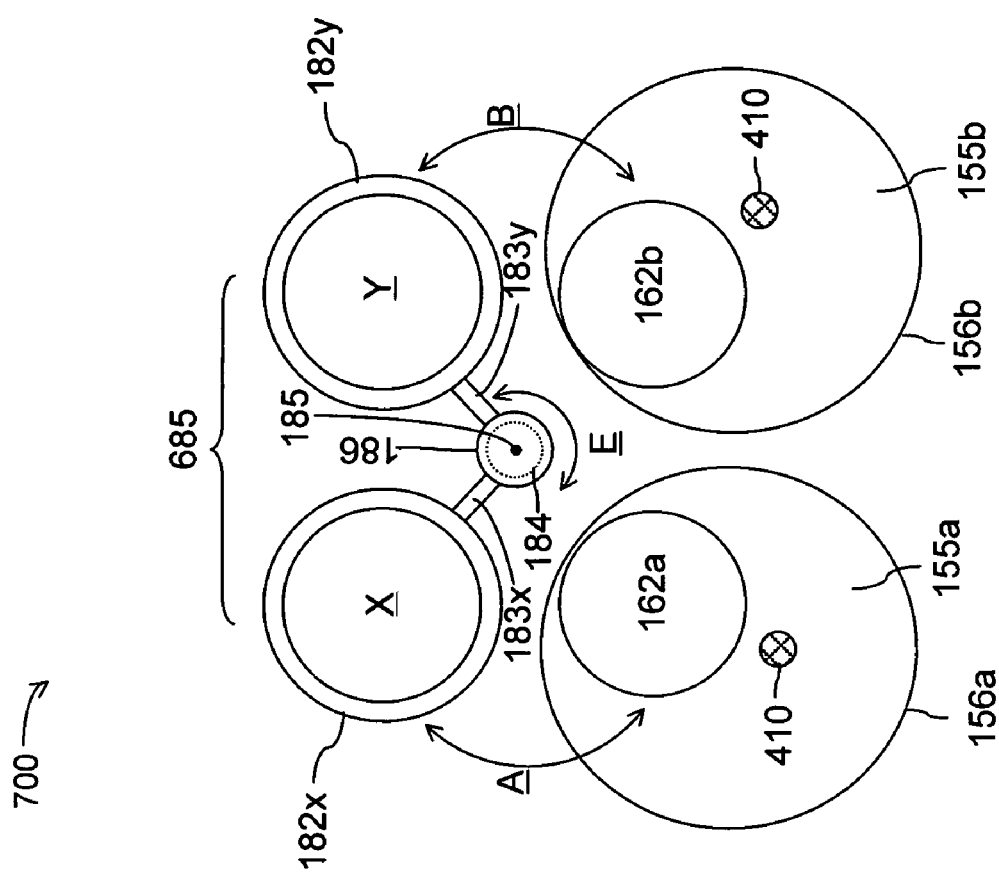
FIG. 29 is a top view of a polishing unit in accordance with an eleventh alternative embodiment of the present invention.

With reference to FIG. 29, a polishing unit 700 according to an eleventh alternative embodiment is described. The polishing unit 700 comprises two polishing tables 156a and 156b with respective polishing pads 155a and 155b, two wafer carriers 162a and 162b, and the dual cup wafer relay device 685. The wafer carriers 162a and 162b are positioned over the polishing tables 156a and 156b, respectively.

The first and second load/unload cups 182x and l82y can be pivoted about the pivoting point 185 to the wafer load/unload positions of the wafer carriers 162b and 162a, respectively, by the pivoting motion E. Therefore, the dual cup wafer relay device 685 can transfer two wafers at a time to or from the first and second wafer carriers 162a and 162b. The pivoting point 185 is located on a pivoting axis that is perpendicular to the surface of the polishing pad 155. In a modified embodiment, the first load/unload cup 182x can transfer wafers to and from the first wafer carrier 162a by the pivoting motion A and the second loud/unload cup 182y can transfer wafers to and from the second wafer carrier 162b by the pivoting motion B.

Figure 30A:
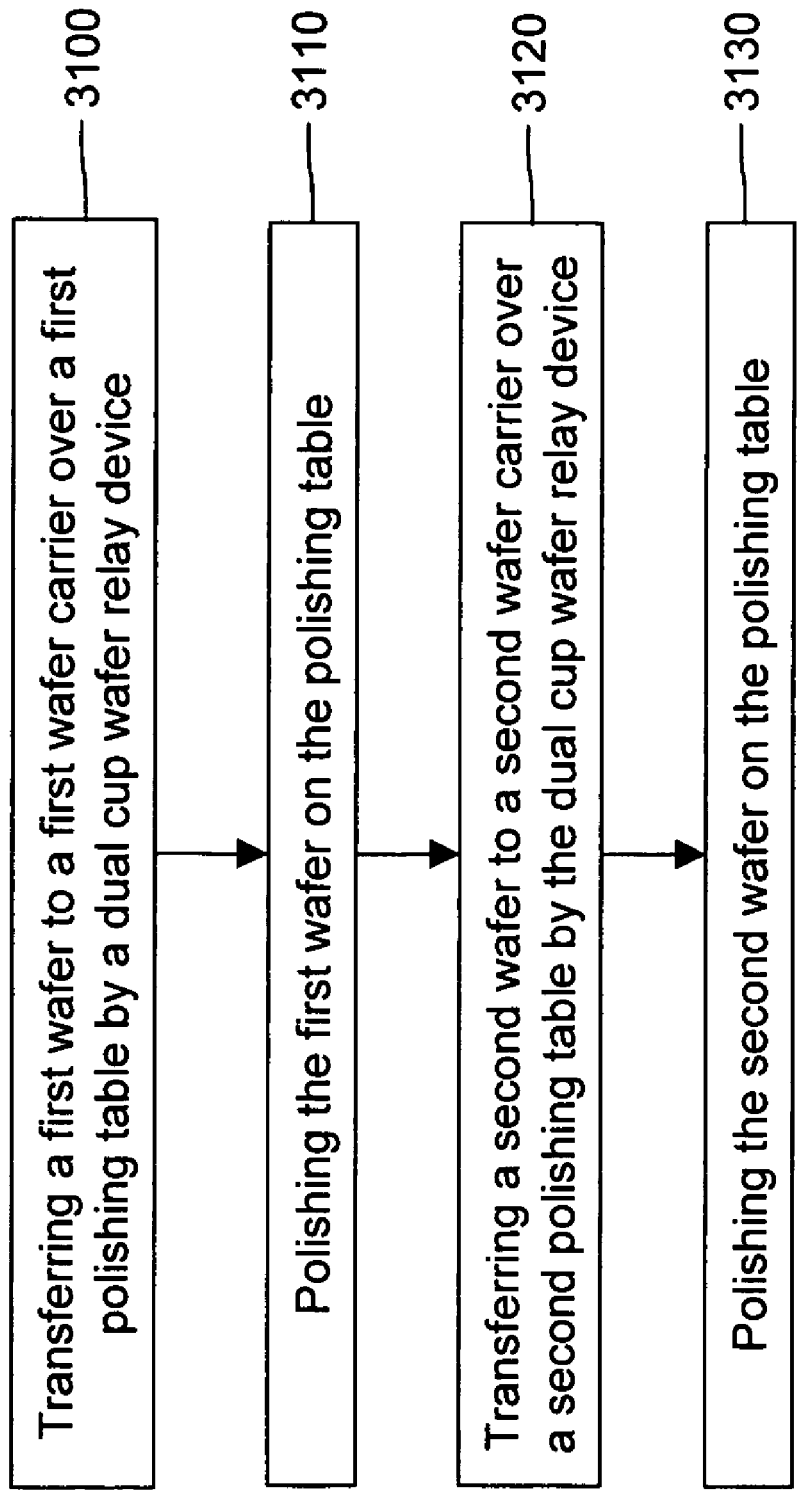
FIG. 30(a) is a process flow diagram for processing wafers in the polishing unit of FIG. 29 in an alternating manner.

With reference to FIGS. 30(a) and (b), methods of processing semiconductor wafers in an alternating manner and in a simultaneous manner in the polishing unit 700 are described, respectively.

The alternating manner comprises the steps illustrated in FIG. 30(a). At step 3100, a first wafer is transferred to the first wafer carrier 162a over the first polishing table 156a by the first load/unload cup 182x of the dual cup wafer relay device 685. This step comprises sub-steps of (1) positioning the first wafer on the first load/unload cup 182x at its parking position X, (2) transferring the load/unload cup 182x to the wafer load/unload position of the first wafer carrier 162a over the first polishing table 156a by its pivoting motion A, (3) loading the first wafer onto the first wafer carrier 162a, and (4) transferring the load/unload cup 182x back to its parking position X. Next, at step 3110, the first wafer is polished on the first polishing table 156a using the polishing pad 155a.

Next, at step 3120, a second wafer is transferred to the second wafer carrier 162b over the second polishing table 156b by the second load/unload cup 182y of the dual cup wafer relay device 685. This step comprises sub-steps of (1) positioning the second wafer on the second load/unload cup 182y at its parking position Y, (2) transferring the second load/unload cup 182y to the wafer load/unload position of the second wafer carrier 162b over the second polishing table 156b by its pivoting motion A, (3) loading the second wafer to the second wafer carrier 162b, and (4) transferring the second load/unload cup 182y back to its parking position Y. Next, at step 3130, the second wafer is polished on the second polishing table 156b using the polishing pad 155b.

After the polishing processes of the wafers are completed, the wafers are sequentially lifted from the polishing tables 156a and 156b, and then sequentially transferred from the wafer carriers 162a and 162b by the load/unload cups 182x and 182y of the dual cup wafer relay device 685, respectively.

Figure 30B:
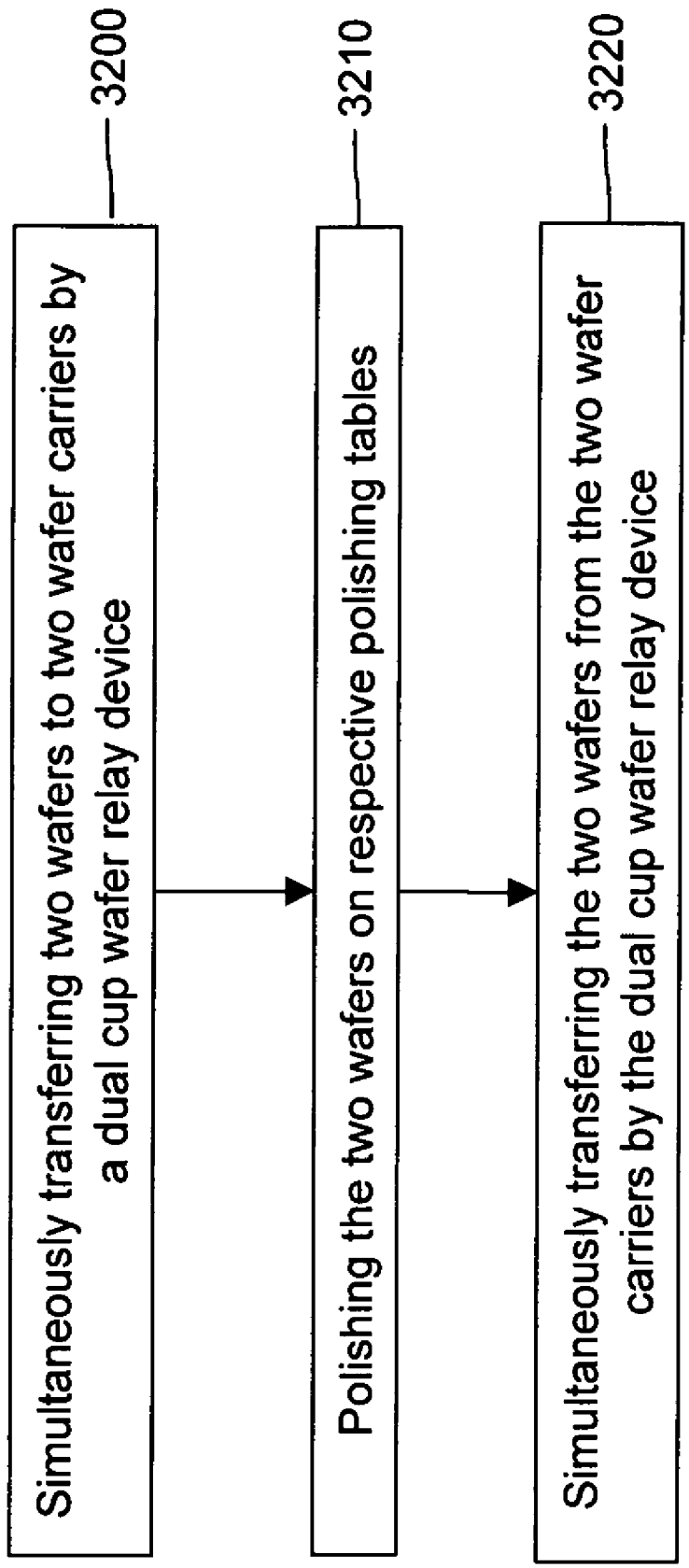
FIG. 30(b) is a process flow diagram for processing wafers in the polishing unit of FIG. 29 in a simultaneous manner.

The simultaneous manner comprises the steps illustrated in FIG. 30(b). At step 3200, two wafers are simultaneously transferred to the two wafer carriers 162a and 162y by the first and second load/unload cup s 182x and 182y of the dual cup wafer relay device 685. This step comprises sub-steps of (1) positioning the two wafers on the first and second load/unload cups 182x and 182y at their respective parking positions X and Y, (2) transferring the first and second load/unload cups 182x and 182y to the wafer load/unload positions of the second and first wafer carriers 162b and 162a over the second and first polishing tables 156b and 156a, respectively, by the pivoting motion E, (3) loading the two wafers to the second and first wafer carriers 162b and 162a, and (4) transferring the first and second load/unload cups 182x and 182y back to their respective parking positions X and Y. Next, at step 3210, the two wafers are polished on the respective polishing tables 156a and 156b using the polishing pads 155a and 155b.

Next, at step 3220, after the polishing processes of the wafers are completed, the wafers are lifted from the polishing tables 156a and 156b, and then simultaneously transferred from the wafer carriers 162a and 162b by the load/unload cups 182x and 182y of the dual cup wafer relay device 685.

Figure 31:
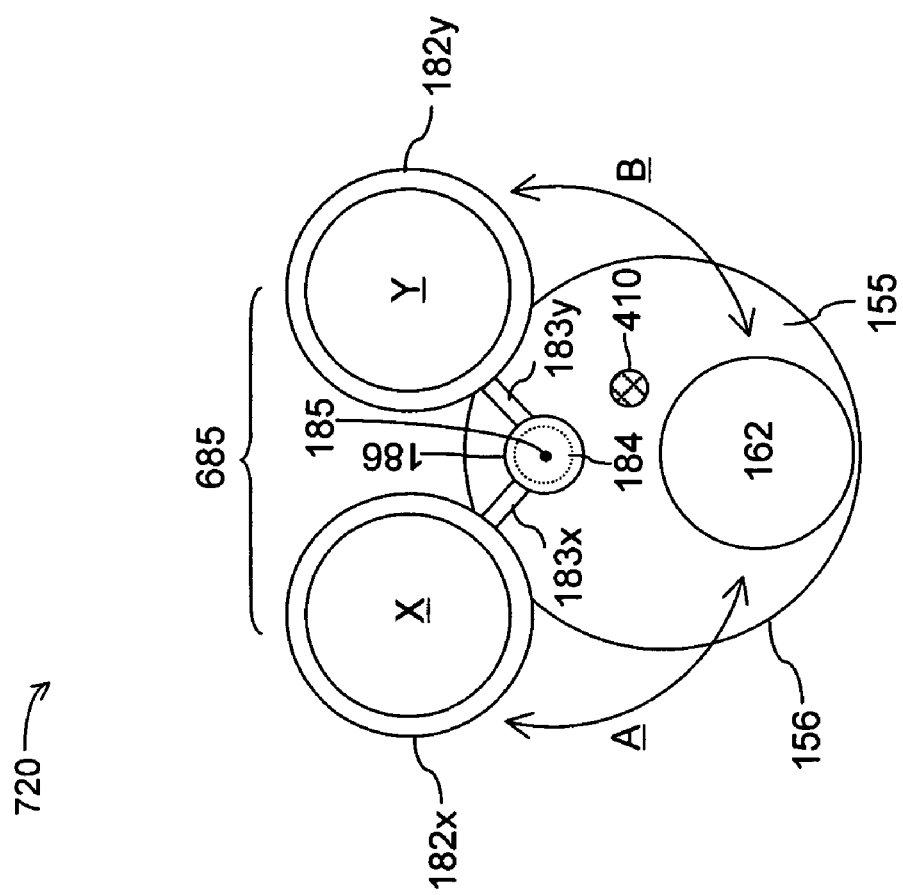
FIG. 31 is a top view of a polishing unit in accordance with a twelfth alternative embodiment of the present invention.

With reference to FIG. 31, a polishing unit 720 according to a twelfth alternative embodiment is described. The polishing unit 720 comprises one polishing table 156 with a polishing pad 155, one wafer carrier 162, and one dual cup wafer relay device 685. Each of the load/unload cups 182x and 182y of the dual cup wafer relay device 685 can be pivoted about the pivoting point 185 over the surface of the polishing pad 155 to transfer wafers to the wafer carrier 162 by their respective pivoting motions A and B in an alternating manner. The pivoting point 185 is located on a pivoting axis that perpendicularly intersects the surface of the polishing pad 155. In a modified embodiment, the first load/unload cup 182x can be used to transfer wafers to the wafer carrier 162 by the pivoting motion A and the second load/unload cup 182y can be used to transfer wafers from the wafer carrier 162 by the pivoting motion B.

Figure 32:
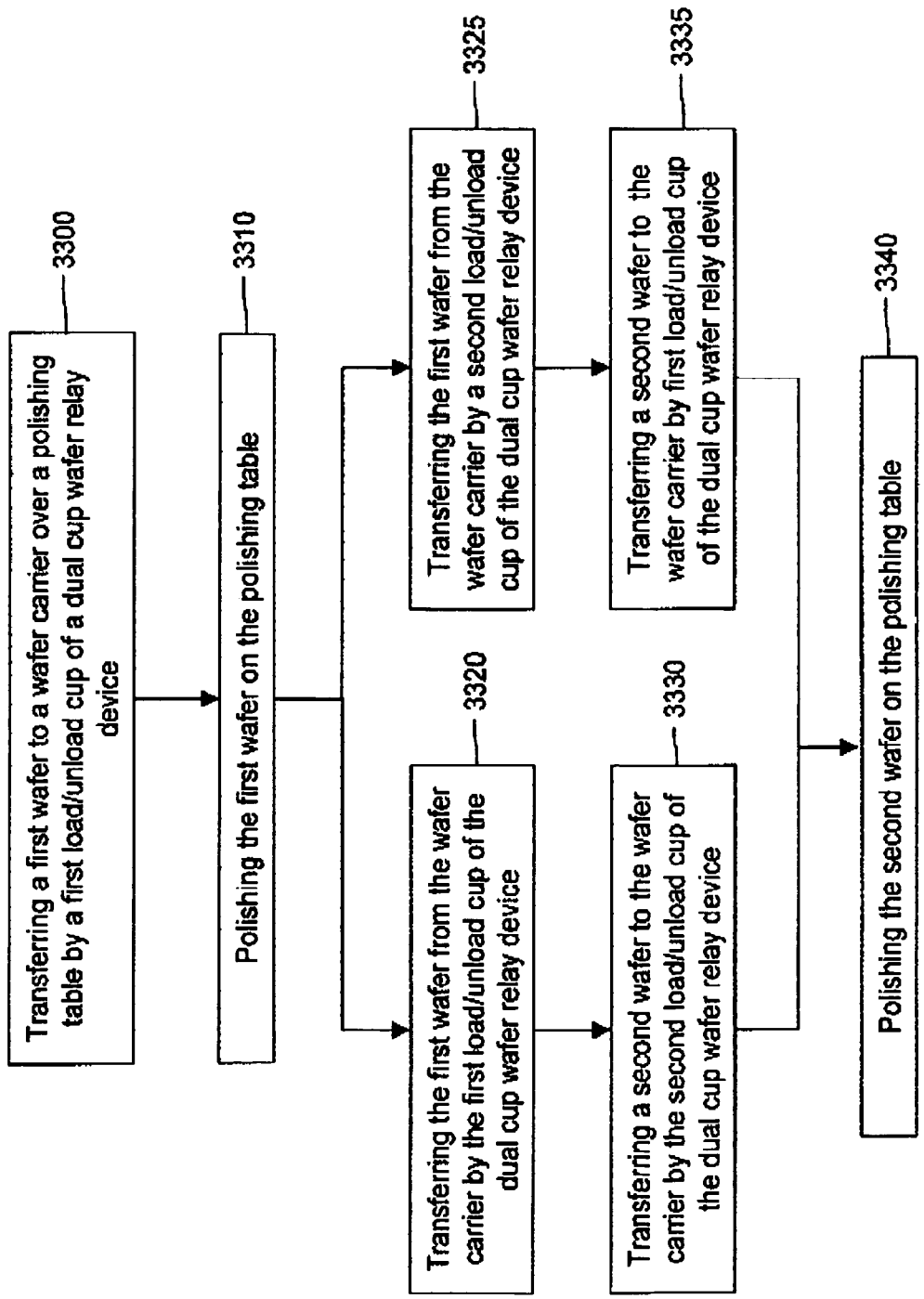
FIG. 32 is a process flow diagram for processing wafers in the polishing unit of FIG. 31.

With reference to FIG. 32, a method of processing semiconductor wafers in the polishing unit 720 is described. This method comprises the steps illustrated in FIG. 32. At step 3300, a first wafer is transferred to the wafer carrier 162 over the polishing table 156 by the first load/unload cup 182x of the dual cup wafer relay device 685. This step comprises sub-steps of (1) positioning the first wafer on the load/unload cup 182x at its parking position X, (2) transferring the load/unload cup 182x to the wafer load/unload position of the wafer carrier 162 over the polishing table 156 by its pivoting motion A, (3) loading the first wafer onto the wafer carrier 162, and (4) transferring the load/unload cup 182x back to its parking position X. Next, at step 3310, the first wafer is polished on the polishing table 156 using the polishing pad 155.

Next, at step 3320, after the polishing process of the first wafer is completed, the wafer carrier 162 is lifted from the polishing table 156 and then the first wafer is removed from the wafer carrier 162 by the first load/unload cup 182x of the dual cup wafer relay device 685.

At step 3330, a second wafer is transferred to the wafer carrier 162 by the second load/unload cup 182y of the dual cup wafer relay device 685 by its pivoting motion B. This step comprises sub-steps of (1) positioning the second wafer on the load/unload cup 182y at its parking position Y, (2) transferring the load/unload cup 182y to the wafer load/unload position of the wafer carrier 162 over the polishing table 156 by its pivoting motion A, (3) loading the second wafer onto the wafer carrier 162, and (4) transferring the load/unload cup 182y back to its parking position Y. Next, at step 3340, the second wafer is polished on the polishing table 156 using the polishing pad 155.

In a modified embodiment, steps 3320 and 3330 are replaced with steps 3325 and 3335. In this embodiment, at step 3325, after the polishing process of the first wafer is completed, the wafer carrier 162 is lifted from the polishing table 156 and then the first wafer is removed from the wafer carrier 162 by the second load/unload cup 182y of the dual cup wafer relay device 685.

Next, at step 3335, a second wafer is transferred to the wafer carrier 162 by the first load/unload cup 182x of the dual cup wafer relay device 685. This Step comprises sub-steps of (1) positioning the second wafer on the load/unload cup 182x at its parking position X, (2) transferring the load/unload cup 182x to the wafer load/unload position of the wafer carrier 162 over the polishing table 156 by its pivoting motion A, (3) loading the second wafer onto die wafer carrier 162, and (4) transferiing the load/unload cup 182x back to its parking position X. The second wafer is then polished on the polishing table 156 using the polishing pad 155, at step 3340.

Figure 33:
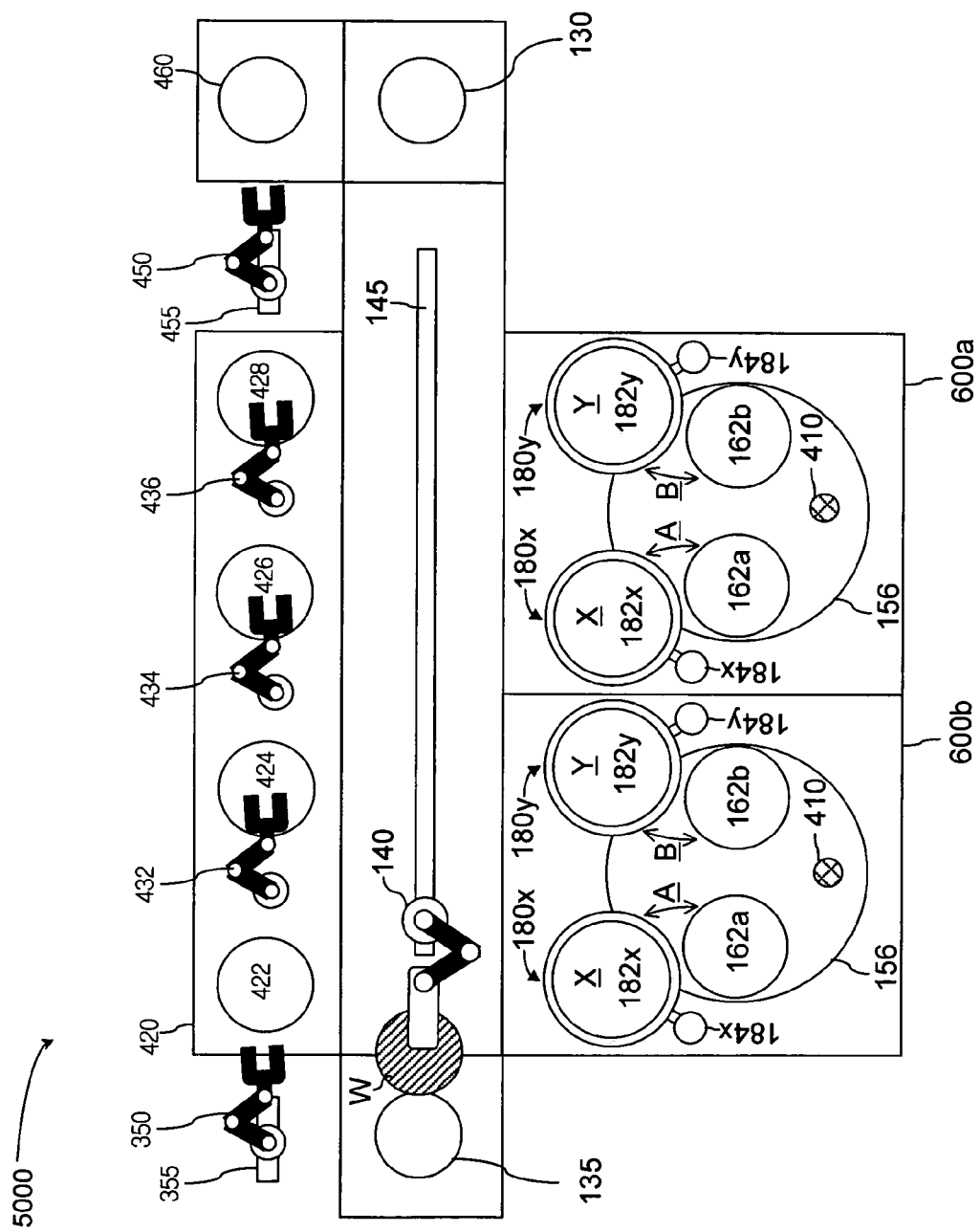
FIGS. 33, 34(a), 34(b) and 34(c) are top views of a polishing apparatus in accordance with a second embodiment of the present invention.

With reference to FIG. 33, a polishing apparatus 5000 in accordance with a second embodiment of the present invention is described. Same reference numerals of FIG. 1 are used in FIG. 33 to identify common parts and components in the polishing apparatus 5000 as those in the polishing apparatus 100 of FIG. 1. Furthermore, these common parts and components will not be described in detail below.

The polishing apparatus 5000 comprises a wafer input station 130, a wafer transport device 140, a first polishing unit 600a, a second polishing unit 600b, a cleaner buffer station 135, a cleaner wafer transport device 350, a wafer cleaner 420, an output wafer transport device 450, and a wafer output station 460.

The wafer input station 130 accommodates wafers to be polished. The cleaner buffer station 135 accommodates polished wafers to be cleaned. The wafer output station 460 accommodates polished wafers that have been cleaned at the wafer cleaner 420. The cleaner buffer station 135 may comprise multiple slots to be able to accommodate multiple wafers. The cleaner buffer station 135 may be connected to a fog generator (not shown). Fog supplied from the fog generator is used to prevent wafers from being dried while the wafers are stored in the cleaner buffer station 135. Alternatively, D.I. water spray can be used in the cleaner buffer station 135 instead of fog from the fog generator.

The polishing units 600a and 600b are positioned in the polishing apparatus 5000 such that the wafer transport device 140 can transfer wafers to and from the polishing units 600a and 600b. The wafer transport device 140 transfers wafers between the wafer input station 130, the cleaner buffer station 135 and the wafer relay devices 180 of the polishing units 600a and 600b. The wafer transport device 140 may be mounted on a linear track 145 such that the wafer transport device 140 can move in a linear manner on the linear track 145. The wafer transport device 140 may be configured to turn over the wafers before the wafer transport device 140 transfers wafers to the wafer relay devices 180 of the polishing units 600a and 600b and the cleaner buffer station 135.

The cleaner wafer transport device 350 transfers wafers from the cleaner buffer station 135 to the wafer cleaner 420. The cleaner wafer transport device 350 may be mounted on a linear track 355 such that the cleaner wafer transport device 350 can move in a linear manner on the linear track 355. The cleaner wafer transport device 350 may be configured to turn over the wafers before the wafer transport device 350 transfers wafers to the wafer cleaner 420.

The output wafer transport device 450 transfers wafers from the wafer cleaner 420 to the wafer output station 460. The output wafer transport device 450 may be mounted on a linear track 455 such that the wafer transport device 450 can move in a linear manner on the linear track 455.

The wafer cleaner 420 comprises a first cleaning station 422, a second cleaning station 424, a third cleaning station 426, a drying station 428, a first wafer transport device 432, a second wafer transport device 434 and a third wafer transport device 436. The first wafer transport device 432 transfers wafers from the first cleaning station 422 to the second cleaning station 424. The second wafer transport device 434 transfers wafers from the second cleaning station 424 to the third cleaning station 426. The third wafer transport device 436 transfers wafers from the third cleaning station 426 to the drying station 428. Dried wafers are removed from the drying station 428 by the output wafer transport device 450 and then transferred to the wafer output station 460. The first, second and third cleaning stations 422, 424 and 426 remove slurry particles from wafer surfaces using D.I. water and/or chemicals such as $NH_4OH$, dilute HF and organic chemicals. The first, second and third wafer cleaning stations 422, 424 and 426 may include brushes to remove the slurry particles. After the cleaning process is completed, wafers are rinsed with D.I. water and then dried in the drying station 428. The wafer cleaner 420 may comprise less or more than three cleaning stations.

In a serial mode operation of the polishing apparatus 5000, wafers are transferred from the wafer input station 130 to the first polishing unit 600a by the wafer transport device 140 and then polished in the first polishing unit 600a. After the polishing process is completed in the first polishing unit 600a, the wafers are transferred to the second polishing unit 600b by the wafer transport device 140 and then further polished in the second polishing unit 600b. Different slurries, different polishing pads and/or different polishing parameters can be used in the polishing units 600a and 600b. After the polishing process is completed in the second polishing unit 600b, the wafers are transferred from the second polishing unit 600b to the cleaner buffer station 135 by the wafer transport device 140 and then sent to the wafer cleaner 420 by the cleaner wafer transport device 350. The cleaned wafers are then transferred to the wafer output station 460 by the output wafer transport device 450.

In a parallel mode operation of the polishing apparatus 5000, a first group of wafers is transferred from the wafer input station 130 to the first polishing unit 600a by the wafer transport device 140 and then polished in the first polishing unit 600a. A second group of wafers is transferred from the wafer input station 130 to the second unit 600a by the wafer transport device 140 and then polished in the second polishing unit 600a. After the polishing processes are completed, the first and second groups of wafers are transferred to the cleaner buffer station 135 by the wafer transport device 140 and then sent to the wafer cleaner 420 by the cleaner wafer transport device 350. The cleaned wafers are then transferred to the wafer output station 460 by the output wafer transport device 450. The wafer transport device 140 can transfer the wafers of the first and second groups to and from the polishing units 600a and 600b so that all the wafers of one group are transferred first and then all the wafers of the other group are transferred. Alternatively, the wafer transport device 140 can transfer wafers to and from the first and second polishing units 600a and 600b in an alternating fashion.

Figure 34A:
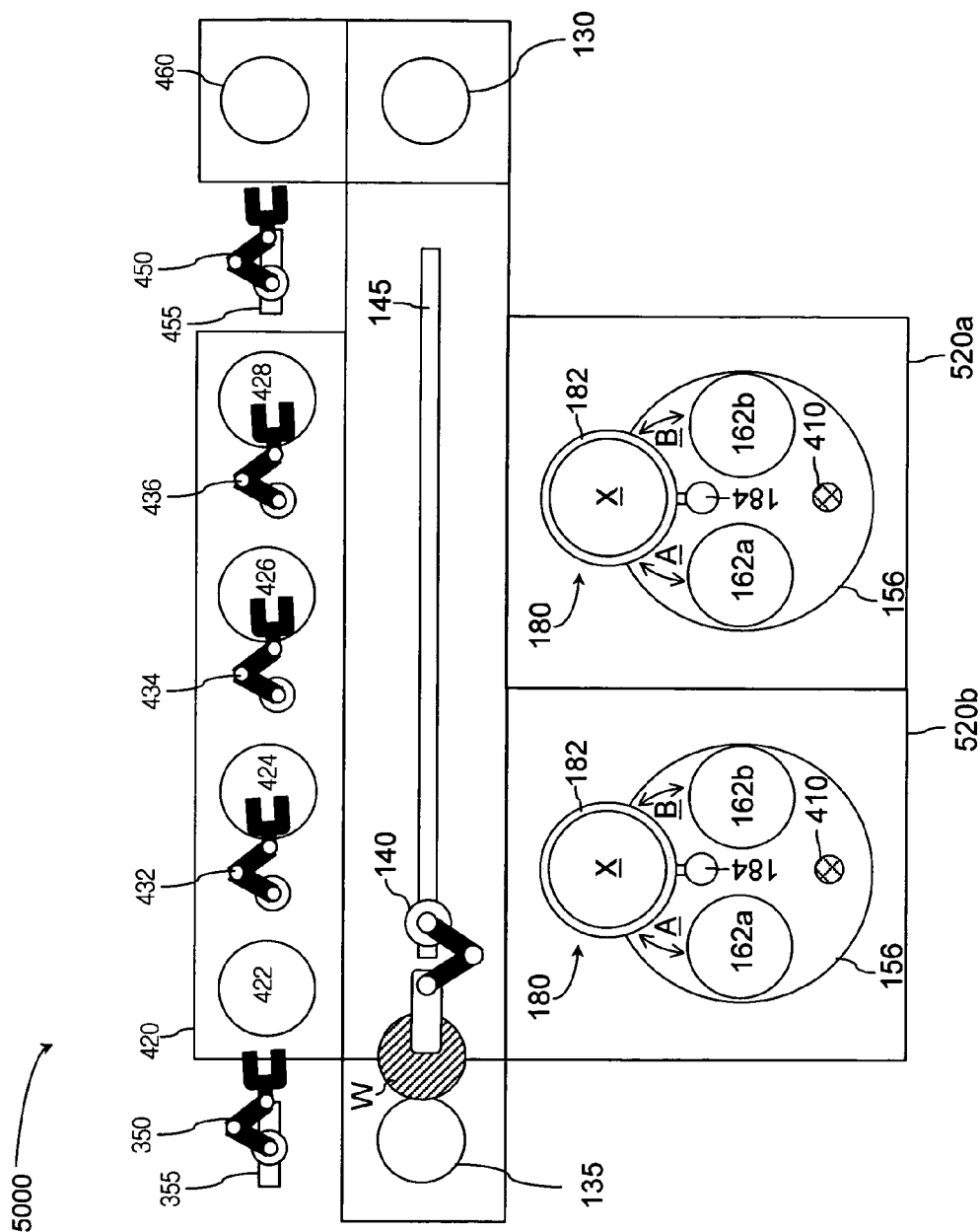
Figure 34B:
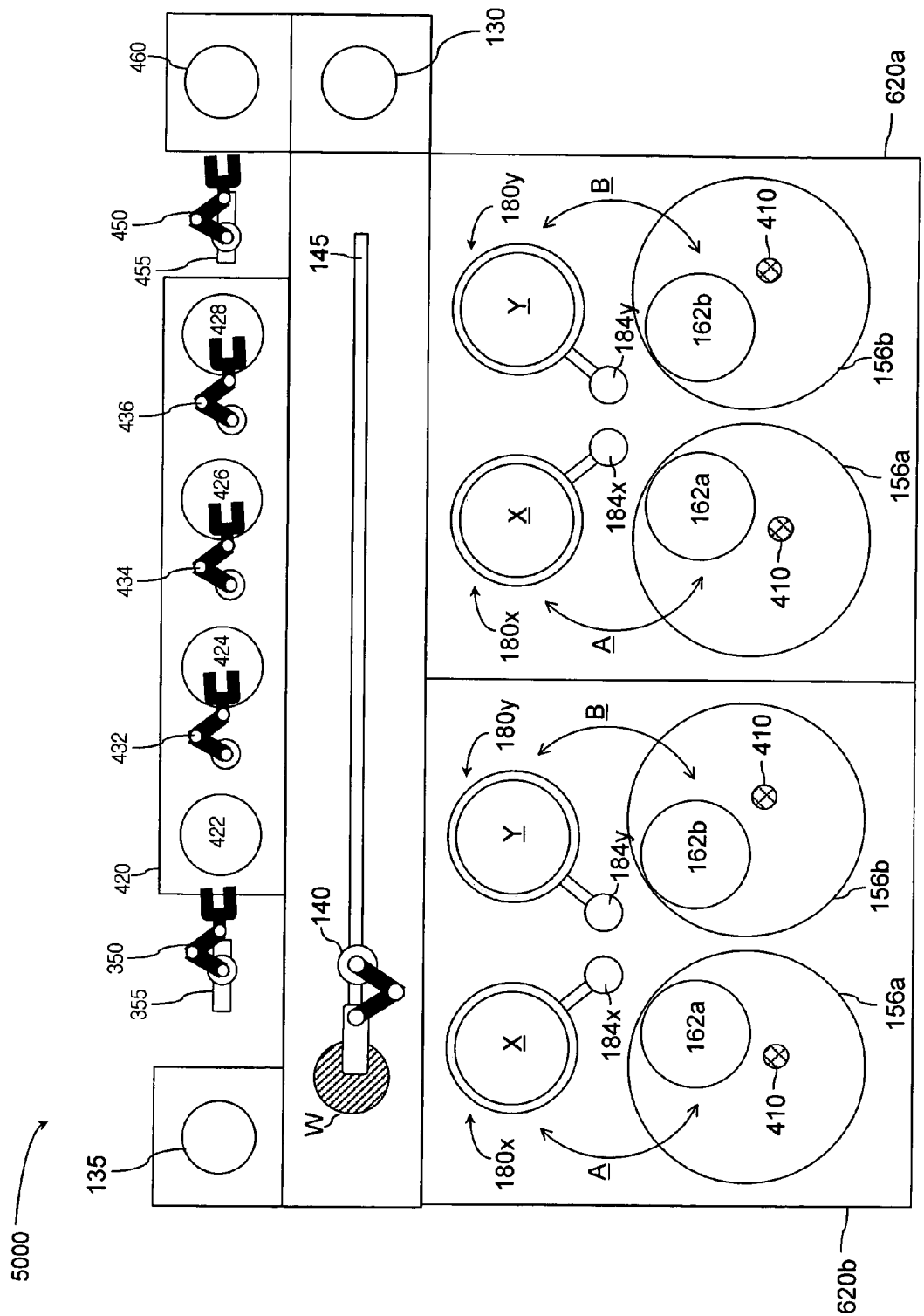
Figure 34C:
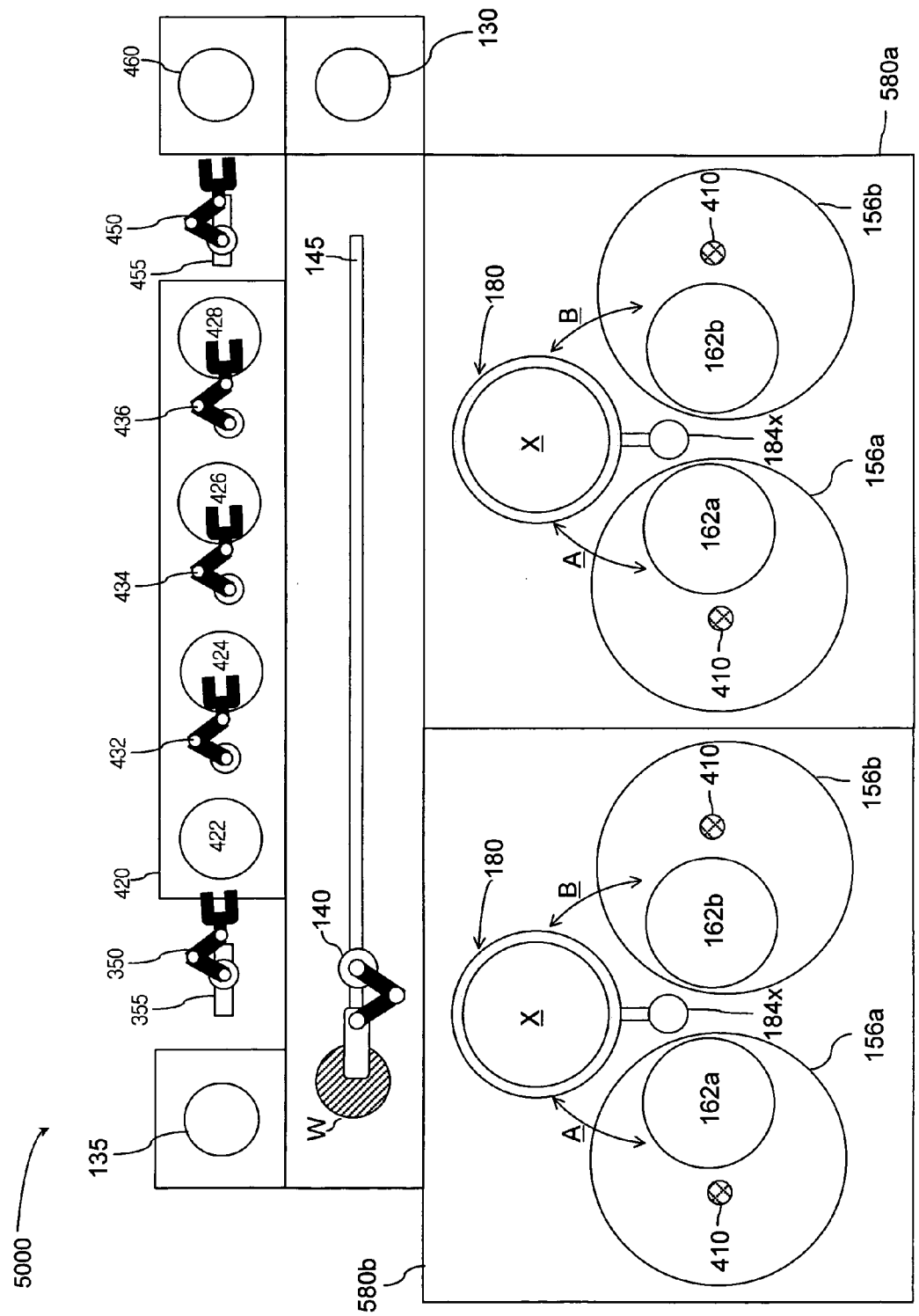

Even though the polishing apparatus 5000 has been explained with reference to FIG. 33 as comprising the polishing units 600a and 600b, the polishing apparatus 5000 can comprise any polishing units that are selected from the polishing units 150, 500, 520, 540, 560, 580, 600, 620, 640, 660, 680, 700 and 720 described with reference to FIGS. 1-32. As an example, FIG. 34(a) shows the polishing apparatus 5000 comprising the polishing units 520a and 520b. As another example, FIG. 34(b) shows the polishing apparatus 5000 comprising the polishing units 620a and 620b. As another example, FIG. 34(c) shows the polishing apparatus 5000 comprising the polishing units 580a and 580b. Furthermore, the two polishing units included in the polishing apparatus 5000 may be different types of polishing units.

Figure 35:
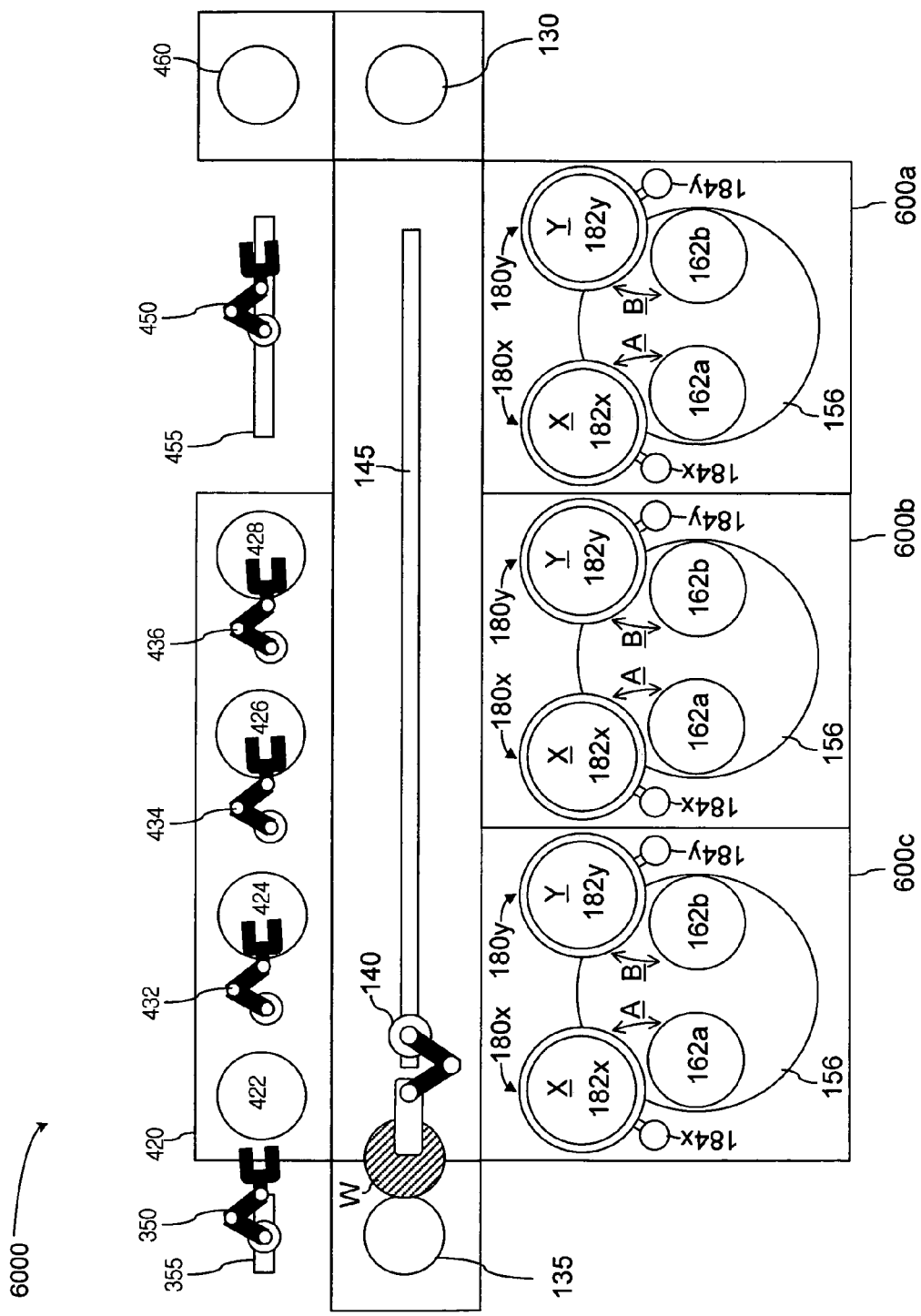
FIGS. 35 and 36 are top views of a polishing apparatus in accordance with a third embodiment of the present invention.

With reference to FIG. 35, a polishing apparatus 6000 in accordance with a third embodiment of the present invention is described. Same reference numerals of FIG. 33 are used in FIG. 35 to identify common parts and components in the polishing apparatus 6000 as those in the polishing apparatus 5000 of FIG. 33. Furthermore, these common parts and components will not be described in detail below.

The polishing apparatus 6000 is similar to the polishing apparatus 5000 illustrated in FIG. 33. A difference between the two polishing apparatuses 5000 and 6000 is that the polishing apparatus 6000 further comprises a third polishing unit 600c. The three polishing units 600a, 600b and 600c are arranged in the polishing apparatus 6000 such that the wafer transport device 140 can transfer wafers to and from the three polishing units 600a, 600b and 600c. Thus, in the polishing apparatus 6000, the wafer transport device 140 transfers wafers between the wafer input station 130, the cleaner buffer station 135 and the wafer relay devices 180 of the polishing units 600a, 600b and 600c.

In a serial mode operation of the polishing apparatus 6000, wafers are polished in the first, second and third polishing units 600a, 600b and 600c in a serial manner. Different slurries, different polishing pads and/or different polishing parameters can be used in the polishing units 600a, 600b and 600c. After the polishing process is completed, the wafers are transferred to the cleaner buffer station 135 by the wafer transport device 140 and then sent to the wafer cleaner 420 by the cleaner wafer transport device 350. The cleaned wafers are then transferred to the wafer output station 460 by the output wafer transport device 450.

In a parallel mode operation of the polishing apparatus 6000, a first group of wafers is transferred from the wafer input station 130 to the first polishing unit 600a by the wafer transport device 140 and then polished in the first polishing unit 600a. A second group of wafers is transferred from the wafer input station 130 to the second polishing unit 600b by the wafer transport device 140 and then polished in the second polishing unit 600b. A third group of wafers is transferred from the wafer input station 130 to the third polishing unit 600c by the wafer transport device 140 and then polished in the third polishing unit 600c. After the polishing processes are completed, the first, second and third groups of wafers are transferred to the cleaner buffer station 135 by the wafer transport device 140 and then sent to the wafer cleaner 420 by the cleaner wafer transport device 350. The cleaned wafers are then transferred to the wafer output station 460 by the output wafer transport device 450.

In a mixed mode operation of the polishing apparatus 6000, wafers are transferred from the wafer input station 130 to the first polishing unit 600a by the wafer transport device 140 and then polished in the first polishing unit 600a using a first kind of slurry and a first kind of polishing pad. Next, a first group of the wafers polished in the first polishing unit 600a is transferred from the first polishing unit 600a to the second polishing unit 600b by the wafer transport device 140 and then further polished in the second polishing unit 600b using a second kind of slurry and a second kind of polishing pad. A second group of the wafers polished in the first polishing unit 600a is transferred from the first polishing unit 600a to the third polishing unit 600c by the wafer transport device 140 and then further polished in the third polishing unit 600c using the second kind of slurry and the second kind of polishing pad. After the polishing processes are completed, the first and second groups of the wafers are transferred from the second and third polishing unit 600b and 600c to the cleaner buffer station 135 by the wafer transport device 140 and then sent to the wafer cleaner 420 by the cleaner wafer transport device 350. The first kind of slurry and/or the first kind of polishing pad can also be used in the second and third polishing units 600b and 600c instead of the second kind of slurry and the second kind of polishing pad.

In another mixed mode operation of the polishing apparatus 6000, a first group of wafers is transferred from the wafer input station 130 to the first polishing unit 600a by the wafer transport device 140 and then polished in the first polishing unit 600a using a first kind of slurry and a first kind of polishing pad. A second group of wafers is transferred from the wafer input station 130 to the second polishing unit 600b by the wafer transport device 140 and then polished in the second polishing unit 600b using the first kind of slurry and the first kind of polishing pad. The first and second groups of wafers are then transferred to the third polishing unit 600c by the wafer transport device 140 and then further polished in the third polishing unit 600c using a second kind of slurry and a second kind of polishing pad. The first kind of slurry and/or the first kind of polishing pad can also be used in the third polishing unit 600c instead of the second kind of slurry and the second kind of polishing pad. After the polishing processes are completed, the first and second groups of wafers are transferred to the cleaner buffer station 135 by the wafer transport device 140 and then sent to the wafer cleaner 420 by the cleaner wafer transport device 350. The cleaned wafers are then transferred to the wafer output station 460 by the output wafer transport device 450.

The wafer transport device 140 can transfer the wafers of the first, second and third groups to and from the polishing units 600a, 600b and 600c so that all the wafers of one group are transferred first, followed by all the wafers of one of the two remaining groups, and then all the wafers of the last remaining group. Alternatively, the wafer transport device 140 can sequentially transfer wafers to and from the first, second and third polishing units 600a, 600b and 600c in a rotating fashion such that only one wafer is transferred to or from each polishing unit at a time.

Figure 36:
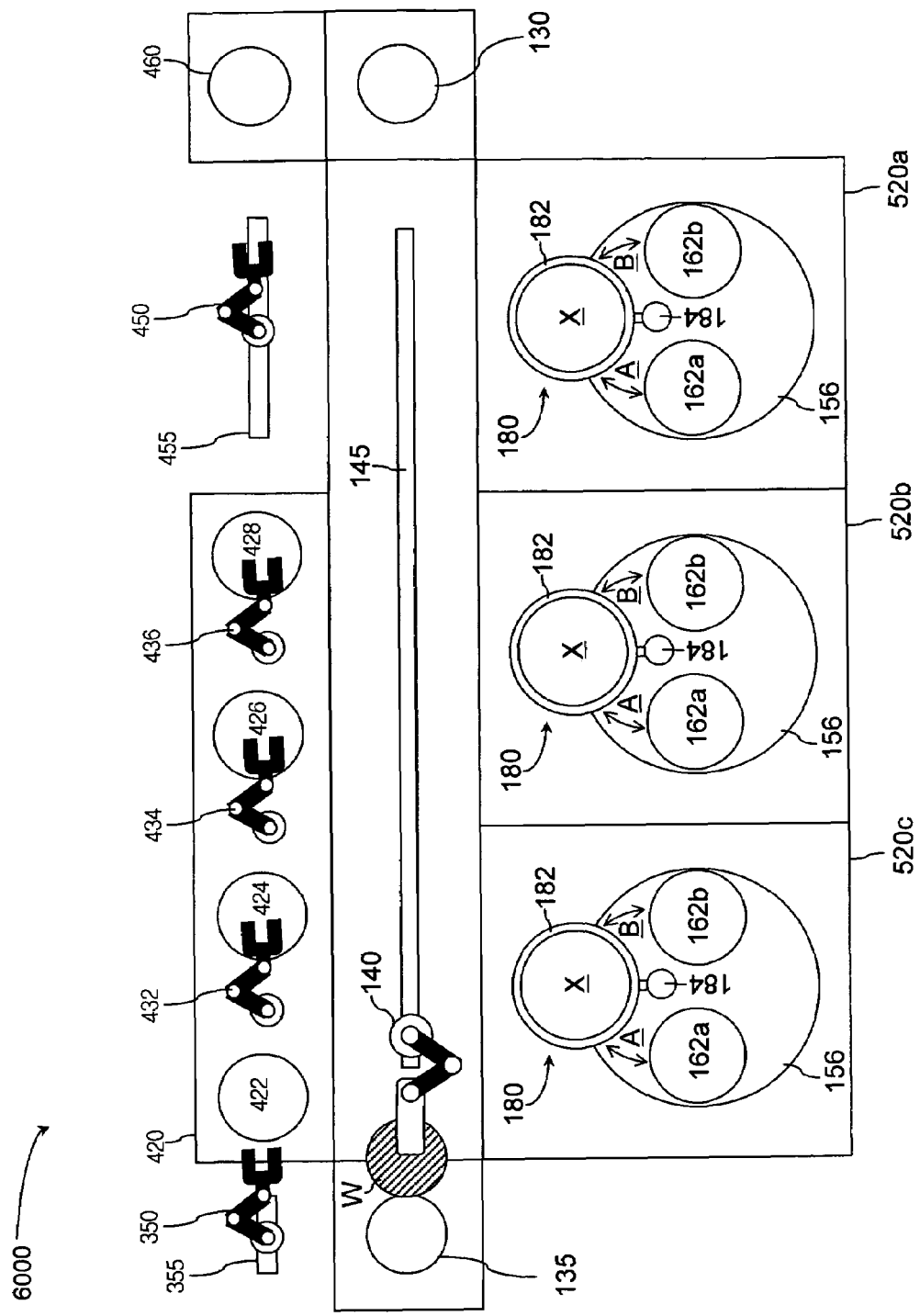

Even though the polishing apparatus 6000 has been described with reference to FIG. 35 as comprising the three polishing units 600a, 600b and 600e, the polishing apparatus 6000 may comprise more than three polishing units 600. Furthermore, the polishing apparatus 6000 can comprise any polishing units that are selected from the polishing units 150, 500, 520, 540, 560, 580, 600, 620, 640, 660, 680, 700 and 720 described with reference to FIGS. 1-32. As an example, FIG. 36 shows the polishing apparatus 6000 comprising the three polishing units 520a, 520b and 520c.

Figure 37:
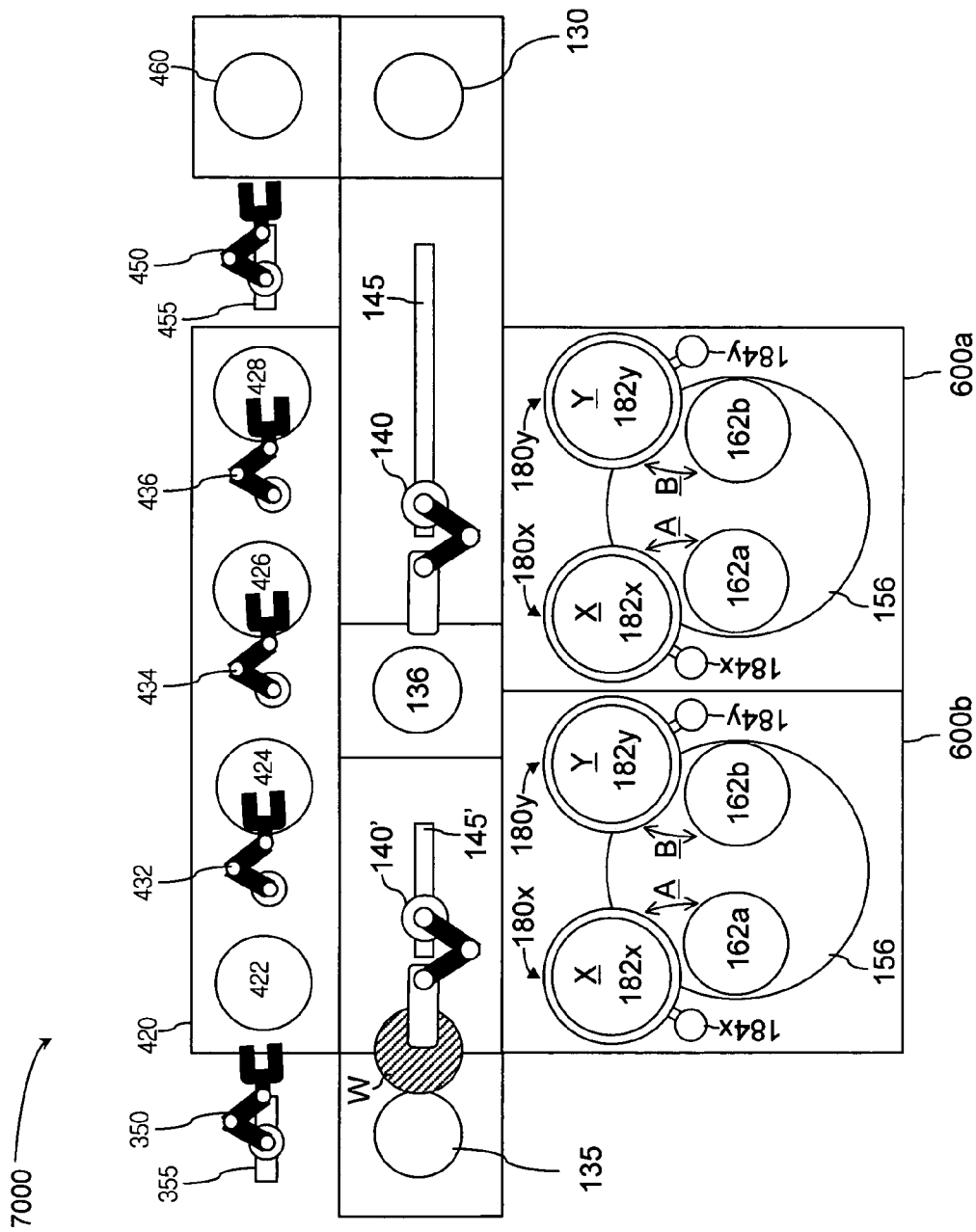
FIGS. 37 and 38 are top views of a polishing apparatus in accordance with a fourth embodiment of the present invention.

With reference to FIG. 37, a polishing apparatus 7000 in accordance with a fourth embodiment of the present invention is described. Same reference numerals of FIG. 33 are used in FIG. 37 to identify common parts and components in the polishing apparatus 7000 as those in the polishing apparatus 5000 of FIG. 33. Furthermore, these common parts and components will not be described in detail below.

The polishing apparatus 7000 is similar to the polishing apparatus 5000 illustrated in FIG. 33. A difference between the two apparatuses 5000 and 7000 is that the polishing apparatus 7000 further comprises a polisher buffer station 136 and a second wafer transport device 140' over the polishing apparatus 5000. The first wafer transport device 140 is located between the wafer input station 130 and the polisher buffer station 136. The polisher buffer station 136 is located between the first and second wafer transport devices 140 and 140'. The second wafer transport device 140' is located between the polisher buffer station 136 and the cleaner buffer station 135. The second wafer transport device 140' may be also mounted on a linear track 145' such that the second wafer transport device 140' can move in a linear manner on the linear track 145'.

The polisher buffer station 136 accommodates wafers that are transferred to and from the polisher buffer station 136 by the first and second wafer transport devices 140 and 140'. The polisher buffer station 136 may comprise multiple slots to be able to accommodate multiple wafers. The polisher buffer station 136 may be connected to a fog generator (not shown). Fog supplied from the fog generator is used to prevent wafers from being dried while the wafers are stored in the polisher buffer station 136. Alternatively, D.I. water spray can be used in the polisher buffer station 136 instead of fog from the fog generator.

The first polishing unit 600a is located near the first wafer transport device 140 and the second polishing unit 600b is located near the second wafer transport device 140'. The first wafer transport device 140 transfers wafers between the wafer input station 130, the polisher buffer station 136, and the first polishing unit 600a. The second wafer transport device 140' transfers wafers between the polisher buffer station 136, the second polishing unit 600b and the cleaner buffer station 135.

In an exemplary operation of the polishing apparatus 7000, wafers are transferred from the wafer input station 130 to the first polishing unit 600a by the first wafer transport device 140 and then polished in the first polishing unit 600a. After the polishing process is completed in the first polishing unit 600a, the wafers are transferred from the first polishing unit 600a to the polisher buffer station 136 by the first wafer transport device 140. Next, the wafers are transferred from the polisher buffer station 136 to the second polishing unit 600b by the second wafer transport device 140' and then further polished in the second polishing unit 600b. Different slurries, different polishing pads and/or different polishing parameters can be used in the polishing units 600a and 600b. After the polishing process is completed in the second polishing unit 600b, the wafers are transferred from the second polishing unit 600b to the cleaner buffer station 135 by the second wafer transport device 140' and then sent to the wafer cleaner 420 by the cleaner wafer transport device 350. The cleaned wafers are then transferred to the wafer output station 460 by the output wafer transport device 450.

Figure 38:
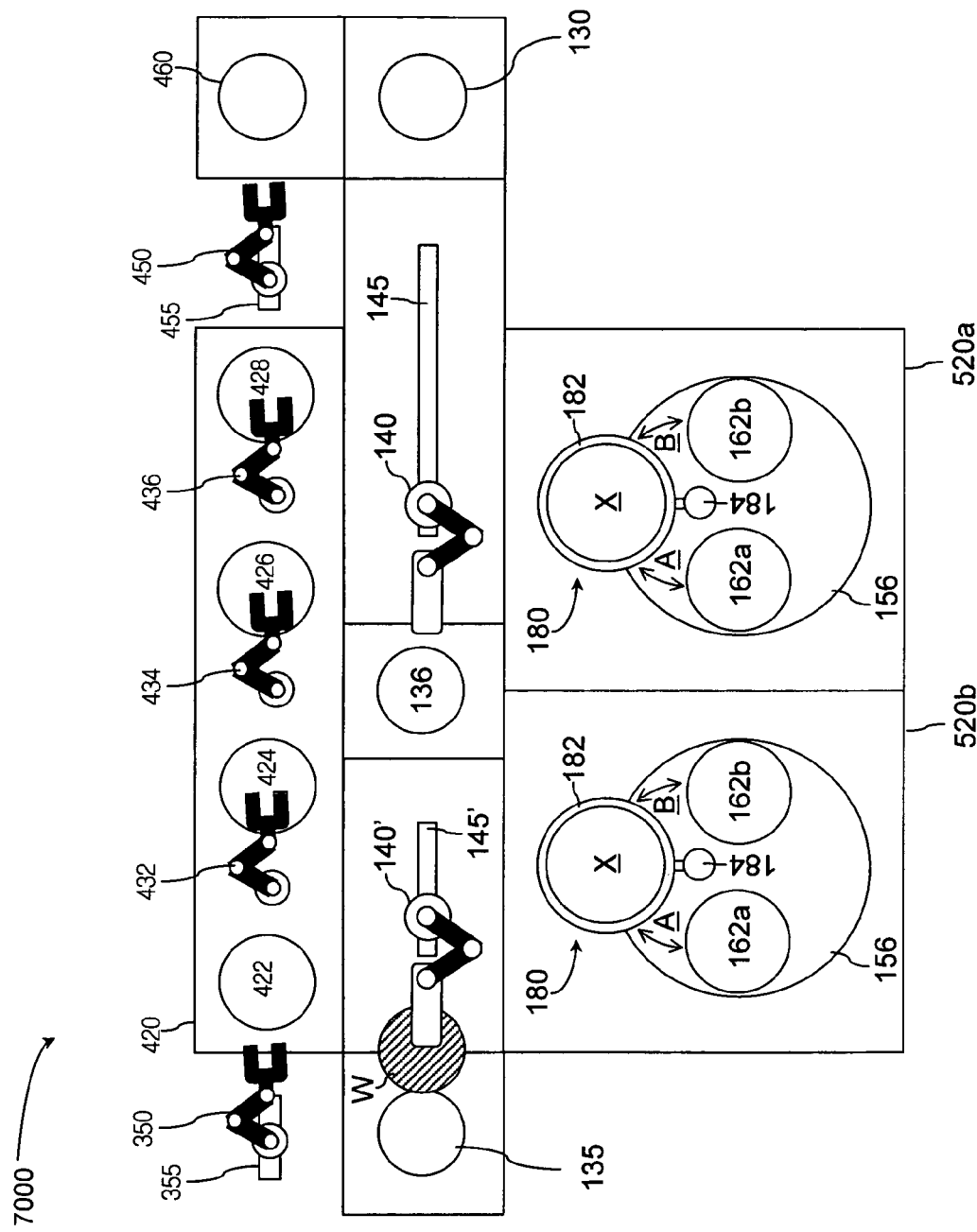

Even though the polishing apparatus 7000 has been described with reference to FIG. 37 as comprising the polishing units 600a and 600b, the polishing apparatus 7000 can comprise any polishing units that are selected from the polishing units 150, 500, 520, 540, 560, 580, 600, 620, 640, 660, 680, 700 and 720 described with reference to FIGS. 1-32. As an example, FIG. 38 shows the polishing apparatus 7000 comprising the polishing units 520a and 520b.

Figure 39:
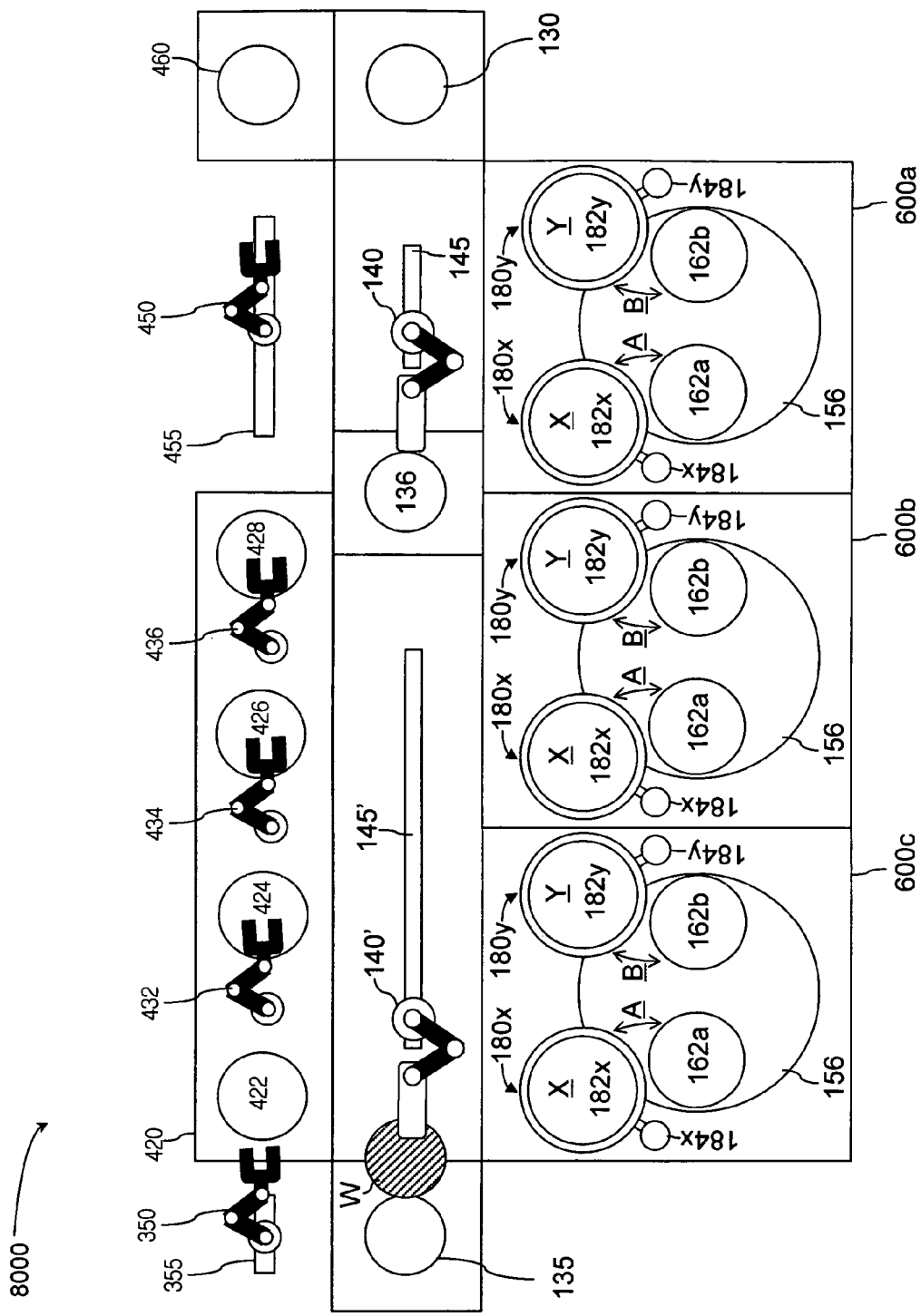
FIGS. 39 and 40 are top views of a polishing apparatus in accordance with a fifth embodiment of the present invention.

With reference to FIG. 39, a polishing apparatus 8000 in accordance with a fifth embodiment of the present invention is described. Same reference numerals of FIGS. 33 and 37 are used in FIG. 39 to identify common parts and components in the polishing apparatus 8000 as those in the polishing apparatuses 5000 and 7000 of FIGS. 33 and 37. Furthermore, these common parts and components will not be described in detail below.

The polishing apparatus 8000 is similar to the polishing apparatus 7000 of FIG. 37. A difference between the polishing apparatuses 7000 and 8000 is that the polishing apparatus 8000 further comprises a third polishing unit 600c. The third polishing unit 600c is positioned adjacent to the second wafer transport device 140' such that the second wafer transport device 140' can transfer wafers to and from the third polishing unit 600c. The second wafer transport device 140' transfers wafers between the polisher buffer station 136, the second polishing unit 600b, the third polishing unit 620c and the cleaner buffer station 135.

In an exemplary operation of the polishing apparatus 8000, wafers are transferred from the wafer input station 130 to the first polishing unit 600a by the first wafer transport device 140 and then polished in the first polishing unit 600a using a first kind of slurry and a first kind of polishing pad. After the polishing process is completed in the first polishing unit 600a, the wafers are transferred to the polisher buffer station 136 by the first wafer transport device 140. Next, a first group of the wafers polished in the first polishing unit 600a is transferred from the polisher buffer station 136 to the second polishing unit 600b by the second wafer transport device 140' and then further polished in the second polishing unit 600b using a second kind of slurry and a second kind of polishing pad. A second group of the wafers polished in the first polishing unit 600a is transferred from the polisher buffer station 136 to the third polishing unit 600c by the second wafer transport device 140' and then further polished in the third polishing unit 600c using the second kind of slurry and the second kind of polishing pad. The wafer transport device 140' can transfer the wafers of the first, second and third groups to and from the polishing units 600a, 600b and 600c so that all the wafers of one group are transferred first, followed by all the wafers of one of the two remaining groups, and then all the wafers of the last remaining group. Alternatively, the wafer transport device 140' can sequentially transfer wafers to and from the first, second and third polishing units 600a, 600b and 600c in a rotating fashion such that only one wafer is transferred to or from each polishing unit at a time.

After the polishing processes are completed in the second and third polishing units 600b and 600c, the first and second groups of wafers are transferred from the second and third polishing units 600b and 600c to the cleaner buffer station 135 by the second wafer transport device 140' and then sent to the wafer cleaner 420 by a cleaner wafer transport device 350. The cleaned wafers are then transferred to the wafer output station 460 by the output wafer transport device 450. The first kind of slurry and/or the first kind of polishing pad can also be used in the second and third polishing units 600b and 600c instead of the second kind of slurry and the second kind of polishing pad.

Figure 40:
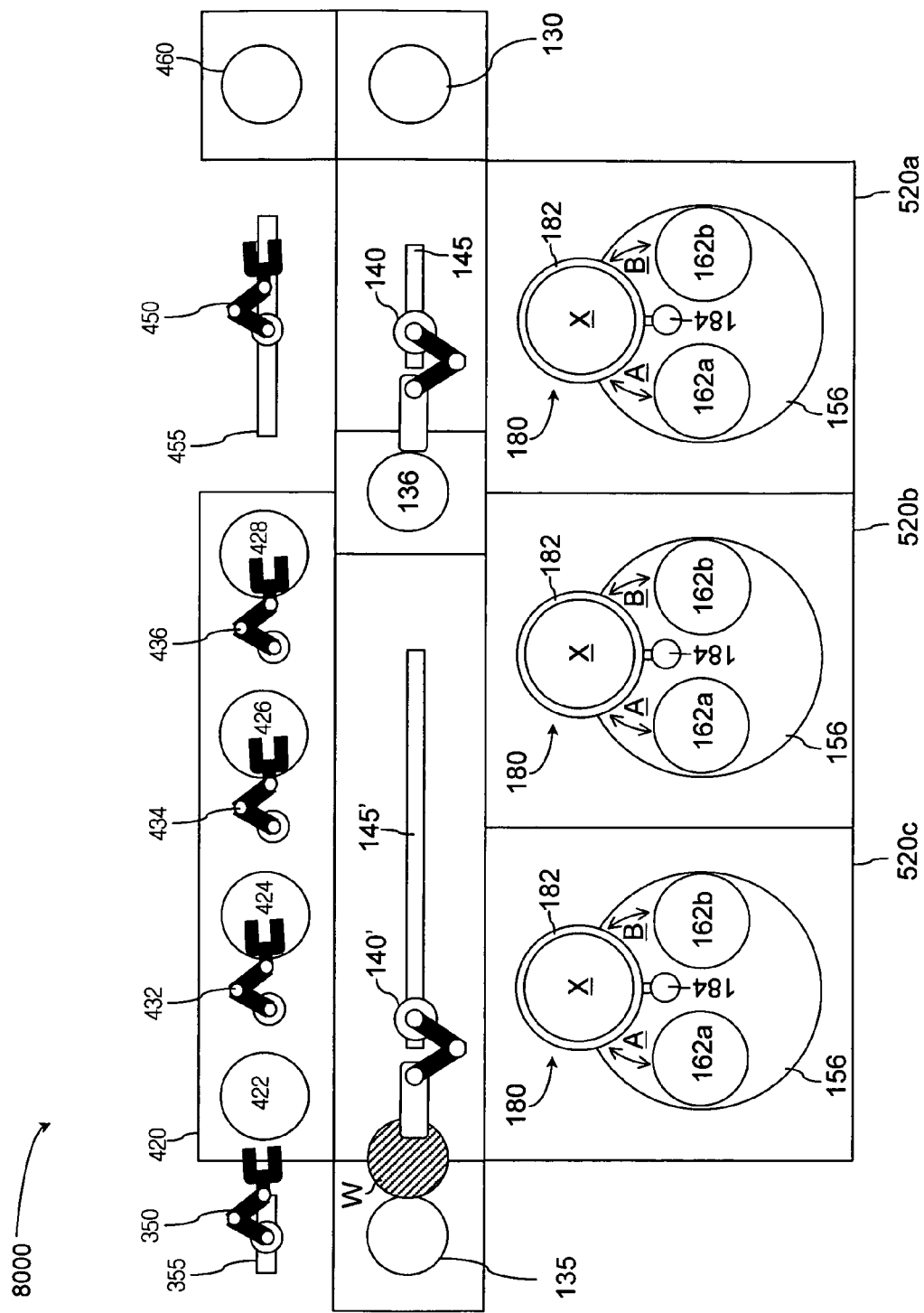

Even though the polishing apparatus 8000 has been described with reference to FIG. 39 as comprising the polishing units 600a, 600b and 600c, the polishing apparatus 8000 can comprise any polishing units that are selected from the polishing units 150, 500, 520, 540, 560, 580, 600, 620, 640, 660, 680, 700 and 720 described with reference to FIGS. 1-32. As an example, FIG. 40 shows the polishing apparatus 8000 comprising the polishing units 520a, 520b and 520c.

Figure 41:
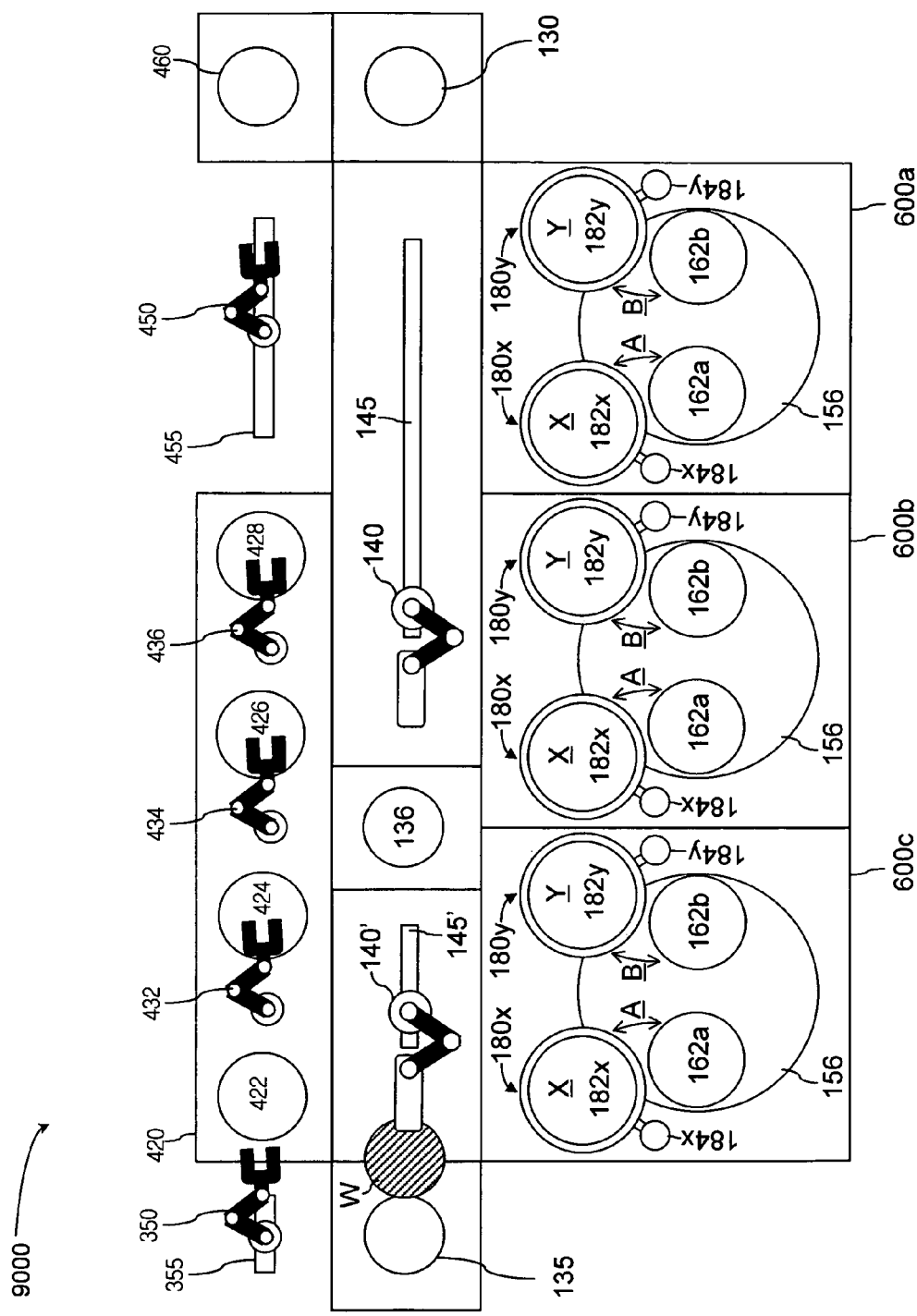
FIGS. 41 and 42 are top views of a polishing apparatus in accordance with a sixth embodiment of the present invention.

With reference to FIG. 41, a polishing apparatus 9000 in accordance with a sixth embodiment of the present invention is described. Same reference numerals of FIGS. 33 and 39 are used in FIG. 41 to identify common parts and components in the polishing apparatus 9000 as those in the polishing apparatuses 5000 and 8000 of FIGS. 33 and 39. Furthermore, these common parts and components will not be described in detail below.

The polishing apparatus 9000 is similar to the polishing apparatus 8000 of FIG. 39. A difference between the apparatuses 8000 and 9000 is that the polisher buffer station 136 is located between second and third polishing units 600b and 600c in the polishing apparatus 9000 while the polisher buffer station 136 is located between the first and second polishing units 600a and 600b in the polishing apparatus 8000. Thus, in the polishing apparatus 9000, the first wafer transport device 140 transfers wafers between the wafer input station 140, the polisher buffer station 136, the first polishing unit 600a and the second polishing unit 600b. Furthermore, the second wafer transport device 140' transfers wafers between the polisher buffer station 136, the third polishing unit 620c and the cleaner buffer station 135.

In an exemplary operation of the polishing apparatus 9000, a first group of wafers is transferred from the wafer input station 130 to the first polishing unit 600a by the first wafer transport device 140 and then polished in the first polishing unit 600a using a first kind of slurry and a first kind of polishing pad. A second group of wafers is transferred from the wafer input station 130 to the second polishing unit 600b by the first wafer transport device 140 and then polished in the second polishing unit 600b using the first kind of slurry and the first kind of polishing pad. After the polishing processes are completed in the first and second polishing units 600a and 600b, the first and second groups of wafers are transferred to the polisher buffer station 136 by the first wafer transport device 140. The wafer transport device 140 can transfer the wafers of the first and second groups to and from the polishing units 600a and 600b so that all the wafers of one group are transferred first and then all the wafers of the other group are transferred. Alternatively, the wafer transport device 140 can transfer wafers to and from the first and second polishing units 600a and 600b in an alternating fashion.

Next, the first and second groups of wafers are transferred from the polisher buffer station 136 to the third polishing unit 600c by the second wafer transport device 140' and then polished in the third polishing unit 600c using a second kind of slurry and a second kind of polishing pad. After the polishing process is completed in the third polishing unit 600c, the first and second groups of wafers are transferred from the third polishing unit 600c to the cleaner buffer station 135 by the second wafer transport device 140' and then sent to the wafer cleaner 420 by the cleaner wafer transport device 350. The cleaned wafers are then transferred to the wafer output station 460 by the output wafer transport device 450. The first kind of slurry and/or the first kind of polishing pad can also be used in the third polishing unit 600c instead of the second kind of slurry and the second kind of polishing pad.

Figure 42:
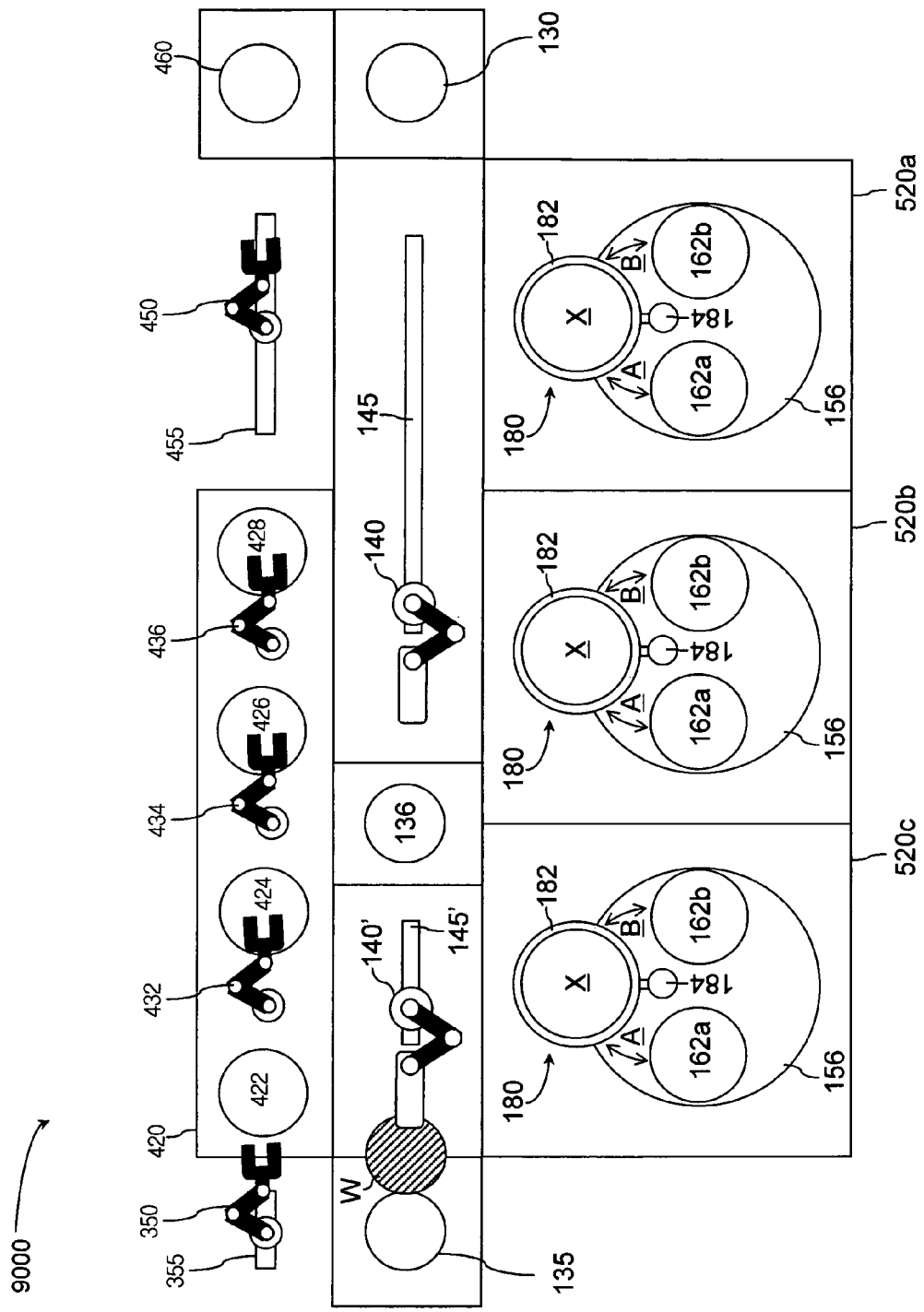

Even though the polishing apparatus 9000 has been described with reference to FIG. 41 as comprising the polishing units 600a, 600b and 600c, the polishing apparatus 9000 can comprise any polishing units that are selected from the polishing units 150, 500, 520, 540, 560, 580, 600, 620, 640, 660, 680, 700 and 720 described with reference to FIGS. 1-32. As an example, FIG. 42 shows the polishing apparatus 9000 comprising the polishing units 520a, 520b and 520c.

Figure 43:
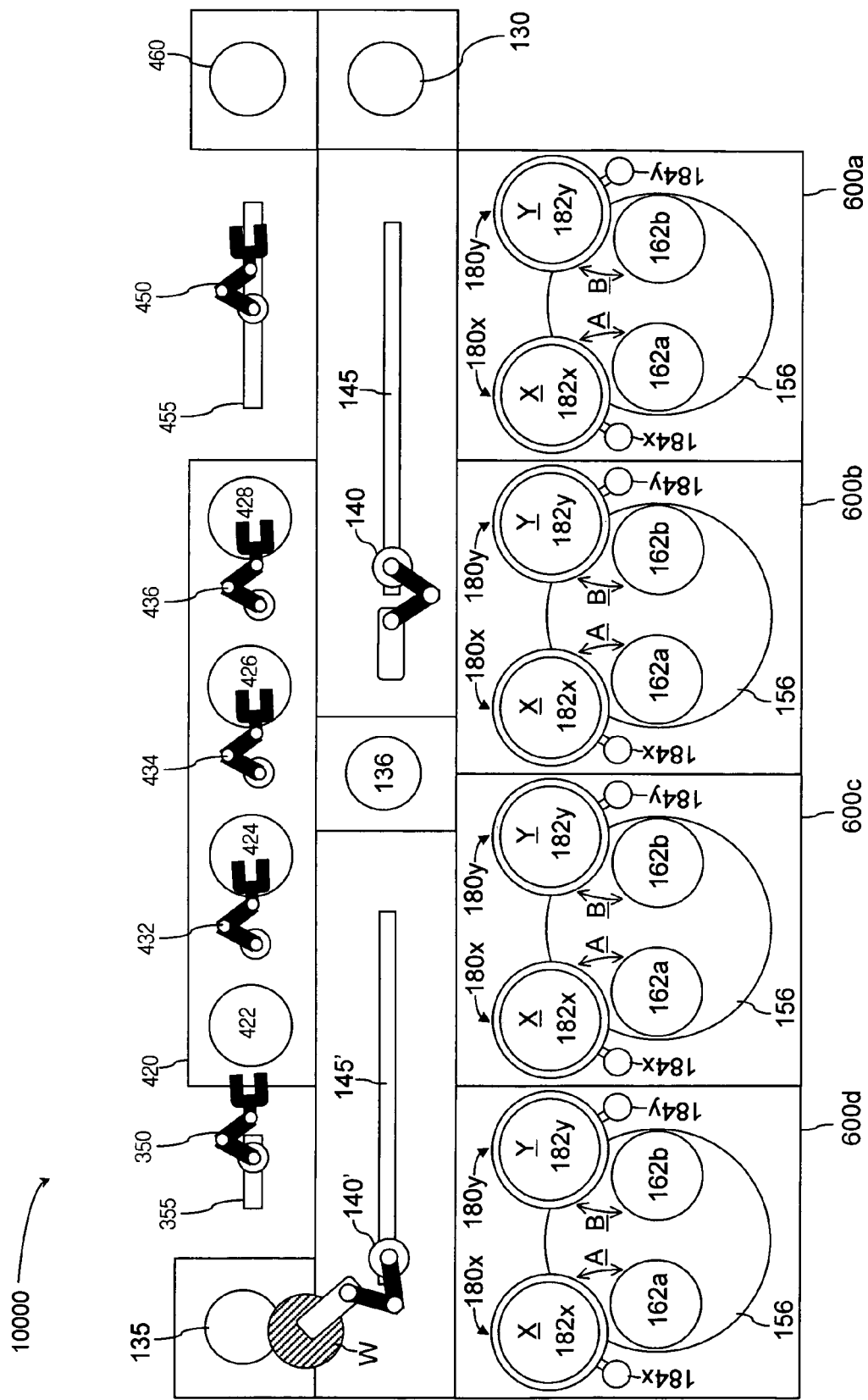
FIGS. 43 and 44 are top views of a polishing apparatus in accordance with a seventh embodiment of the present invention.

With reference to FIG. 43, a polishing apparatus 10000 in accordance with a seventh embodiment of the present invention is described. Same reference numerals of FIGS. 33 and 39 are used in FIG. 43 to identify common parts and components in the polishing apparatus 10000 as those in the polishing apparatuses 5000 and 8000 of FIGS. 33 and 39. Furthermore, these common parts and components will not be described in detail below.

The polishing apparatus 10000 is similar to the polishing apparatus 9000 of FIG. 41. A difference between the apparatuses 9000 and 10000 is that the polishing apparatus 10000 further comprises a fourth polishing unit 600d. The fourth polishing unit 600d is located adjacent to the second wafer transport device 140' such that the second wafer transport device 140' can transfer wafers to and from the fourth polishing unit 600d. Thus, in the polishing apparatus 10000, the first wafer transport device 140 transfers wafers between the wafer input station 140, the polisher buffer station 136, the first polishing unit 600a and the second polishing unit 600b. Furthermore, the second wafer transport device 140' transfers wafers between the polisher buffer station 136, the third polishing unit 600c, the fourth polishing unit 600d and the cleaner buffer station 135.

In an exemplary operation of the polishing apparatus 10000, a first group of wafers is transferred from the wafer input station 130 to the first polishing unit 600a by the first wafer transport device 140 and then polished in the first polishing unit 600a using a first kind of slurry and a first kind of polishing pad. A second group of wafers is transferred from the wafer input station 130 to the second polishing unit 600b by the first wafer transport device 140 and then polished in the second polishing unit 600a using the first kind of slurry and the first kind of polishing pad. After the polishing processes are completed in the first and second polishing units 600a and 600b, the first and second groups of wafers are transferred to the polisher buffer station 136 by the first wafer transport device 140. The wafer transport device 140 can transfer the wafers of the first and second groups to and from the polishing units 600a and 600b so that all the wafers of one group are transferred first and then all the wafers of the other group are transferred. Alternatively, the wafer transport device 140 can transfer wafers to and from the first and second polishing units 600a and 600b in an alternating fashion.

Next, the first group of wafers are transferred from the polisher buffer station 136 to the third polishing unit 600c by the second wafer transport device 140' and then polished in the third polishing unit 604k using a second kind of slurry and a second kind of polishing pad. The second group of wafers are transferred from the polisher buffer station 136 to the fourth polishing unit 600d by the second wafer transport device 140' and then polished in the fourth polishing unit 600d using the second kind of slurry and the second kind of polishing pad. After the polishing processes are completed in the third and fourth polishing units 600c and 600d, the first and second groups of wafers are transferred from the third and fourth polishing units 600c and 600d, respectively, to the cleaner butter station 135 by the second wafer transport device 140' and then sent to the wafer cleaner 420 by the cleaner wafer transport device 350. The wafer transport device 140' can transfer the wafers of the first and second groups to and from the polishing units 600c and 600d so that all the wafers of one group are transferred first and then all the wafers of the other group are transferred. Alternatively, the wafer transport device 140' can transfer wafers to and from the third and fourth polishing units 600c and 600d in an alternating fashion.

The cleaned wafers are then transferred to the wafer output station 460 by the output wafer transport device 450. The first kind of slurry and/or the first kind of polishing pad can also be used in the third and fourth polishing units 600c and 600d instead of the second kind of slurry and the second kind of polishing pad.

Figure 44:
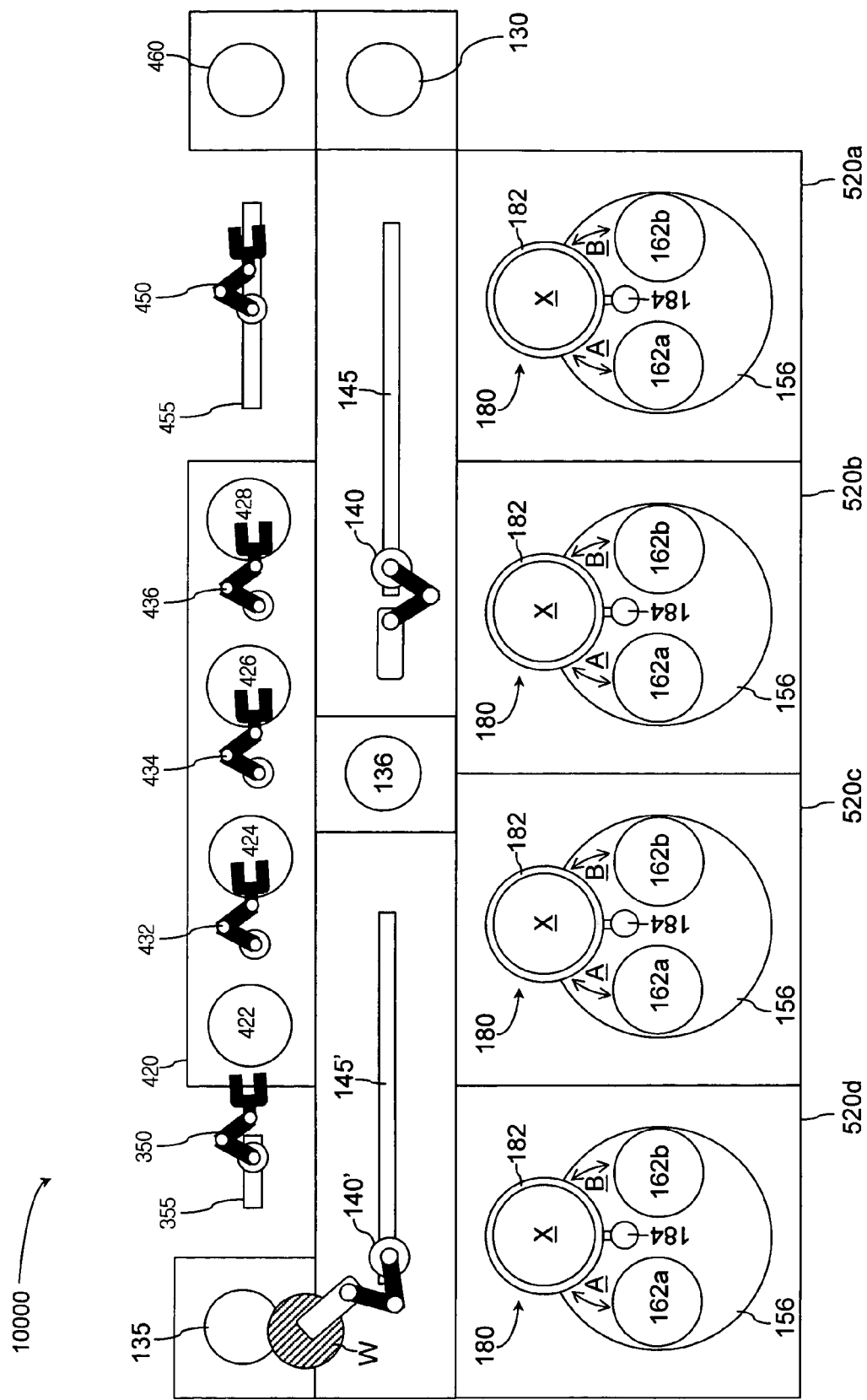

Even though the polishing apparatus 10000 has been described with reference to FIG. 43 as comprising the polishing units 600a, 600b, 600c and 600d, the polishing apparatus 10000 can comprise any polishing units that are selected from the polishing units 150, 500, 520, 540, 560, 580, 600, 620, 640, 660, 680, 700 and 720 described with reference to FIGS. 1-32. As an example, FIG. 44 shows the polishing apparatus 10000 comprising the polishing units 520a, 520b, 520c and 520d.

Figure 45:
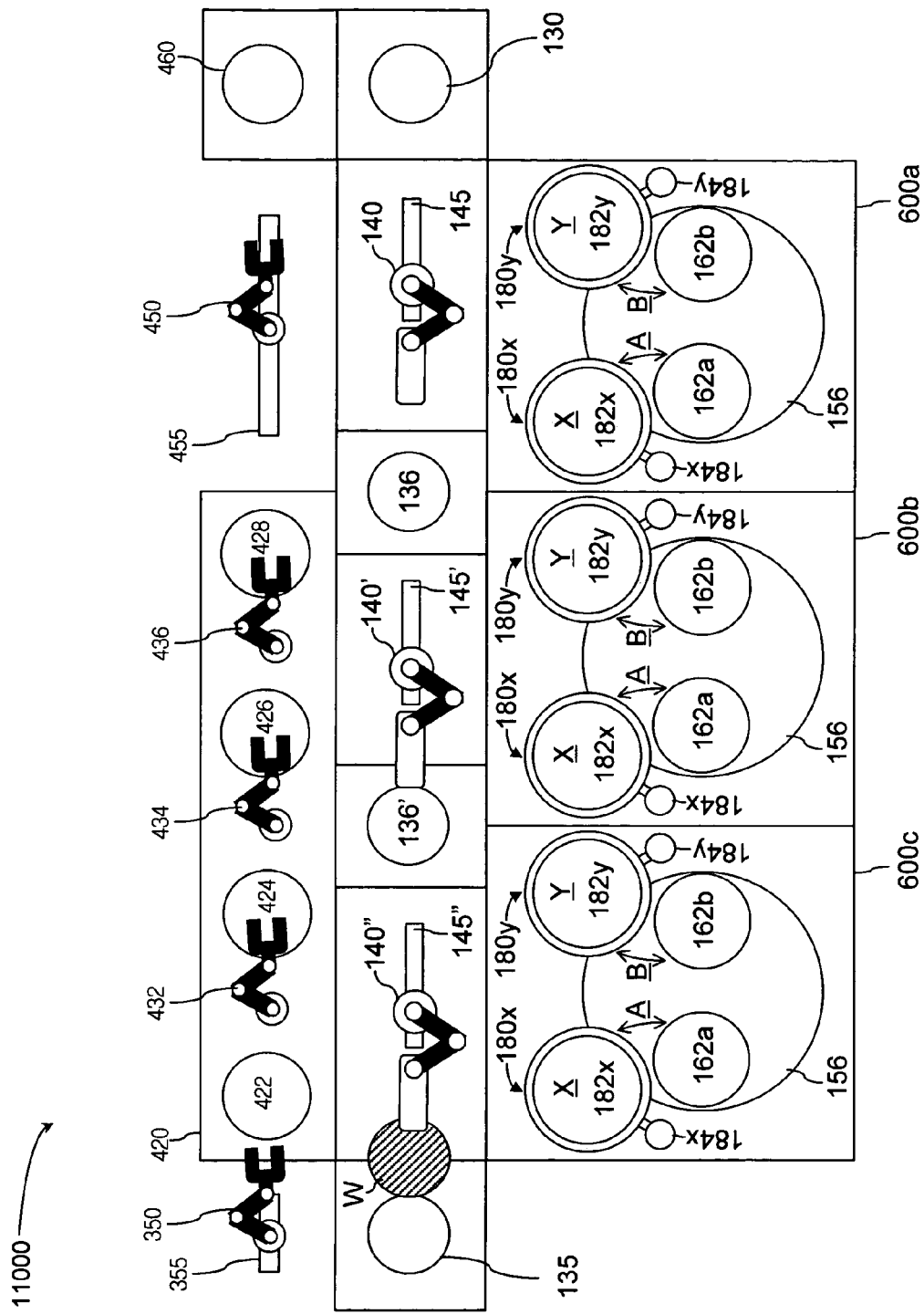
FIGS. 45-47 are top views of a polishing apparatus in accordance with an eight embodiment of the present invention.

With reference to FIG. 45, a polishing apparatus 11000 in accordance with an eighth embodiment of the present invention is described. Same reference numerals of FIGS. 33 and 39 are used in FIG. 45 to identify common parts and components in the polishing apparatus 11000 as those in the polishing apparatuses 5000 and 8000 of FIGS. 33 and 39. Furthermore, these common parts and components will not be described in detail below.

The polishing apparatus 11000 is similar to the polishing apparatus 8000 illustrated in FIG. 39. A difference between the apparatuses 8000 and 11000 is that the polishing apparatus 11000 further comprises a second polisher buffer station 136' and a third wafer transport device 140". The second polisher buffer station 136' is located between the second wafer transport device 140' and the third wafer transport device 140". The third wafer transport device 140" is located between the second polisher buffer station 136' and the cleaner buffer station 135. The third wafer transport device 140" transfers wafers between the second polisher buffer station 136', the third polishing unit 600c and the cleaner buffer station 135. The third wafer transport device 140" may be also mounted on a linear track 145" such that the third wafer transport device 140" can move in a linear manner on the linear track 145". Thus, in the polishing apparatus 11000, the second wafer transport device 140' transfers wafers between the polisher buffer station 136, the second polishing unit 600b and the second polisher buffer station 136'.

In an exemplary operation of the polishing apparatus 11000, wafers are transferred from the wafer input station 130 to the first polishing unit 600a by the first wafer transport device 140 and then polished in the first polishing unit 600a using a first kind of slurry and a first kind of polishing pad. After the polishing process is completed in the first polishing unit 600a, the wafers are transferred from the first polishing unit 600a to the first polisher buffer station 136 by the first wafer transport device 140. Next, the wafers are transferred from the first polisher buffer station 136 to the second polishing unit 600b by the second wafer transport device 140' and then further polished in the second polishing unit 600b using a second kind of slurry and a second kind of polishing pad. It is also possible to polish the wafers in the second polishing unit 600b using the first kind of slurry and the first kind of polishing pad. Next, the wafers are transferred from the second polisher buffer station 136' to the third polishing unit 600c by the third wafer transport device 140" and then further polished in the third polishing unit 600c using a third kind of slurry and a third kind of polishing pad. It is also possible to polish the wafers in the third polishing unit 600c using the first or second kind of slurry and the first or second kind of polishing pad. After the polishing process is completed in the third polishing unit 600c, the wafers are transferred from the third polishing unit 600b to the cleaner buffer station 135 by the third wafer transport device 140" and then sent to the wafer cleaner 420 by the cleaner wafer transport device 350. The cleaned wafers are then transferred to the wafer output station 460 by the output wafer transport device 450.

Figure 46:
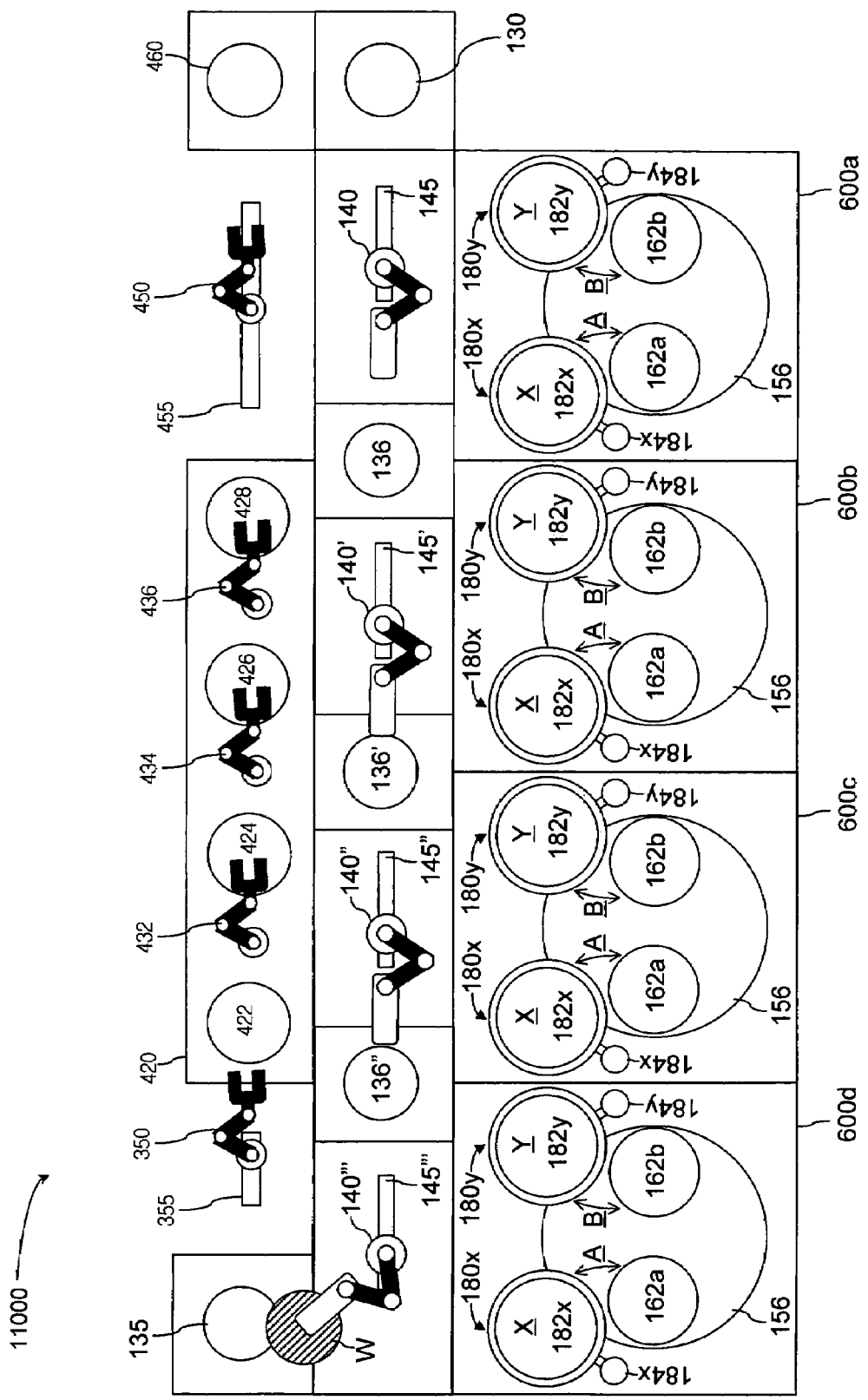

Even though the polishing apparatus 11000 has been described with reference to FIG. 45 as comprising the three polishing units 600a, 600b and 600c, the two polisher buffer stations 136 and 136' and the three wafer transport devices 140, 140' and 140", the polishing apparatus 11000 may comprise other numbers of the polishing units 600, the polisher buffer stations 136 and the wafer transport devices 140. In general the polishing apparatus 11000 comprises N polishing units 600, N-1 polisher buffer stations 136 and N wafer transport devices 140, where N is an integer equal to or larger than three. As an example, FIG. 46 shows the polishing apparatus 11000 comprising four polishing units 600a, 600b, 600c and 600d, three polisher buffer stations 136, 136' and 136" and four wafer transport devices 140, 140', 140" and 140'''.

Figure 47:
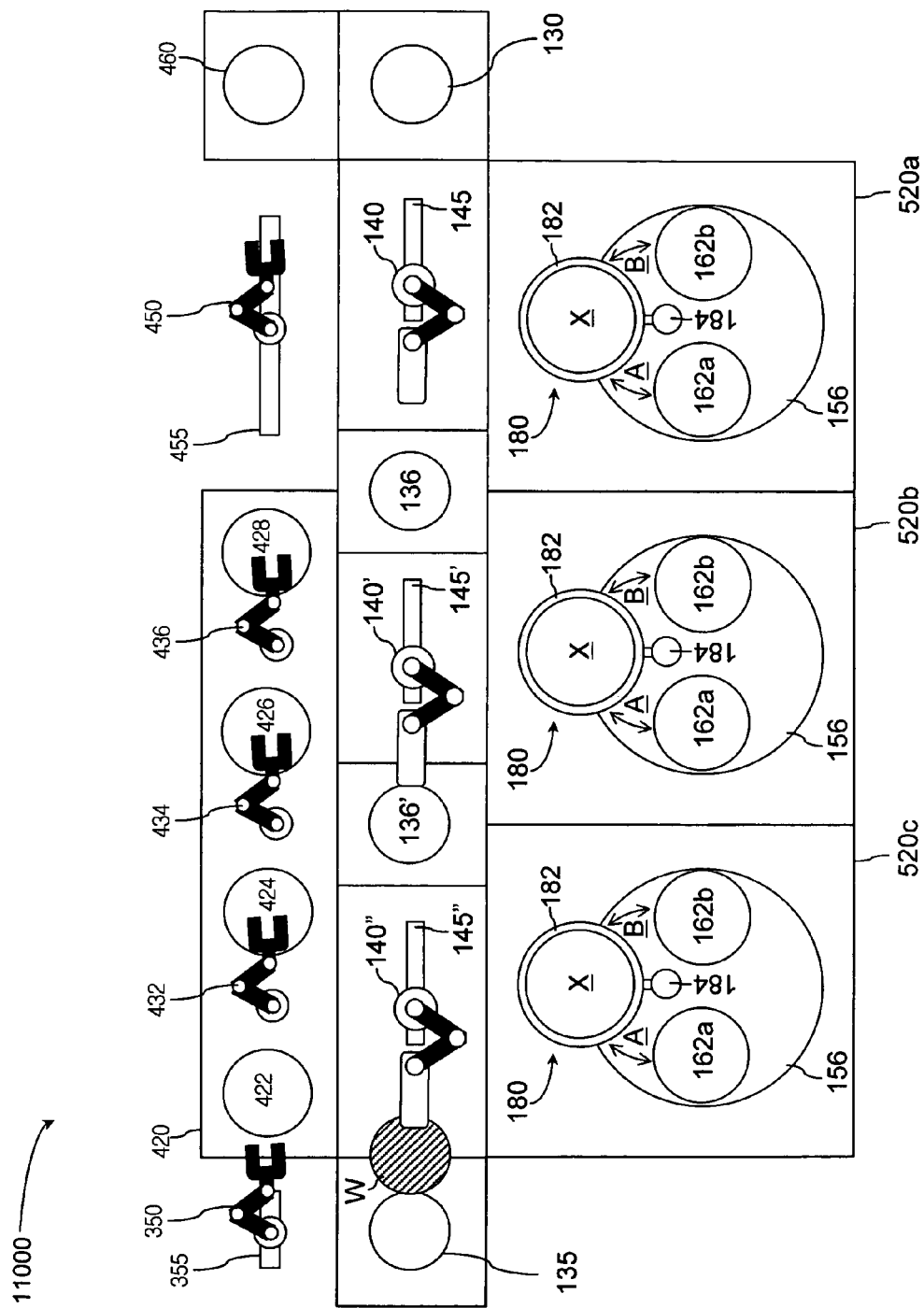

Furthermore, the polishing apparatus 11000 can comprise any polishing units that are selected from the polishing units 150, 500, 520, 540, 560, 580, 600, 620, 640, 660, 680, 700 and 720 described with reference to FIGS. 1-32. As an example, FIG. 47 shows the polishing apparatus 11000 comprising the polishing units 520a, 520b and 520c.

Figure 48:
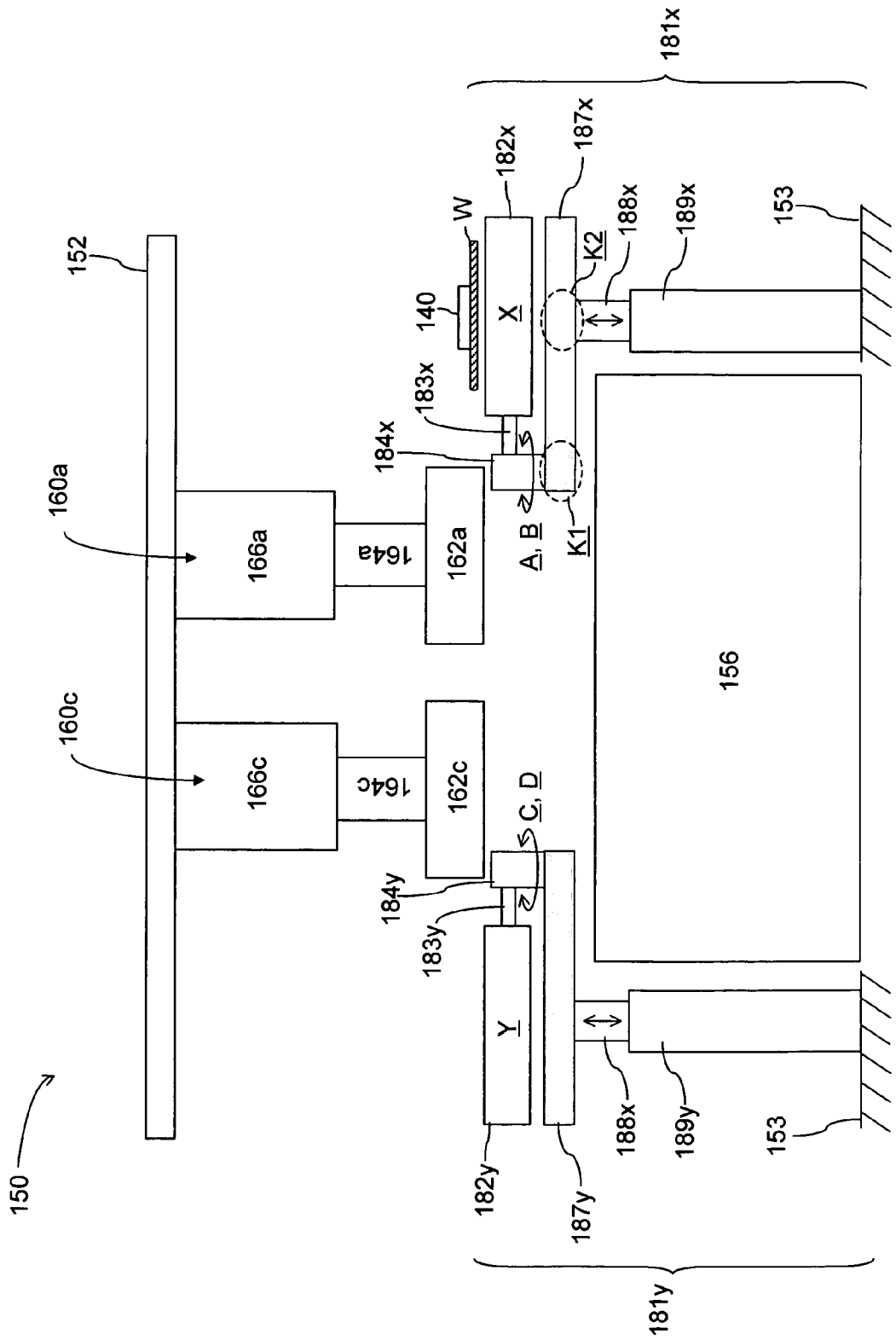
FIG. 48 is a side view of a polishing unit of FIG. 2 comprising modified wafer relay devices in accordance with an embodiment of the invention.
Figure 49:
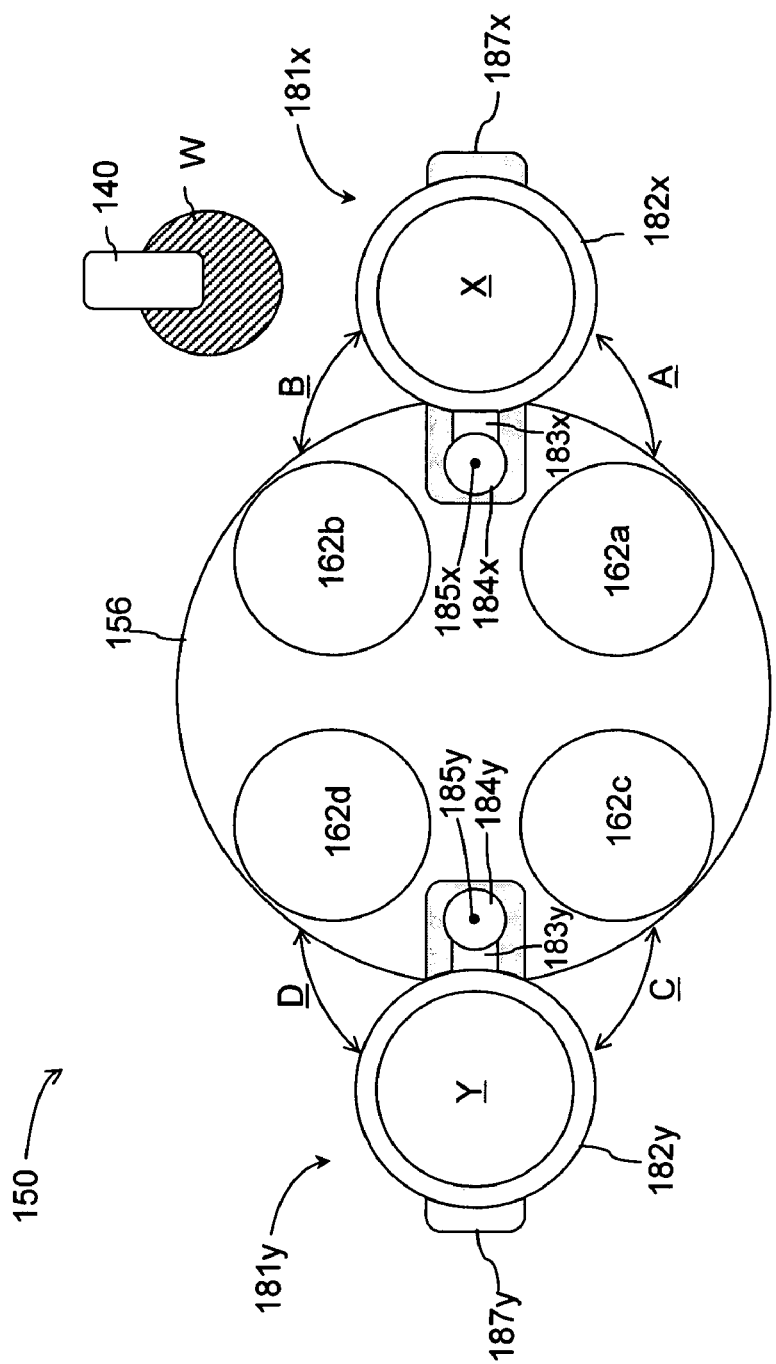
FIG. 49 is a top view of the modified wafer relay device of FIG. 48.

Turning now to FIGS. 48 and 49, a modified wafer relay device 181 in accordance with an embodiment of the invention that can be used instead of the wafer relay devices 180 in the polishing units 150, 500, 520, 540, 560, 580, 600, 620, 640 and 660 of the present invention is described. FIGS. 48 and 49 are side and top views, respectively, of modified wafer relay devices 181x and 181y. In FIGS. 48 and 49 the modified wafer relay devices 181x and 181y are shown as being installed in the polishing unit 150. However, these modified wafer relay devices 181x and 181y can be used in any of the polishing units 500, 520, 540, 560, 580, 600, 620, 640 and 660.

Each modified wafer relay device 181 comprises a load/unload cup 182, a pivoting arm 183, a pivoting shaft 184, a pivoting mechanism 187, a pivoting mechanism supporter 188 and a vertical drive mechanism 189. The load/unload cup 182 is connected to the pivoting shaft 184 through the pivoting arm 183. It is also possible to connect the load/unload cup 182 directly to the pivoting shaft 184 without the pivoting arm 183. The pivoting shaft 184 is mounted on the top surface of the pivoting mechanism 187 at a first location K1 of the pivoting mechanism 187. The first location K1 is located near one end of the pivoting mechanism 187, which is located over the polishing table 156. The bottom surface of the pivoting mechanism 187 is mounted on the pivoting mechanism supporter 188 at a second location K2 of the pivoting mechanism 187. The second location K2 is located near the other end of the pivoting mechanism 187, which is located outside the polishing table 156. The pivoting mechanism supporter 188 is connected to the vertical drive mechanism 189, which is mounted on a bottom housing structure 153 of the polishing unit 150 near the polishing table 156.

The pivoting mechanism 187 controls pivoting motions of the load/unload cup 182 by pivoting the pivoting shaft 184. The position of the pivoting shaft 184 over the polishing table 156 can be adjusted by adjusting the length of the pivoting mechanism 187, more specifically, by adjusting the distance between the first and second places K1 ad K2, as viewed from the side. The vertical drive mechanism 189 controls vertical motion of the load/unload cup 182 by moving the pivoting mechanism supporter 188 vertically.

The use of the modified wafer relay device 181 reduces the footprint of the polishing unit 150 by making it possible to position the pivoting shaft 184 over the polishing table 156 closer to the respective wafer carrier 162, and therefore, the pivoting point of the load/unload cup 182 is also closer to the respective wafer carrier 162. When the polishing pad 155 needs to be replaced or a new polishing pad needs to be attached onto the polishing table 156, the modified wafer relay device 181 can be temporarily moved away from the polishing table 156.

An operation of the modified wafer relay devices 181x and 181y is now described. The load/unload cup 182x of the first modified wafer relay device 181x receive a first wafer at its parking position X from the wafer transport device 140 (shown in FIG. 49). Next, the load/unload cup 182x is pivoted to the wafer load/unload position of the first wafer carrier 162a by its pivoting motion A. The load/unload cup 182x is then moved vertically towards the wafer carrier 162a by the vertical drive mechanism 189. After loading the first wafer to the wafer carrier 162a, the load/unload cup 182x is pivoted back to the parking position X to receive a second wafer. After the load/unload cup 182x receives the second wafer from the wafer transport device 140, the load/unload cup 182x is pivoted to the wafer load/unload position of the second wafer carrier 162b by its pivoting motion B. The load/unload cup 182x is then moved vertically towards the wafer carrier 162b by the vertical drive mechanism 189. After loading the second wafer to the wafer carrier 162a, the load/unload cup 182x is pivoted back to the parking position X. After the first and second wafers are polished, the first and second wafers are sequentially unloaded from the first and second wafer carriers 162a and 162b and transferred to the wafer transport device 140 by the load/unload cup 182. The load/unload cup 182y of the second modified wafer relay device 181y transfers third and fourth wafers to and from the third and fourth wafer carriers 162c and 162d by its pivoting motions C and D, respectively, in the same manner as the first modified wafer relay device 18 1x.

Figure 50:
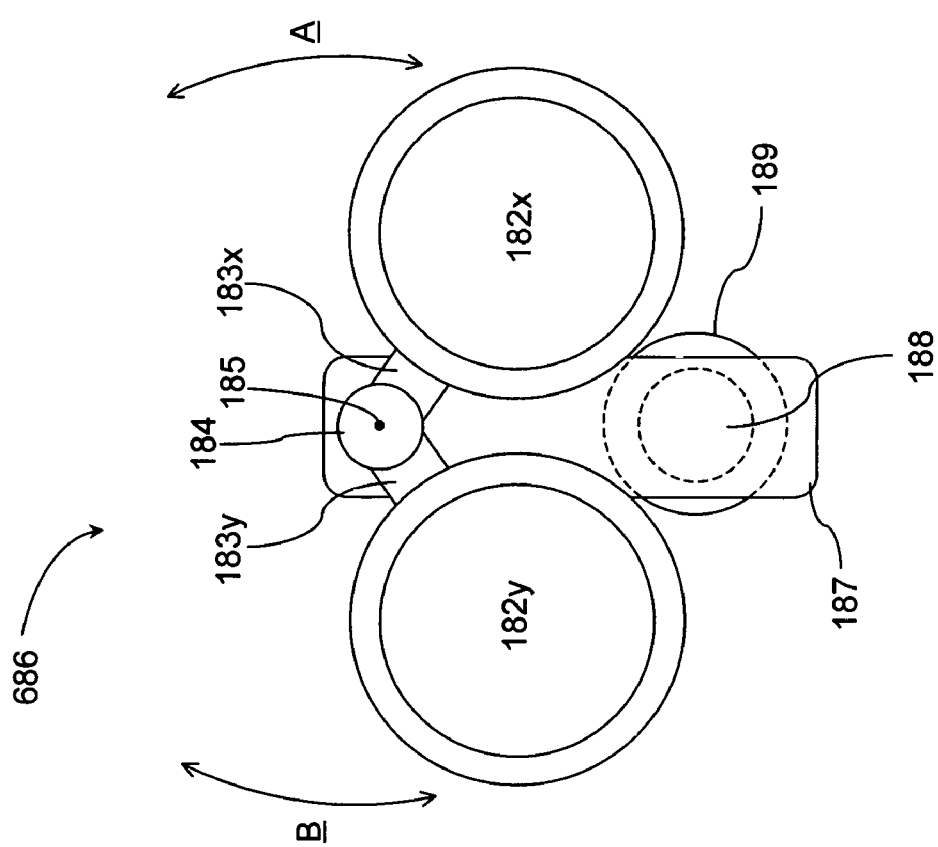
FIG. 50 is a top view of a modified dual cup wafer relay device in accordance with an embodiment of the invention.

With reference to FIG. 50, a modified dual cup wafer relay device 686 in accordance with an embodiment of the invention that can be used in the polishing units 680, 700 and 720 of the present invention is described. FIG. 50 shows a top view of the modified dual cup wafer relay device 686. In the modified dual cup wafer relay device 686, two load/unload cups 182x and 182y are connected to a single pivoting shaft 184 through respective pivoting arms 183x and 183y. The pivoting shaft 184 is mounted on the pivoting mechanism 187. The pivoting mechanism 187 is mounted on the pivoting mechanism supporter 188. The pivoting mechanism supporter 188 is connected to the vertical drive mechanism 189. The pivoting mechanism 187 controls pivoting motions A and B of the two load/unload cups 182x and 182y by pivoting the pivoting shaft 184. The vertical drive mechanism 189 controls vertical motion of the two load/unload cups 182x and 182y by moving the pivoting mechanism supporter 188 vertically.

The modified dual cup wafer relay device 686 can be installed in the polishing units 680, 700 and 720 so that the pivoting shaft 184 is positioned over the polishing table 156 closer to the wafer carriers 162, and therefore, the pivoting point of the load/unload cups 182x and 182y can also be closer to the wafer carriers.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An apparatus for polishing objects, said apparatus comprising:
    a polishing surface;
    an object carrier positioned over said polishing surface; and
    a load-and-unload cup configured to be pivoted to said object carrier about a pivoting point over said polishing surface so that said object can be transferred from said load-and-unload cup to said object carrier.

2. The apparatus of claim 1 further comprising a second object carrier positioned over said polishing surface, and wherein said load-and-unload cup is further configured to be pivoted to said second object carrier so that a second object can be transferred from said load-and-unload cup to said second object carrier.

3. The apparatus of claim 1 further comprising a second load-and-unload cup configured to be pivoted to said object carrier about a second pivoting point over said polishing surface so that a second object can be transferred from said second load-and-unload cup to said object carrier.

4. The apparatus of claim 1 further comprising:
    a second object carrier positioned over said polishing surface; and
    a second load-and-unload cup configured to be pivoted to said second object carrier about a second pivoting point over said polishing surface so that a second object can be transferred from said second load-and-unload cup to said second object carrier.

5. The apparatus of claim 4 further comprising a third object carrier positioned over said polishing surface, wherein said load-and-unload cup and said second load-and-unload cup are further configured to be pivoted to said third object carrier so that a third object can be transferred from one of said load-and-unload cup and said second load-and-unload cup to said third object carrier.

6. The apparatus of claim 4 further comprising third and fourth object carriers positioned over said polishing surface, and wherein said load-and-unload cup is further configured to be pivoted to said third object carrier so that a third object can be transferred from said load-and-unload cup to said third object carrier and wherein said second load-and-unload cup is further configured to be pivoted to said fourth object carrier so that a fourth object can be transferred from said second load-and-unload cup to said fourth object carrier.

7. The apparatus of claim 1 further comprising a second load-and-unload cup configured to be pivoted to said object carrier about said pivoting point so that a second object can be transferred from said second load-and-unload cup to said object carrier.

8. The apparatus of claim 1 further comprising:
a second object carrier positioned over said polishing surface; and
a second load-and-unload cup configured to be pivoted to said second object carrier about said pivoting point so that a second object can be transferred from said second load-and-unload cup to said second object carrier.

9. The apparatus of claim 1 wherein said load-and-unload cup includes a wafer handling lifter that can be vertically extended to load said object onto said object carrier and unload said object from said object carrier.

10. A method for polishing objects, said method comprising:
pivoting an object to be polished to an object carrier about a pivoting point over a polishing surface;
loading said object onto said object carrier;
moving said object carrier so that said object on said object carrier is placed on said polishing surface; and
polishing said object on said polishing surface.

11. The method of claim 10 further comprising:
pivoting a second object to be polished to a second object carrier about said pivoting point;
loading said second object onto said second object carrier;
moving said second object carrier so that said second object on said second object carrier is placed on said polishing surface; and
polishing said second object on said polishing surface.

12. The method of claim 11 wherein said pivoting of said first object and said pivoting of said second object includes pivoting first and second load-and-unload cups about said pivoting point.

13. The method of claim 10 further comprising:
pivoting a second object to be polished to said object carrier about a second pivoting point;
loading said second object onto said object carrier;
moving said object carrier so that said second object on said object carrier is placed on said polishing surface; and
polishing said second object on said polishing surface.

14. The method of claim 10 further comprising:
pivoting a second object to be polished to a second object carrier about a second pivoting point;
loading said second object onto said second object carrier;
moving said second object carrier so that said second object on said second object carrier is placed on said polishing surface; and
polishing said second object on said polishing surface.

15. the method of claim 14 further comprising:
pivoting a third object to be polished to a third object carrier about one of said pivoting point and said second pivoting point;
loading said third object onto said third object carrier;
moving said third object carrier so that said third object on said third object carrier is placed on said polishing surface; and
polishing said third object on said polishing surface.

16. The method of claim 15 further comprising:
pivoting a fourth object to be polished to a fourth object carrier about one of said pivoting point and said second pivoting point that differs from said third object;
loading said fourth object onto said fourth object carrier;
moving said fourth object carrier so that said fourth object on said fourth object carrier is placed on said polishing surface; and
polishing said fourth object on said polishing surface.

17. An apparatus for polishing objects, said apparatus comprising:
at least one polishing surface;
a first object carrier positioned over said at least one polishing surface,
said first object carrier being configured to hold a first object to be polished;
a second object carrier positioned over said at least one polishing surface, said second object carrier being configured to hold one of said first object and a second object to be polished;
a load-and-unload cup configured to be moved between said first and second object carrriers to transfer one of said first and second objects to one of said first and second object carriers; and
an object transport device configured to transfer said first and second objects to and from said load-and-unload cup.

18. The apparatus of claim 17 wherein said at least one polishing surface includes first and second polishing surfaces, and wherein said first object carrier is positioned over said first polishing surface and said second object carrier is positioned over said second polishing surface.

19. The apparatus of claim 18 further comprising:
third and fourth polishing surfaces;
third and fourth object carriers, said third object carrier being positioned over said third polishing surface, said fourth object carrier being positioned over said fourth polishing surface; and
a second load-and-unload cup configured to be moved between said third and fourth object carriers to transfer one of said second object, a third object and a fourth object to one of said third and fourth object carriers.

20. The apparatus of claim 19 wherein said first second, third and fourth polishing surface are positioned in an L-shaped configuration.

21. The apparatus of claim 18 further comprising:
a third polishing surface;
a third object carrier positioned over said third polishing surface; and
a second load-and-unload cup configured to be moved between said second and third object carriers to transfer said one of said second object and a third object to one of said second and third object carriers.

22. The apparatus of claim 21 wherein said first, second and third polishing surfaces are positioned in a linear configuration.

23. The apparatus of claim 17 wherein said load-and-unload cup includes a wafer handling lifter that can be vertically extended to load said object onto said object carrier and unload said object from said object carrier.

24. A method for polishing objects said method comprising:
transporting an object to be polished to a load-and-unload cup;
moving said load-and-unload cup to sit a first object carrier, including pivoting said load-and-unload cup, said first object carrier being one of two object carriers to which said load-and-unload cup can be moved;
loading said object onto said first object carrier;
moving said first object carrier so that said object on said first object carrier is placed on at least one polishing surface; and
polishing said object on said at least one polishing surface.

25. The method of claim 24 further comprising:
moving said load-and-unload cup to a second object carrier to transfer one of said object and a second object, said second object carrier being one of said two object carriers;
loading one of said object and said second object onto said second object carrier;
moving said second object carrier so that one of said object and said second object on said second object carrier is placed on said at least one polishing surface; and
polishing one of said object and said second object on said at least one it polishing surface.

26. The method of claim 25 wherein said moving of said first object carrier and said moving of said second object carrier include moving said first and second object carriers so that said object on said first object carrier is placed on a first polishing surface and one of said object and said second object on said second object carrier is placed on a second polishing surface.

27. The method of claim 25 further comprising:
moving a particular load-and-unload cup to transfer one of second object and a third object, said particular load-and-unload cup being one of said load-and-unload cup and a second load-and-unload cup to a third object carrier;
loading one of second object and said third object onto said third object carrier;
moving said third object carrier so that one of second object and said third object on said third object carrier is placed on a third polishing surface; and
polishing one of second object and said third object on said third polishing surface.

28. The method of claim 25 further comprising:
moving a second load-and-unload cup to a third object carrier to transfer one of said second object and a third object, including moving said second load-and-unload cup to a fourth object carrier to transfer one of said second object and a fourth object;
loading one of said second object and said third object onto said third object carrier and one of said second object and said fourth object onto said fourth object carrier;
moving said third and fourth object carriers so that one of said second object and said third object on said third object carrier is placed on a third polishing surface and one of said second object and said fourth object on said fourth object carrier is placed on a fourth polishing surface; and
polishing one of said second object and said third object on said third polishing surface and one of said second object and said fourth object on said fourth polishing surface.

29. An apparatus for polishing objects, said apparatus comprising:
first and second polishing units, each of said first and second polishing units comprising:
first and second polishing surfaces;
a first object carrier positioned over said first polishing surface,
said first object carrier being configured to hold a first object to be polished;
a second object carrier positioned over said second polishing surface, said second object carrier being configured to hold a second object to be polished;
a first load-and-unload cup configured to be pivoted to said first object carrier to transfer said first object to and from said first object carrier; and
a second load-and-unload cup configured to be pivoted to said second object carrier to transfer said second object to and from said second object carrier; and
a wafer transport device configured to transfer said first and second objects to and from said first and second load-and-unload cups of at least one of said first and second polishing units.

30. An apparatus for polishing objects, said apparatus comprising:
a polishing surface;
first and second object carriers positioned over said polishing surface, said first object carrier being configured to hold a first object to be polished, said second object carrier being configured to hold a second object to be polished, said first and second object carriers being further configured to independently polish said first and second objects on said polishing surface;
a first load-and-unload cup configured to be pivoted to said first object carrier to transfer said first object to and from said first object carrier; and
a second load-and-unload cup configured to be pivoted to said second object carrier to transfer said second object to and from said second object carrier.

31. The apparatus of claim 30 wherein said first and second load-and-unload cups are configured to be pivoted about pivoting point over said polishing surface.

32. The apparatus of claim 30 wherein said load-and-unload cup includes a wafer handling lifter that can be vertically extended to load said object onto said object carrier and unload said object from said object carrier.

33. A method for polishing objects, said method comprising:
pivoting a first object to be polished to a first object carrier positioned over a polishing surface and a second object to be polished to a second object carrier positioned over said polishing surface;
loading said first object onto said first object carrier and said second object onto said second object carrier;
independently moving said first and second object carriers so that said first object on said first object carrier and said second object on said second object carrier are independently placed on said polishing surface; and
independently polishing said first and second objects on said polishing surface.

34. The method of claim 33 wherein said pivoting includes pivoting said first object about a first pivoting axis to said first object carrier and said second object about a second pivoting axis to said second object carrier, said first and second pivoting axes being located over said polishing surface.

35. An apparatus for polishing objects, said apparatus comprising:
- at least one polishing surface;
- at least one object carrier positioned over said at least one polishing surface;
- a first load-and-unload cup configured to be pivoted to said at least one object carrier about a pivoting axis to transfer a first object to said at least one object carrier; and
- a second load-and-unload cup configured to be pivoted to said at least one object carrier about said pivoting axis to transfer a second object to said at least one object carrier.

36. The apparatus of claim 35 wherein said pivoting axis of said first and second load-and-unload cups is located over said at least one polishing surface.

37. The apparatus of claim 36 wherein said at least one polishing surface includes first and second polishing surfaces and said at least one object carrier includes first and second object carriers, said first object carrier being positioned over said first polishing surface, said second object carrier being positioned over said second polishing surface.

* * * * *